United States Patent
Luch

(10) Patent No.: US 6,582,887 B2
(45) Date of Patent: Jun. 24, 2003

(54) ELECTRICALLY CONDUCTIVE PATTERNS, ANTENNAS AND METHODS OF MANUFACTURE

(76) Inventor: Daniel Luch, 17161 Copper Hill Dr., Morgan Hill, CA (US) 95037

( * ) Notice: Subject to any disclaimer, the term of this patent is extended or adjusted under 35 U.S.C. 154(b) by 0 days.

(21) Appl. No.: 09/818,128

(22) Filed: Mar. 26, 2001

(65) Prior Publication Data

US 2002/0135519 A1 Sep. 26, 2002

(51) Int. Cl.$^7$ .............................. G03F 1/14; H01Q 1/40
(52) U.S. Cl. ................................ 430/311; 343/700 MS
(58) Field of Search .................... 430/311; 343/700 MS

(56) References Cited

U.S. PATENT DOCUMENTS

| | | |
|---|---|---|
| 3,523,875 A | 8/1970 | Minklei |
| 3,619,382 A | 11/1971 | Lupinski |
| 3,682,786 A | 8/1972 | Brown et al. |
| 3,865,699 A | 2/1975 | Luch |
| 4,009,093 A | 2/1977 | Luch |
| 4,038,042 A | 7/1977 | Adelman |
| 4,101,385 A | 7/1978 | Luch |
| 4,158,612 A | 6/1979 | Luch et al. |
| 4,191,617 A | 3/1980 | Hurley et al. |
| 4,195,117 A | 3/1980 | Luch |
| 4,278,510 A | 7/1981 | Chien et al. |
| 4,395,362 A | 7/1983 | Satoh et al. |
| 4,425,262 A | 1/1984 | Kawai et al. |
| 4,429,020 A | 1/1984 | Luch |
| 4,510,079 A | 4/1985 | Kawai et al. |
| 4,603,092 A | 7/1986 | Luch |
| 4,835,541 A | 5/1989 | Johnson et al. |
| 4,862,184 A | 8/1989 | Ploussios |
| 4,985,116 A | 1/1991 | Mettler et al. |
| 4,985,600 A | 1/1991 | Heerman |
| 4,996,391 A | 2/1991 | Schmidt |
| 5,206,657 A | 4/1993 | Downey |
| 5,355,142 A | 10/1994 | Marshall et al. |
| 5,444,453 A | 8/1995 | Lalezari |
| 5,495,260 A | 2/1996 | Couture |
| 5,508,709 A | 4/1996 | Krenz et al. |
| 5,547,516 A | 8/1996 | Luch |
| 5,567,296 A | 10/1996 | Luch |
| 5,569,879 A | 10/1996 | Gloton et al. |
| 5,648,788 A | 7/1997 | Bumsted |
| 5,709,832 A | 1/1998 | Hayes et al. |
| 5,735,966 A | 4/1998 | Luch |
| 5,809,633 A | 9/1998 | Mundigl et al. |
| 5,847,931 A | * 12/1998 | Gaumet et al. ............. 361/737 |
| 5,896,111 A | 4/1999 | Houdeau et al. |
| 5,898,215 A | 4/1999 | Miller et al. |

(List continued on next page.)

FOREIGN PATENT DOCUMENTS

EP        0942441        9/1999

*Primary Examiner*—Hoa Van Le

(57) ABSTRACT

The invention teaches improved, novel methods and materials for the productions of electrically conductive patterns, antennas and complex circuitry. The invention contemplates the use of directly electroplateable resins for production of these article. The unique suitability of directly electroplateable resins to allow facile manufacture of the electrically conductive patterns desired using a broad range of processing and manufacturing approaches is demonstrated.

9 Claims, 35 Drawing Sheets

U.S. PATENT DOCUMENTS

| | | |
|---|---|---|
| 5,900,841 A | 5/1999 | Hirata et al. |
| 5,911,454 A | 6/1999 | Crothall |
| 5,914,690 A | 6/1999 | Lehtola et al. |
| 5,973,598 A | 10/1999 | Beigel |
| 5,995,050 A | 11/1999 | Moller et al. |
| 5,995,052 A | 11/1999 | Sadler et al. |
| 6,027,027 A | 2/2000 | Smithgall |
| 6,049,314 A | 4/2000 | Munson et al. |
| 6,049,463 A | 4/2000 | O'Malley et al. |
| 6,052,090 A | 4/2000 | Simmons et al. |
| 6,052,889 A | 4/2000 | Yu et al. |
| 6,067,056 A | 5/2000 | Lake |
| 6,075,489 A | 6/2000 | Sullivan |
| 6,081,236 A | 6/2000 | Aoki |
| 6,107,920 A | 8/2000 | Eberhardt et al. |
| 6,137,452 A | 10/2000 | Sullivan |
| 6,147,660 A | 11/2000 | Elliott |
| 6,157,344 A | 12/2000 | Bateman et al. |
| 6,161,761 A | 12/2000 | Ghaem et al. |
| 6,163,260 A | 12/2000 | Conwell et al. |
| 6,168,855 B1 | 1/2001 | Cohen et al. |
| 6,184,833 B1 | 2/2001 | Tran |
| 6,195,858 B1 | 3/2001 | Ferguson et al. |
| 6,239,352 B1 | 5/2001 | Luch |
| 6,255,999 B1 | 7/2001 | Faulkener et al. |
| 6,259,369 B1 | 7/2001 | Monico |
| 6,265,977 B1 * | 7/2001 | Vega et al. ............. 340/572.7 |
| 6,271,793 B1 | 8/2001 | Brady et al. |
| 6,331,838 B1 | 12/2001 | Scott et al. |
| 6,343,208 B1 | 1/2002 | Ying |
| 6,414,235 B1 | 7/2002 | Luch |
| 6,459,032 B1 | 10/2002 | Luch |

* cited by examiner (MPL)

ELECTRICALLY CONDUCTIVE PATTERNS, ANTENNAS AND METHODS OF MANUFACTURE

BACKGROUND

The explosive proliferation of "wireless" electronic devices is to continue into the future. These ubiquitous items include cellular phones and pagers, so-called contactless "smart cards" and the emerging wireless data transmission devices. One common component of all these devices is an antenna for receiving and transmitting electromagnetic radiation. Antenna come in many different forms depending on the requirements of the device. However, a common characteristic of most antennas is that they comprise a structural combination of conductive and dielectric insulating materials. One simple form of antenna involves formation of conductive traces or patches on a substantially flat surface. These conductive structures are included in many types of antenna designs, including coil, monopole, dipole and microstrip forms. Examples of these simple antenna structures are those incorporated into contactless "smart cards". Typically these antennas are formed from a coil or loop of conductive line traces. The coil or loop antenna allows transformer transmission to power the semiconductor chip and also accomplishes data transfer. The cards are generally restricted to a thickness of about 1 millimeter, which dictates that the conductive traces be substantially two dimensional in structure. This relatively simple geometry permits a number of manufacturing options to be considered. For example, U.S. Pat. No. 5,896,111 to Houdeau et al. teaches a technique whereby parallel conductor tracks are formed on strips of flexible, non-conductive carrier strips. The tracks were applied using printing technology, although a detailed description of the materials and processes used to form the tracks was not presented. Bending and connecting opposite ends of adjacent traces results in a substantially planar coil antenna. The technique requires stripping of insulation and individually connecting the opposite ends of adjacent traces which is time consuming and increases manufacturing costs.

U.S. Pat. No. 5,569,879 to Gloton, et al. teaches smart card production comprising lamination of a dielectric onto a prepunched metal strip. In one embodiment a portion of the metal strip is used as part of a microstrip antenna. However, the manufacture includes additional second surface metallization and possibly photo-etching which increases complexity and cost. An additional embodiment of the U.S. Pat. No. 5,569,879 patent shows a portion of the metal strip used as an inductor, but it is not clear how such a geometry would be supported prior to lamination to the dielectric strip.

U.S. Pat. No. 6,067,056 to Lake teaches methods of forming conductive lines and substantially planar antennas by selectively overcoating a first conductive layer with a patterned second conductive layer and etching to remove exposed portions of the first conductive layer. However, etching is wasteful and difficult from an environmental standpoint.

U.S. Pat. No. 5,809,633 to Mundigl et al. teaches manufacturing a coil antenna for a contactless smart card by winding wire in an automatic wire winding machine through a plurality of turns prior to placement on a carrier body. However, the wire used in a smart card antenna must be relatively thin to prevent unacceptable bulges in the final laminated card. Thus it would appear that the unsupported wire bending taught in U.S. Pat. No. 5,809,633 could be difficult to achieve in volume manufacturing.

U.S. Pat. No. 5,898,215 to Miller et al. describes smart card antennas embedded in a plastic laminate. The antenna is formed by winding an insulated copper wire, a process requiring removal of insulation in the region of contact. Alternate methods of manufacture for the antenna such as plating, etching, conductive ink printing and foil lamination were mentioned, although no specific process was taught in detail.

Other teachings for forming antenna structures on substantially flat surfaces involve printing the antenna design onto the surface using conductive inks or pastes. This method is taught, for example, in European Patent Publication EP 0942441A2 to Sugimura, PCT Publication WO 9816901A1 to Azdasht et al. and U.S. Pat. No. 5,900,841 to Hirata et al. These techniques suffer from the relatively high costs of the conductive inks and a high resistivity of these materials compared to substantially pure metals. It also may be difficult to make the required electrical contacts to these conductive inks.

U.S. Pat. No. 5,995,052 to Sadler, et al. and U.S. Pat. No. 5,508,709 to Krenz, et al. illustrate mobile phone antennas comprising conductive structures formed on substantially flat dielectric surfaces. Neither of these disclosures provided a detailed description of methods for forming and adhering the patterned conductive structures onto the dielectric surfaces.

Other techniques for formation of antenna structures on substantially flat surfaces utilize that technology widely employed for manufacture of printed circuits. These manufacturing techniques are taught in the "printed circuit" antenna structures of U.S. Pat. No. 5,709,832 to Hayes et al., U.S. Pat. No. 5,495,260 to Couture, and U.S. Pat. No. 5,206,657 to Downey. Hayes taught production of a printed monopole antenna, while Couture taught a dipole antenna produced using the circuit board techniques. Downey taught production of a coaxial double loop antenna by selective etching of a double metal cladded circuit board. These techniques involve creating a conductive antenna structure on a substantially flat surface through processes involving patterned etching. Techniques for producing antennas by selective etching suffer from excessive material waste, pollution control difficulties and limited design flexibility.

Another form of antenna often employed with wireless communication devices is the so-called "whip" antenna. These antennas normally comprise straight or helical coil wire structures, or combinations thereof, and are often moveable between extended and retracted positions. A typical example of such antenna design is taught in U.S. Pat. No. 5,995,050 to Moller, et al. Moller et al. teaches production of so-called extendable "whip" antennas combining wound helical and straight portions of wire. U.S. Pat. No. 6,081,236 to Aoki taught using a coaxial cable as a radiation element in conjunction with a helical antenna. U.S. Pat. No. 6,052,090 to Simmons, et al. teaches a combination of helical and straight radiating elements for multi-band use. The wire forming techniques proposed in these disclosures are, of course, limited in design flexibility. In many cases, the antenna and especially the helical coil must be encapsulated with insulating material for dimensional and structural integrity as well as aesthetic considerations. This encapsulation is often done by insert injection molding with a thermoplastic encapsulant. Care must be taken to ensure that the high injection pressures and speeds inherent in injection molding do not cause undesirable movement and dimensional changes of the wire coil. This problem was addressed by Bumsted in U.S. Pat. No. 5,648,788. However, the specialized tooling taught by Bumsted would appear to further reduce design flexibility and likely increase costs.

Other problems are associated with the "whip" antennas. They are subject to damage, especially when extended, and can cause inadvertent personal injury. The fact that they must be retractable increases mechanical wear and limits possible size reductions for the device. U.S. Pat. No. 6,075,489 to Sullivan addresses this latter problem by teaching a telescoping "whip" antenna combining a helix mounted on slideable components to enable telescopic extension. This design allows a longer antenna but increases complexity and cost and increases possibility of damage when extended.

As size continues to be an issue, increasing attention is devoted toward conformal antennas. Conformal antennas generally follow the shape of the surface on which they are supported and generally exhibit a low profile. There are a number of different types of conformal antennas, including microstrip, stripline, and three dimensional designs. The low-profile resonant microstrip antenna radiators generally comprise a conductive radiator surface positioned above a more extensive conductive ground plane. The conductive surfaces are normally substantially opposing and spaced apart from one another. The substantially planar conductive surfaces can be produced by well-known techniques such as conductive coating, sheet metal forming or photo-etching of doubly clad dielectric sheet.

A factor to consider in design and construction of high efficiency microstrip antennas is the nature of the separating dielectric material. U.S. Pat. No. 5,355,142 to Marshall, et al. and U.S. Pat. No. 5,444,453 to Lalezari teach using air as the dielectric. This approach tends to increase the complexity of manufacture and precautions must be made to ensure and maintain proper spacing between radiator and ground plane.

U.S. Pat. No. 6,157,344 to Bateman, et al. teaches manufacture of flat antenna structures using well known photomasking and etching techniques of copper cladded dielectric substrates.

U.S. Pat. No. 6,049,314 to Munson, et al., U.S. Pat. No. 4,835,541 to Johnson, et al. and U.S. Pat. No. 6,184,833 to Tran all teach manufacture of a microstrip antennas produced by cutting and forming an initially planar copper sheet into the form of a "U". Cutting and forming of planar metal sheets offers limited design options. In addition, provision must be made to provide a dielectric supporting structure between the two arms of the "U" since the sheet metal would likely not maintain required planar spacing without such support.

One notes that most of the technologies for antenna production involve the placement and combining of conductive material patterns with either a supportive or protective dielectric substrate. Antenna production often involves the production of well-defined patterns, strips or traces of conductive material held in position by a dielectric material.

As technology evolves, consumers have demanded a greater number of features incorporated in a specific device. These requirements tend to increase the size of the device. Simultaneously, there has been the need to make these portable devices smaller and lighter to maximize convenience. These conflicting requirements extend to the antenna, and attempts have been made to advance the antenna design toward three dimensional structures to maximize performance and minimize size.

For example, U.S. Pat. No. 5,914,690 to Lehtola et al. teaches an internal conformal antenna of relatively simple, three dimensional construction for a wireless portable communication device. The antenna comprises an assembly of multiple pieces. A radiator plate is positioned between a cover structure and a support frame positioned over and connected to an electrically conductive earth plane. The radiator plate is formed from a flexible thin metal plate. The multiple pieces required for accurate positioning of the radiator plate relative to the earth plane increases the manufacturing cost of the Lehtola et al. structures.

Unfortunately, more complicated three dimensional metal-based patterns often required for antenna manufacture can be difficult or impossible to produce using conventional mechanical wire winding, sheet forming or photoetching techniques. Photoetching requires a conforming mask to define the circuitry. U.S. Pat. No. 5,845,391 to Bellus, et al. illustrates the complications associated with prior art photoetch methods of forming three dimensional metallic patterns on a dielectric substrate. Bellus, et al. teaches manufacture of a three dimensional tapered notch antenna array formed on an injected molded thermoplastic grid. Multiple operations, specialized masking and other complications are involved in production of the photoetched metallic patterns. In addition, the metallic patterns produced were still restricted to a three dimensional structure made up of essentially flat dielectric panels.

Mettler et al., U.S. Pat. No. 4,985,116 taught the use of thermoforming a plastic sheet coated with a vacuum formable ink into a mask having the surface contour of a three dimensional article. A computer controlled laser is used to remove ink in a desired patterned design. The mask was then drawn tightly to a resist coated workpiece. Using known methods of photo and metal deposition processing, a part having patterned three dimensional structure is produced. The Mettler, et al. patent also discussed the limitations of using a photomask on a three dimensional substrate by using the example of a mushroom. A photomask cannot easily conform to the stem of the mushroom while still permitting the mask to be installed or removed over the cap of the mushroom. Thus, a significant limitation on design flexibility exists with conventional photoetching techniques for production of three dimensional antenna structures.

A number of patents envision antenna structures comprising metal-based materials deposited into trenches or channels formed in a dielectric support. For example, Crothall in U.S. Pat. No. 5,911,454 teaches a method of forming a strip of conductive material by depositing a conductive material into a channel formed by two raised portions extending upward from a surface of an insulating material. The conductive material was deposited to overlay portions of the raised material. The conductive material overlaying the raised portions was then removed to result in a sharply defined conductive strip. The process taught by Crothall is clearly limited in its design flexibility by the material removal requirement. Ploussios, U.S. Pat. No. 4,862,184 teaches deposition of metal into a helical channel support. The selective deposition process was described only to the extent that it was achieved by known plating techniques. U.S. Pat. No. 4,996,391 to Schmidt and U.S. Pat. No. 4,985,600 to Heerman both teach injection molded substrates upon which a circuit is applied. In both patents, the pattern of the eventual circuitry is molded in the form of trenches or depressions below a major, substantially planar surface. In this way, plating resist lacquer applied by roller coating will coat only those surface areas of the major, substantially planar surface, and subsequent chemical metal deposition occurs only in the trenches remaining uncoated by the plating resist. This technique avoids the complications of photoetching, but is still design limited by the requirement of applying the plating resist. Application of the plating resist becomes increasingly difficult as the contours of the major surface become more complicated. In addition, chemical metal deposition is relatively slow in building thickness and the circuitry used is relatively expensive.

As wireless communication devices continue to evolve, the demands on the design, size and manufacturability of the required antennas will become increasingly challenging. There is clearly a need for improved materials, processes and manufacturing techniques to produce the antennas of the future.

U.S. Pat. No. 6,052,889 to Yu, et al. teaches a method for preparing a radio frequency antenna having a plurality of radiating elements. The three dimensional assembly includes multiple steps including electroless metal deposition on components to a metal thickness of at least s.0015 inch. Electroless metal deposition involves relatively slow deposition rates and thus extended processing times are required to deposit such thickness. The Yu, et al. teaching also involves photoetching to selectively remove metal, further complicating the methods taught.

Elliott, in U.S. Pat. No. 6,147,660 addresses the design limitations intrinsic in helical wire-winding processing and teaches use of a molded helical antenna. Techniques taught to produce the molded antennas included zinc die casting, metal injection molding, or molding of a material such as ABS which can be plated by conventional technology. Elliot taught non-circular or non-symmetrical helical antennas, difficult to manufacture by conventional wire winding methods. Nevertheless, the manufacturing methods proposed would be difficult and costly.

A number of recent approaches to production of improved antennas involves a technology generally described as "plating on plastics" The "plating on plastics" technology is intended to deposit an adherent coating of a metal or metal-based material onto the surface of a plastic substrate. "Plating on plastic" envisions the deposition of an initial metal coating using "electroless" plating followed by an optional deposition of metal using electrodeposition. Electroless plating involves chemically coating a nonconductive surface such as a plastic with a continuous metallic film. Unlike conventional electroplating, electroless plating does not require the use of electricity to deposit the metal. Instead, a series of chemical steps involving etchants and catalysts prepare the non-conductive plastic substrate to accept a metal layer deposited by chemical reduction of metal from solution. The process usually involves depositing a thin layer of highly conductive copper followed by a nickel topcoat which protects the copper sublayer from oxidation and corrosion. The thickness of the nickel topcoat can be adjusted depending on the abrasion and corrosion requirements of the final product. Because electroless plating is an immersion process, uniform coatings can be applied to almost any configuration regardless of size or complexity without a high reliance on operator skill. Electroless plating also provides a highly conductive, essentially pure metal surface. Electrolessly plated parts can be subsequently electroplated if required.

Unfortunately, the "plating on plastics" process comprises many steps involving expensive and harsh chemicals. This increases costs dramatically and involves environmental difficulties. The process is very sensitive to processing variables used to fabricate the plastic substrate, limiting applications to carefully molded parts and designs. It may be difficult to properly mold conventional plateable plastics using the rapid injection rates often required for the thin walls of electronic components. The rapid injection rates can cause poor surface distribution of etchable species, resulting in poor surface roughening and subsequent inferior bonding of the chemically deposited metal. Finally, the rates at which metals can be chemically deposited are relatively slow, typically about one micrometer per hour. The conventional technology for metal plating on plastic (etching, chemical reduction, optional electroplating) has been extensively documented and discussed in the public and commercial literature. See, for example, Saubestre, Transactions of the Institute of Metal Finishing, 1969, Vol. 47, or Arcilesi et al., Products Finishing, March 1984.

Despite the difficulties, a number of attempts have been made to utilize the "plating on plastics technology for the production of antennas. Most antenna application involve selective placement of a metal conductor in relation to an insulating material. Selective metallization using the "plating on plastics" technology can be achieved in a number of ways. A first method is to coat the entire insulating substrate with metal and then selectively remove metal using photoetching techniques that have been used for many years in the production of printed circuits. However, these techniques are very limited in design flexibility, as discussed previously. A second method is to apply a plating stopoff coating prior to chemically depositing the metal. The stopoff is intended to prevent metal deposition onto the coated surfaces. This approach was incorporated into the teachings of Schmidt, U.S. Pat. No. 4,996,391, and Heerman, U.S. Pat. No. 4,985,600 referenced above. This approach is design limited by the need for the stopoff coating. Another more recent approach is to incorporate a plating catalyst into a resin and to combine the "catalyzed resin with an "uncatalyzed" resin in a two shot molding operation. Only the surfaces formed by the "catalyzed" resin will stimulate the chemical reaction reducing metal, and thus conceptually only those surfaces will be metallized. This approach is taught, for example, in U.S. Pat. No. 6,137,452 to Sullivan.

Selective metallizing using either stopoff lacquer of catalyzed resin approaches can be difficult, especially on complex parts, since the electroless plating may tend to coat any exposed surface unless the overall process is carefully controlled. Poor line definition, "skip plating" and complete part coverage due to bath instabilities often occurs. Despite much effort to develop consistent and reliable performance through material and process development, these problems still remain.

Many attempts have been made to simplify the process of plating on plastic substrates. Some involve special chemical techniques, other than electroless metal deposition, to produce an electrically conductive film on the surface followed by electroplating. Typical examples of the approach are taught by U.S. Pat. No. 3,523,875 to Minklei, U.S. Pat. No. 3,682,786 to Brown et. Al., and U.S. Pat. No. 3,619,382 to Lupinski. The electrically conductive surface film produced was intended to be electroplated. Multiple performance problems thwarted these attempts.

Another approach proposed to simplify electroplating of plastic substrates is incorporation of electrically conductive fillers into the resin to produce an electrically conductive plastic which is then electroplated. In a discussion of polymers rendered electrically conductive by loading with electrically conductive fillers, it may be important to distinguish between "microscopic resistivity" and "bulk" or "macroscopic resistivity". "Microscopic resistivity" refers to a characteristic of a polymer/filler mix considered at a relatively small linear dimension of for example 1 micrometer or less. "Bulk", or "macroscopic resistivity" refers to a characteristic determined over larger linear dimensions. To illustrate the difference between "microscopic" and "bulk, macroscopic" resistivities, one can consider a polymer loaded with conductive fibers at a fiber loading of 10 weight percent. Such a material might show a low "bulk, macroscopic" resistivity when the measurement is made over a relatively large distance. However, because of fiber separation (holes) such a composite might not exhibit consistent "microscpic" resistivity.

When considering producing an electrically conductive polymer intended to be electroplated, one should consider "microscopic resistivity" in order to achieve uniform, "hole-free" deposit coverage. Thus, the fillers chosen will likely comprise those that are relatively small, but with loadings sufficient to supply the required conductive contacting. Such fillers include metal powders and flake, metal coated mica or spheres, conductive carbon black and the like.

Any attempt to make an acceptable directly electroplateable resin using the relatively small metal containing fillers encounters a number of barriers. First, the fine metal containing fillers are relatively expensive. The loadings required to achieve the particle- to particle proximity to achieve acceptable conductivity increases the cost of the polymer/filler blend dramatically. The metal containing fillers are accompanied by further problems. They tend to cause deterioration of the mechanical properties and processing characteristics of many resins, limiting options in resin selection. Metal fillers can be abrasive to processing machinery and may require specialized screws, barrels and the like. Finally, despite being electrically conductive, a metal-filled polymer still offers no mechanism to produce adhesion of an electrodeposit since the metal particles are generally encapsulated by the resin binder. For the above reasons, fine metal particle containing plastics have not been considered for production of directly electroplateable articles. Rather, they have found applications in production of conductive adhesives, pastes, and paints where volume requirements are minimized.

The least expensive (and least conductive) of the readily available conductive fillers for plastics are carbon blacks. Attempts have been made to produce electrically conductive polymers based on carbon black loading intended to be subsequently electroplated. An example of this approach is the teaching of Adelman in U.S. Pat. No. 4,038,042. Adelman taught incorporation of conductive carbon black into a polymeric matrix to achieve electrical conductivity required for electroplating. The substrate was pre-etched in chromic/sulfuric acid to achieve adhesion of the subsequently electrodeposited metal. A fundamental problem remaining unresolved by the Adelman teaching is the relatively high resistivity of carbon black loaded polymers. The lowest microscopic resistivity generally achievable with carbon black loaded polymers is about 1 ohm-cm. This is about five to six orders of magnitude higher than typical electrodeposited metals such as copper or nickel. In electrodeposition, the workpiece to be plated is normally made cathodic through a pressure contact to a metal rack tip, itself under cathodic potential. However, if contact resistance is excessive or the workpiece is insufficiently conductive, the electrodeposition current favors the rack tip to the point where the electrodeposit will not bridge to the workpiece. Moreover, a further problem is encountered even if specialized racking successfully achieves electrtodeposit bridging to the workpiece. Since the carbon black loaded workpiece is of relatively high resistivity compared to metal, most of the electroplating current must pass back through the previously electrodeposited metal, the electrodeposit growing laterally over the surface of the workpiece. As with the bridging problem, the electrodeposition current favors the electrodeposited metal and the lateral growth can be extremely slow, restricting sizes for the workpiece.

Luch in U.S. Pat. No. 3,865,699 taught incorporation of small amounts of sulfur into polymer-based compounds filled with conductive carbon black. The sulfur was taught to have two advantages. First, it participated in formation of a chemical bond between the polymer-based substrate and an initial Group VIII based metal electrodeposit. Second, the sulfur increased lateral growth of the Group VIII based metal electrodeposit over the surface of the substrate.

Since the polymer-based compositions taught by Luch could be electroplated directly without any pretreatment, they could be accurately defined as directly electroplateable resins (DER). Directly electroplateable resins, (DER), are defined and characterized in this specification and claims by the following features.

(a) having a polymer matrix;
(b) presence of carbon black in amounts sufficient to have a "microscopic" electrical volume resistivity of the polymer/carbon black mix of less than 1000 ohm-cm, e.g. 100 ohm-cm, 10 ohm-cm, 1 ohm-cm.
(c) presence of sulfur (including any sulfur provided by sulfur donors) in amounts greater than about 0.1% by weight of the overall polymer-carbon black-sulfur composition; and
(d) presence of the polymer, carbon and sulfur in the directly electroplateable composition in cooperative amounts required to achieve direct, uniform, rapid and adherent coverage of said composition with an electrodeposited Group VIII metal or Group VIII metal-based alloy.

Polymers such as polyvinyls, polyolefins, polystryrenes, elastomers, polyamides, and polyesters were identified by Luch as suitable for a DER matrix, the choice generally being dictated by the physical properties required.

The minimum workable level of carbon black required to achieve "microscopic" electrical resistivities of less than 1000 ohm-cm. for the polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities. The "bulk, macroscopic" resistivity of conductive carbon black filled polymers can be further reduced by augmenting the carbon black filler with additional highly conductive fillers such as metal containing fibers or flake. This can be an important consideration in the design of the antenna structures and circuitry of the present invention.

Due to multiple performance problems associated with their intended end use, none of the attempts to simplify the process of plating on plastic substrates identified above has ever achieved any recognizable commercial success. Nevertheless, the current inventor has persisted in personal efforts to overcome certain performance deficiencies associated with the initial DER technology. Along with these efforts has come a recognition of unique and eminently suitable applications employing DER for the production of complex, highly conductive surface traces, circuitry, and antennas.

OBJECTS OF THE INVENTION

An object of the invention is to produce new structures for highly conductive surface patterns and traces, complex circuitry and antennas.

A further object of the invention is to produce novel methods of facile manufacture of highly conductive surface patterns and traces, complex circuitry and antennas.

A further object of the invention is to expand permissible design options for production of highly conductive surface patterns and traces, complex circuitry and antennas.

SUMMARY OF THE INVENTION

The present invention involves production of patterned surfaces comprising a directly electroplateable resin. The directly electroplateable resin can be self-supporting, but often is used in combination with an electrically insulating support material. In preferred embodiments the direction electroplateable resin is further coated with an adherent layer of highly conductive electrodeposit. Novel manufacturing methods and structures made possible by the use of directly electroplateable resins are taught.

DESCRIPTION OF PREFERRED EMBODIMENTS

Figure 1:
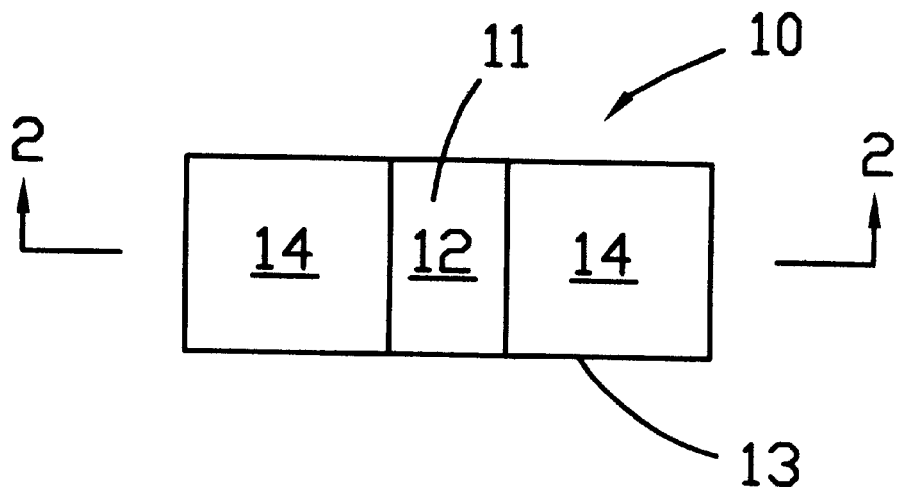
FIG. 1 is a top plan view of an embodiment of the invention.

The following teaching of preferred embodiments, taken along with the descriptive figures, will reveal and teach the eminently suitable characteristics of directly electroplateable materials in the production of antennas and complex, three dimensional electrically conductive surface traces. In the following, the acronym "DER" will be used to designate a directly electroplateable resin. A number of unique characteristics of DER formulations allow these advances. Specifically, high flow formulations have been demonstrated which permit molding of thin-walled parts and extended conductive traces required in present electronic applications. High loadings of additional fillers, such as glass fiber, can be employed to solve dimensional stability and shrinkage issues without adversely affecting plateability. This is a result of the recognition that plateability issues with DER's are controlled by "microscopic resistivity" rather than "macroscopic resistivity". The unique ability to custom formulate DER's allows production of complex, selectively plated structures using processing techniques such as dual shot molding, blow molding, extrusion and coating. Fine line edge definition can be readily achieved. Unique electrical joining techniques between metal leads and electroplated DER are possible. These and other attributes of DER's in production of antennas and complex conductive surface traces will become clear through the following remaining specification and accompanying figures.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
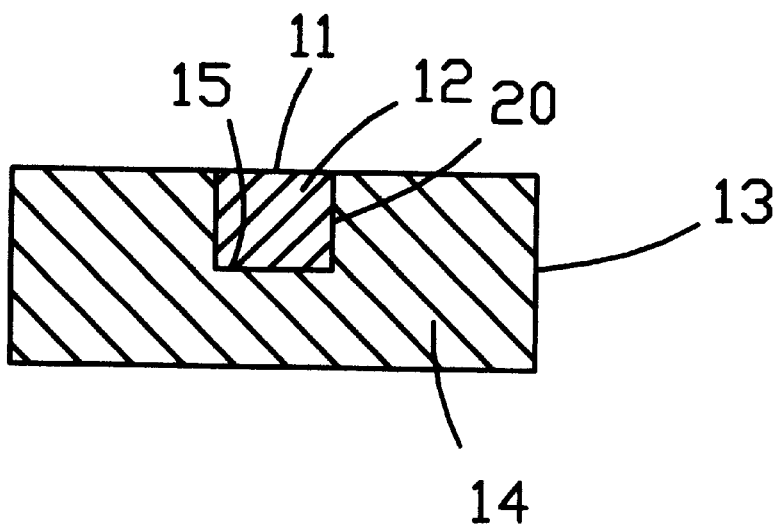
FIG. 2 is a sectional view of the FIG. 1 embodiment taken substantially from the perspective of line 2—2 of FIG. 1.
Figure 3:
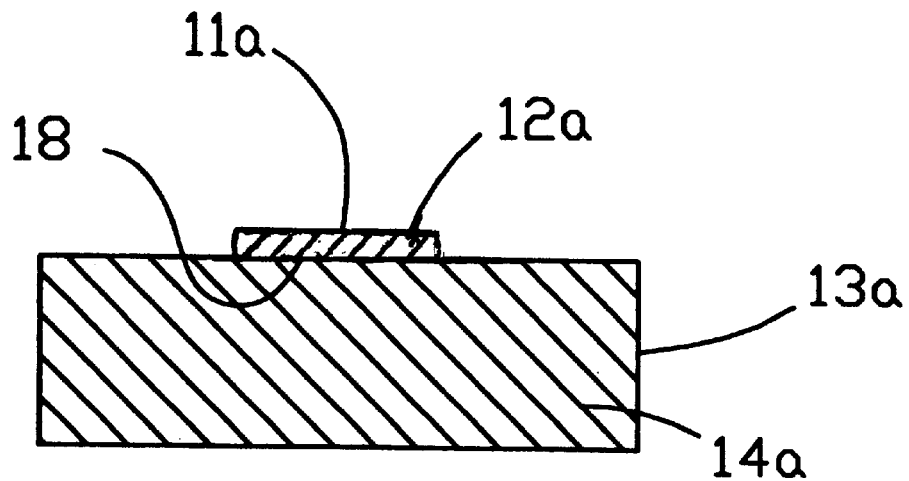
FIG. 3 is a sectional view, similar to FIG. 2, of an alternate embodiment.

Referring to FIG. 1, there is shown a top plan view of an article generally designated by numeral 10. Article 10 is characterized by having a stripe 11 of directly electroplateable resin (DER) 12 supported by a substrate 13 comprising electrically insulating resin 14. FIG. 2 is a sectional view of the FIG. 1 structure taken substantially along the line 2—2 of FIG. 1. As shown in FIG. 2, DER material 12 is contained in a trench 15 formed in substrate 13. FIG. 3 is a view similar to FIG. 2 of an alternate embodiment wherein DER material 12a is formed as a stripe 11a on the top, essentially flat surface of substrate 13a. It has been found that the structure of FIG. 2 is often desirable by permitting greater latitude in the selection of materials for the DER binder and the insulating support. For example, structural features can be introduced into the abutting surfaces 20 of the trench 15 of FIG. 2 to assist in mechanical retention of the DER stripe 11. The simple abutting flat surfaces at 18 of the FIG. 3 embodiment may be simpler to produce than the FIG. 2 trench structure, but the FIG. 3 arrangement generally requires good adhesive compatibility between the DER 12a and insulating material 14a of support substrate 13a.

Figure 4:
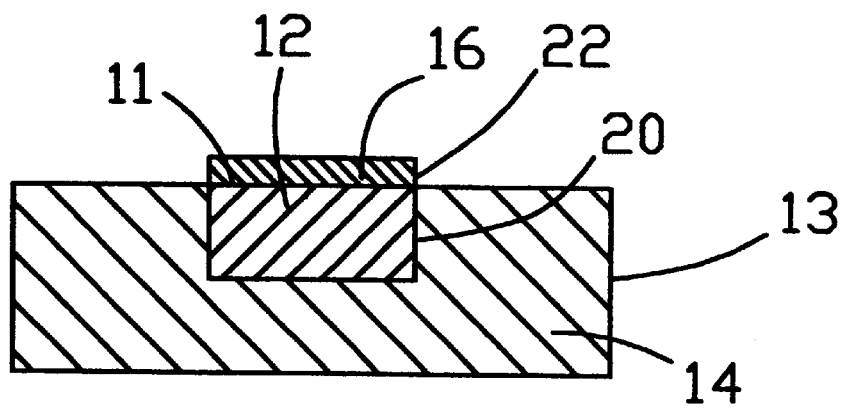
FIG. 4 is a sectional view of the embodiment of FIG. 2 following an additional processing step.

Referring now to FIG. 4, the structure of FIG. 2 is shown following an additional processing step of electrodepositing metal-based material 16 onto the DER strip 11. Metal-based electrodeposit 16 is shown in FIG. 4 as a single layer. However, it is understood that electrodeposit 16 in this and subsequent embodiments can comprise a laminate of multiple layers of electrodeposit to achieve functional or aesthetic benefits. Electrodeposit 16 can also comprise dispersed particles.

Continuing to refer to FIG. 4, it has been found that penetration of electroplating solution into the abutting surface region 20 does not readily occur (and thus is generally not a problem) even when there is reduced adhesive compatibility between the DER material 12 and substrate material 14. The abutting surfaces at 20 are generally in close proximity and the electroplating solution is incapable of necessary air displacement to allow such penetration. In addition, the polymers chosen for DER 12 and substrate 13 are often hydrophobic and would generally resist such penetration of solution. Were penetration of electroplating solution into the interfacial region 20 to become a problem, one could choose a material for substrate 13 having a lower coefficient of thermal expansion than the DER 12. In this way, the DER would form an expanded "plug" at the elevated temperatures of the electroplating baths to temporarily seal the interfacial gap.

Figure 5:
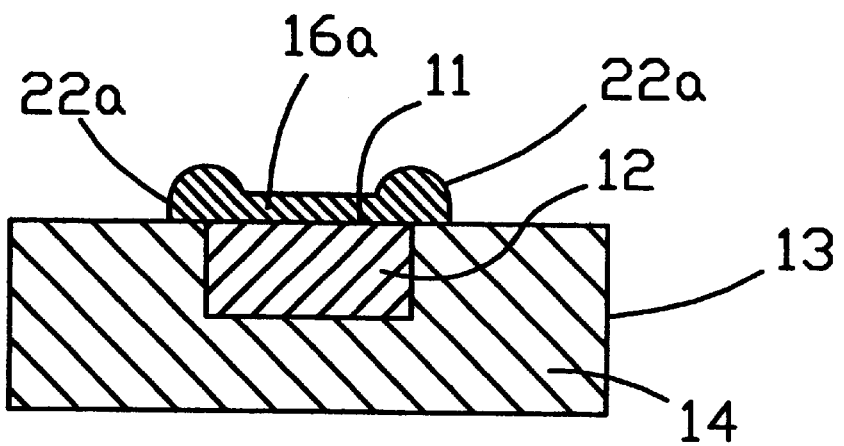
FIG. 5 is a sectional view similar to FIG. 4 illustrating a problem associated with the additional processing included in the FIG. 4 embodiment.

Continuing to refer to FIG. 4, there is shown a sharp line of demarcation at the edges 22 of electrodeposit 16. This sharp line is achieved by the electrically "digital" nature of surface conductivity between the conductive DER 12 and insulating substrate material 14. Using proper electroplating practice known in the art, sharp edge or line definition can be expected and achieved up to electrodeposit thicknesses of typically 25 micrometer. However, reference to FIG. 5, a view similar to FIG. 4, illustrates an effect of electrodeposition which can blur line definition at thicker electrodeposits or where there is deviation from optimal processing. FIG. 5 shows a substantial increase in thickness of electrodeposit 16a edges 22a. This phenomenon, known as "berry buildup", results from the well-know tendency of electrodeposits to concentrate deposition at edges or sharp corners. In many cases this characteristic results in formation of nodules (or berries) which further accentuates the detrimental effect.

Figure 6:
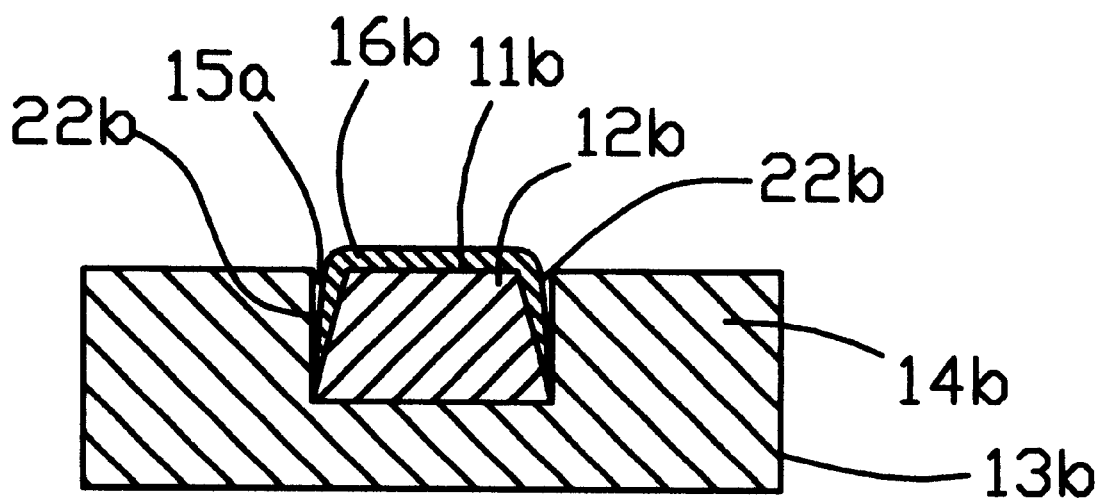
FIG. 6 is a sectional view teaching an alternative structure to eliminate the problem illustrated in the FIG. 5 embodiment.
Figure 7:
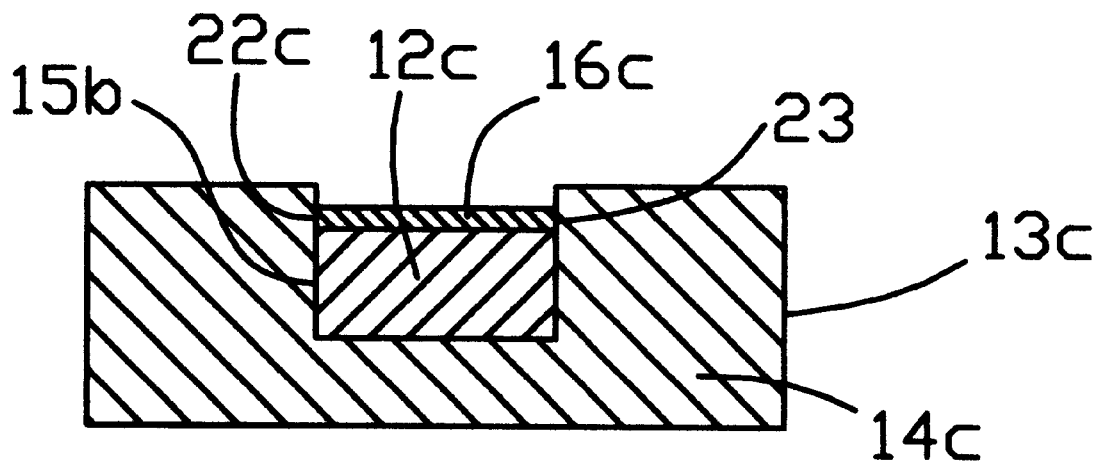
FIG. 7 is a sectional view teaching an additional alternative structure to eliminate the problem illustrated in the FIG. 5 embodiment.

Reference to FIGS. 6 and 7 is made to show how the blurring of line definition at electrodeposit edges can be avoided using the teachings of the instant invention. In FIG. 6, there is shown a structure wherein the DER material 12b does not completely fill the trench 15a formed in substrate 13b. Here the edges 22b of electrodeposit metal-based material 16b are positioned in a depression or recess. It is known that recessed areas receive reduced amounts of electrodeposited material, the opposite effect to having a raised sharp edge. Thus, proper choice of the width and depth of the recess provides for maintenance of adequately sharp line definition for the selectively conductive surface patterns of the current invention when thick metal layers are demanded.

FIG. 7 shows an alternate design embodiment intended to produce a sharp line demarcation between conductive electrodeposit 16c and insulating substrate 13c. In the FIG. 7 embodiment, DER material 12c does not completely fill the trench 15b formed in substrate 13c. Nodule or "berry" buildup at edges 22c of electrodeposit 16c is prevented by the shielding effect of trench walls 23 of substrate 13c, thereby containing the lateral extend of electrodeposit 16c.

Figure 8:
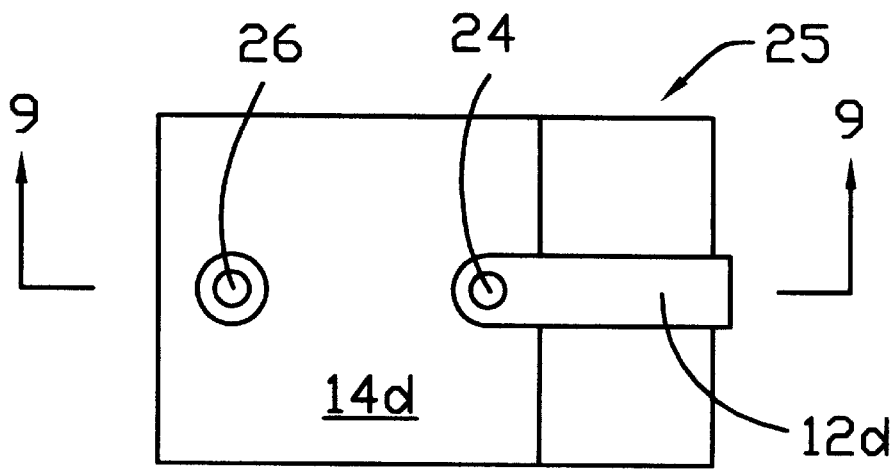
FIG. 8 is a top plan view of an intermediate article in the manufacture of a three dimensional conductive trace according to the teachings of the invention.
Figure 9:
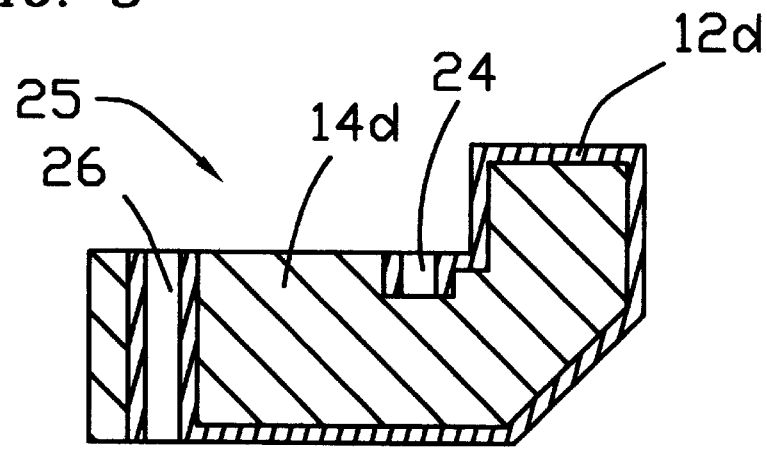
FIG. 9 is a sectional view taken substantially from the perspective of line 9—9 of FIG. 8.
Figure 10:
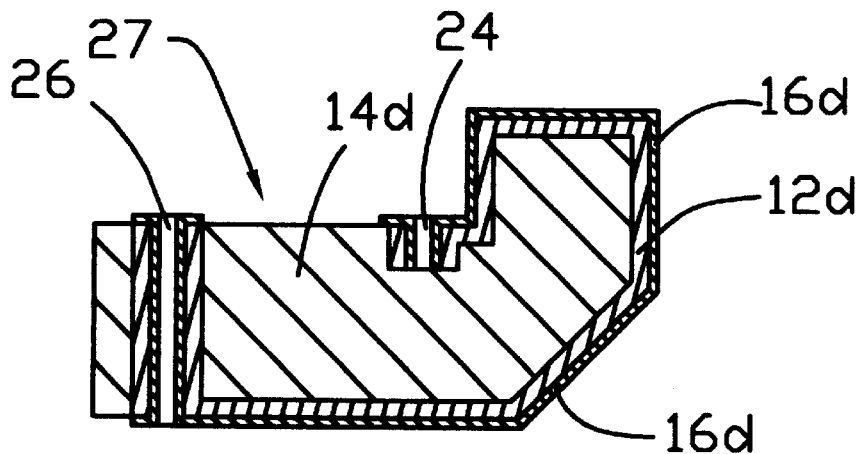
FIG. 10 is a sectional view of the article of FIGS. 8 and 9 following an additional processing step.

FIGS. 1 through 7 illustrate embodiments of production of simple electrically conductive traces or strips supported by an insulating substrate. A more complex, three dimensional structure is illustrated in the embodiments of FIGS. 8 and 9. These figures illustrate a multicomponent article using DER to produce a geometrically complex three dimensional conductive pattern. In FIGS. 8 and 9, DER material is identified as numeral 12d, and insulating material as 14d. It is contemplated that the article of FIGS. 8 and 9 is produced by a multi-component (generally referred to as multi-color) molding process. In one form of this process, an insulating substrate is first molded with channels defining a pattern intended for the eventual conductive pattern. DER material is then injected into the channels. FIGS. 8 and 9 also illustrate a well 24 and through-hole 26 which are molded into the object. FIG. 10 illustrates the article, now idetified as 27, following exposure to an electroplating process. In FIG. 10, numeral 16d indicates the electrodeposit. Electrodeposit 16d is understood to be either a single layer or multiple layers of metal-based material as is understood in the electroplating art. The electrodeposit supplies a robust, highly conductive surface pattern that would be difficult to produce or achieve by alternate techniques currently available, such as photoetching. It is also important to recognize that the unique design and process taught by the present disclosure is accomplished in a fully additive fashion. No wasteful or costly material removal steps are needed to achieve most of the embodiments of the invention, a significant advantage over the prior art.

In most applications, the conductive pattern produced by the DER/electrodeposit must be electrically connected to the electrical leads of a device such as a chip, capacitor, etc. In many cases these connections are made by high temperature soldering. This process can limit the selection of materials and processes used for production of the integrated device.

Figure 11:
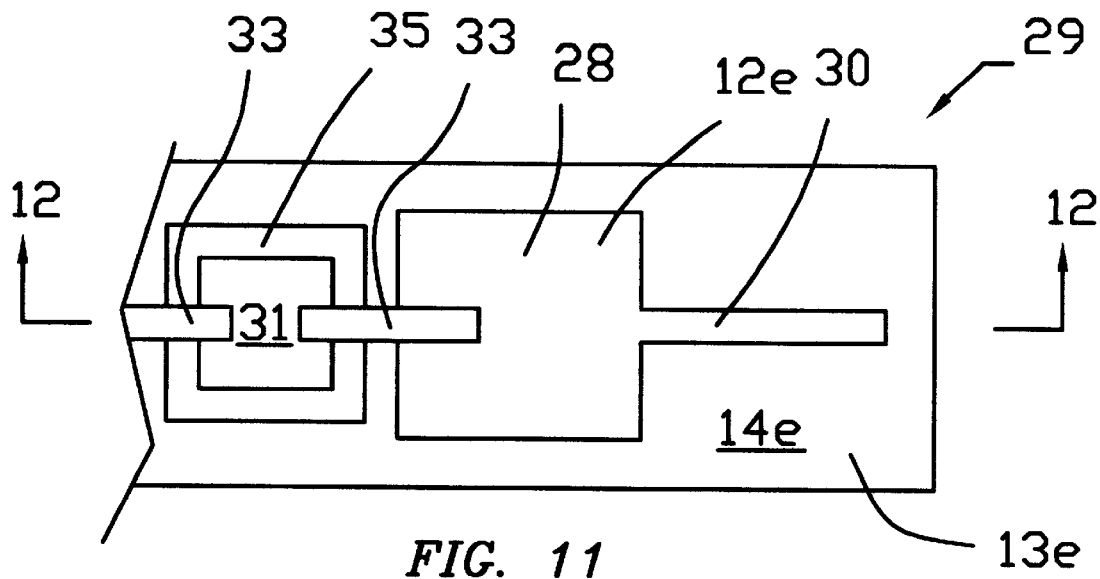
FIG. 11 is a top plan view of an intermediate article in the process of attaching metal inserts to conductive surface traces.
Figure 12:
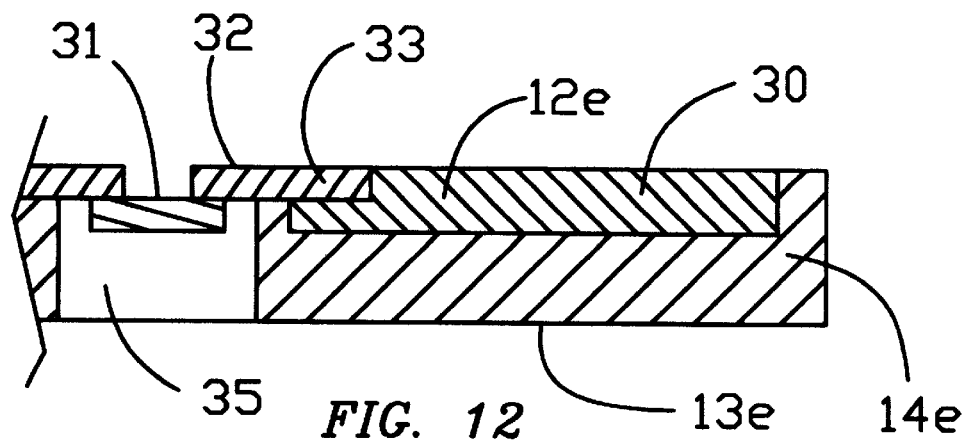
FIG. 12 is a sectional view of the article of FIG. 11 taken substantially from the perspective of line 12—12 of FIG. 11.
Figure 13:
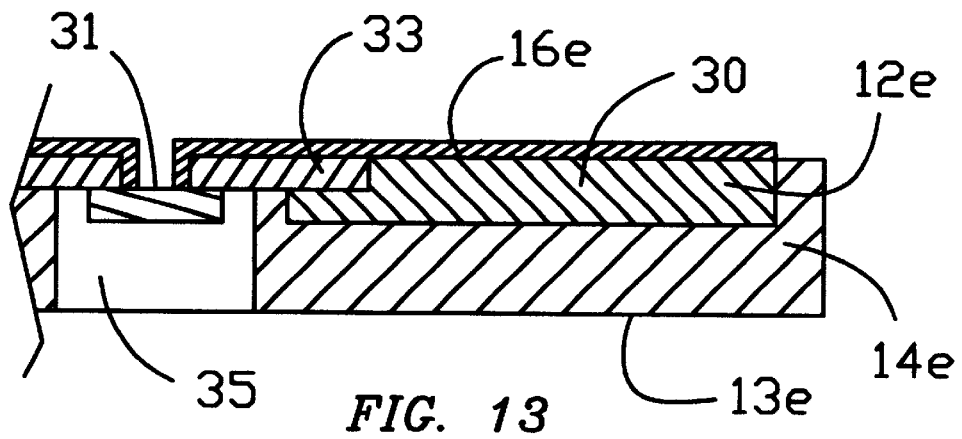
FIG. 13 is a sectional view showing the article of the embodiment of FIGS. 11 and 12 following an additional processing step.

FIGS. 11 through 13 illustrate an alternate method for electrically connecting the electrical leads of a device to conductive patterns produced using DER/electrodeposit composites. FIG. 11 shows a top plan view of an article, identified as 29, combining a device 31 with a DER pattern. The electrical device, indicated as 31, is positioned in a hole 35 in substrate 13e. Substrate 13e comprises electrically insulating material 14e. Device 31 includes electrical leads 33 which are normally metallic. A DER pattern 12e comprises pad 28 and elongated strip 30. Strip 30 could form, for example, an antenna pattern. Electrical device 31, leads 26 and DER pattern 12e are supported by insulating substrate 14e. FIG. 12 is a sectional view taken substantially from the perspective of line 12—12 of FIG. 11. In FIG. 12 it is seen that device lead 33 is embedded into the DER material 12e to the extent that at least a portion of the surface of lead 33, indicated by 32, remains exposed. Embedding the leads 33 can be done by known techniques such as heat staking or molding of the DER material around a portion of lead 33 (insert molding).

FIG. 13 is a sectional view similar to FIG. 12 following an additional processing step of electroplating metal-based material 16e. It is seen in FIG. 13 that metal-based electrodeposit extends continuously over the originally exposed surface of leads 33 to the DER (12e) pattern. The electrodeposit 16e forms a robust, continuous and highly conductive connection between the lead 33 and the now metal plated, highly conductive pattern 31 originally defined by the DER material.

A number of factors allow this electrical connection through electrodeposition. First, adequate bonding between metals and subsequent electrodeposits normally requires some sort of cleaning treatment to remove contaminants or oxides from the metallic surface. Proper selection of the polymeric base resin for the DER allows these materials to be unaffected by required metal cleaning treatments. Second, since DER's are plated without any requirement for very harsh chemical etching treatments used to plate plastics by conventional means, potential damage to the metal leads from such treatments is avoided. Third, as discussed above, any detrimental penetration of electroplating solution into the interfacial area between the metal lead and the DER has not been observed as a problem. Indeed, excellent bridging of electrodeposits between metal leads and the DER materials has been characteristic. However, were such solution penetration to be a problem, a simple pre-dip of the structure in distilled water would cause the interfacial volume to fill with innocuous water rather than any harsher chemical solutions.

Figure 14:
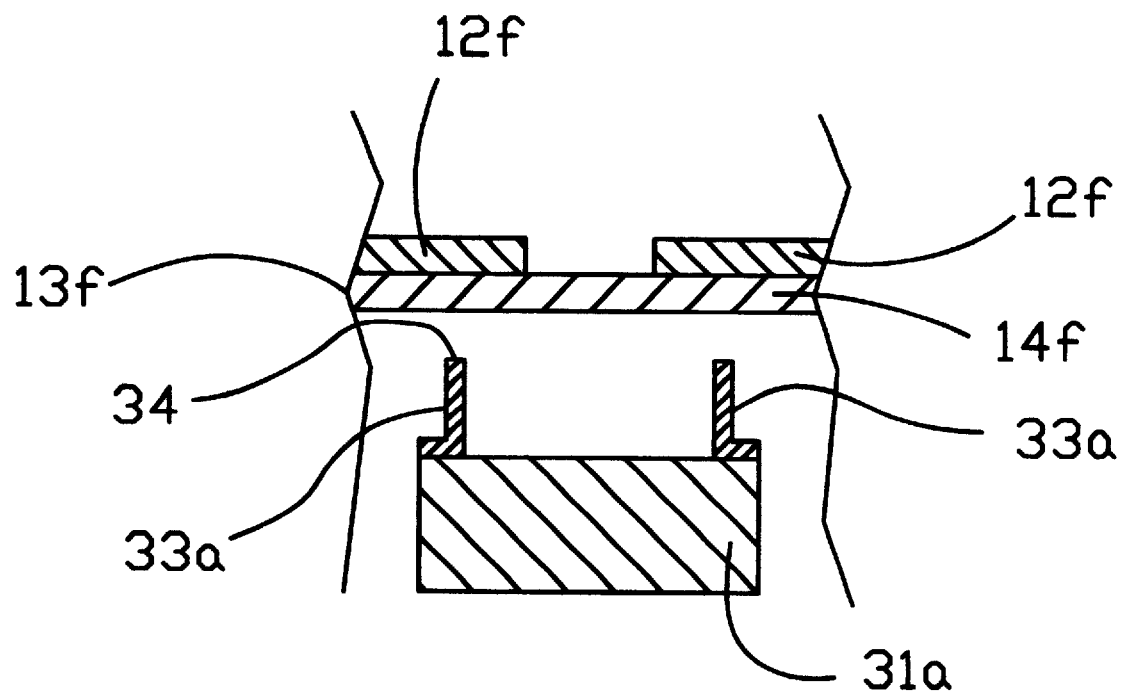
FIG. 14 is a sectional view illustrating article positioning for an alternate process for attaching metal inserts to conductive surface traces.
Figure 15:
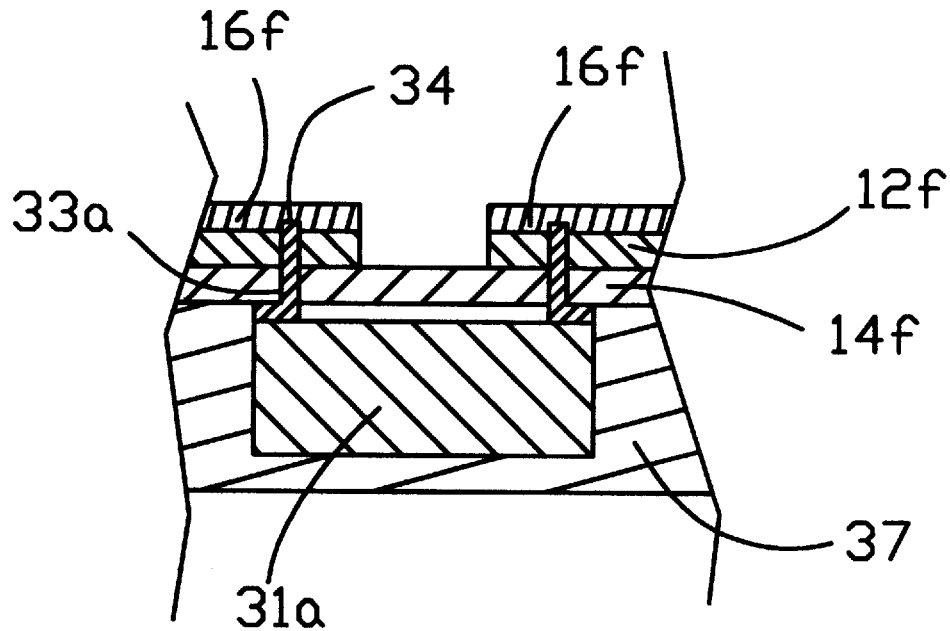
FIG. 15 is a sectional view of the embodiment of FIG. 14 following additional processing steps.

In the embodiment of FIG. 13, it is seen that the device 24 remains exposed to electroplating solutions during deposition of metal-based layer 16e. Damage to the device from this exposure is avoided in that the device is normally encapsulated in a protective resin moisture barrier, with only the metallic leads 33 exposed. However, in some applications one may wish to further isolate the device from the electroplating solutions. A process to completely isolate the device from the electroplating solutions during the electrodeposition is illustrated in FIGS. 14 and 15. In FIG. 14, device 31a with leads 33a is positioned beneath insulating support substrate 13f. DER pattern is positioned on the upper surface of support substrate 13f.

FIG. 15 is a sectional view of this embodiment after a number of additional processing steps as follows. First, the device 31a has been moved relative to insulator/DERstructure 14f/12f so that the terminal ends 34 of leads 33a penetrate through the DER layer 12f and are exposed. Next, a layer of additional insulating material 37 is applied to encapsulate device 31a. This additional insulating layer can be applied by known techniques such as solution coating or film laminating. Finally, a layer of electrodeposited metal-based material 16f is deposited to electrically connect the terminal ends 34 of leads 33a to the metal-based pattern simultaneously formed by electroplating the DER 12f.

One will appreciate in light of the teachings associated with FIGS. 11 through 15, that the attachment of a metal component to a conductive trace through the steps of embedding in a DER material followed by electroplating is not restricted to the leads of a particular device. Other metallic inserts, such as wires, connectors, spring contacts etc. can be considered for electrical attachment using these techniques.

Figure 16:
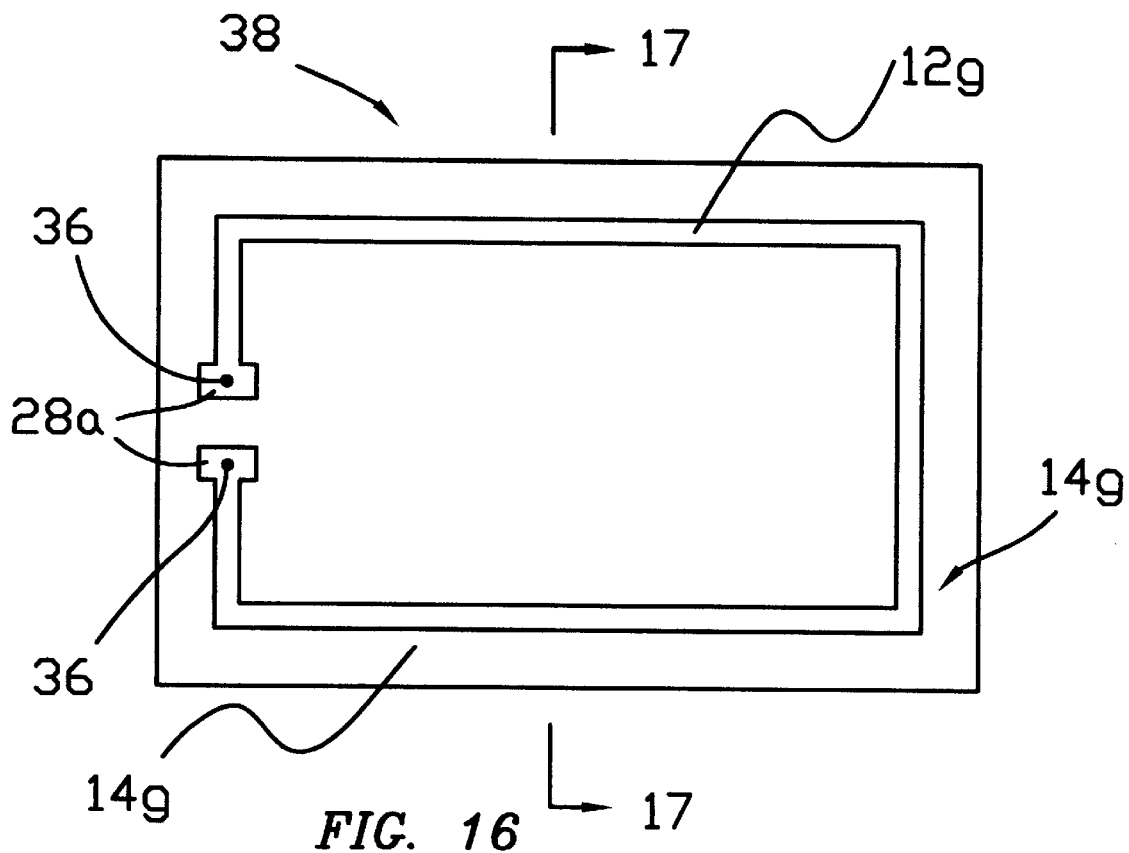
FIG. 16 is a top plan view of an intermediate article in the manufacture of a low profile loop antenna according to the teachings of the invention.
Figure 17:
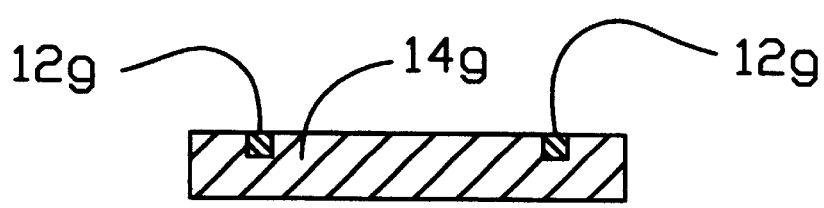
FIG. 17 is a sectional view taken substantially from the perspective of line 17—17 of FIG. 16.
Figure 18:
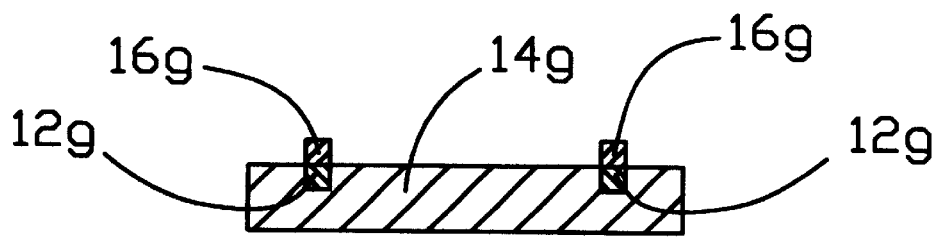
FIG. 18 is a sectional view of the intermediate article of FIGS. 16 and 17 following an additional processing step.

FIGS. 16 through 18 illustrate an embodiment of a low profile loop antenna produced by the teachings of the present invention. FIG. 16 is a top plan view of the starting structure indicated as 38. Structure 38 has a loop formed by a trace of DER material 12g supported on insulating material 14g. Device mounting pads 28a are included in the pattern formed by DER material 12g. Device mounting holes 36 are located in pads 38a for accurately locating the leads of an electronic device (not shown).

FIG. 17 is a sectional view taken substantially from the perspective of line 17—17 of FIG. 16. FIG. 17 shows DER 12g loop trace being embedded in insulating substrate material 14g in a fashion similar to the structure of FIG. 2. FIG. 18 shows the cross-sectional structure following an additional processing step of electroplating metal-based material 16g onto the DER material 12g. An electrical device (not shown) may be attached to pads 28a and simultaneously electrically connected to the DER/electrodeposit loop by techniques discussed in conjunction with FIGS. 11 through 15. Material 16g now forms a high conductive, low profile loop antenna/inductor to transmit information and/or power an electrical device (not shown) attached at pads 28a. Such an antenna is substantially flat, simple to mass produce, and physically and electrically robust. Such an antenna would be very suitable for production of low profile items such as a contactless "smart card".

Figure 19:
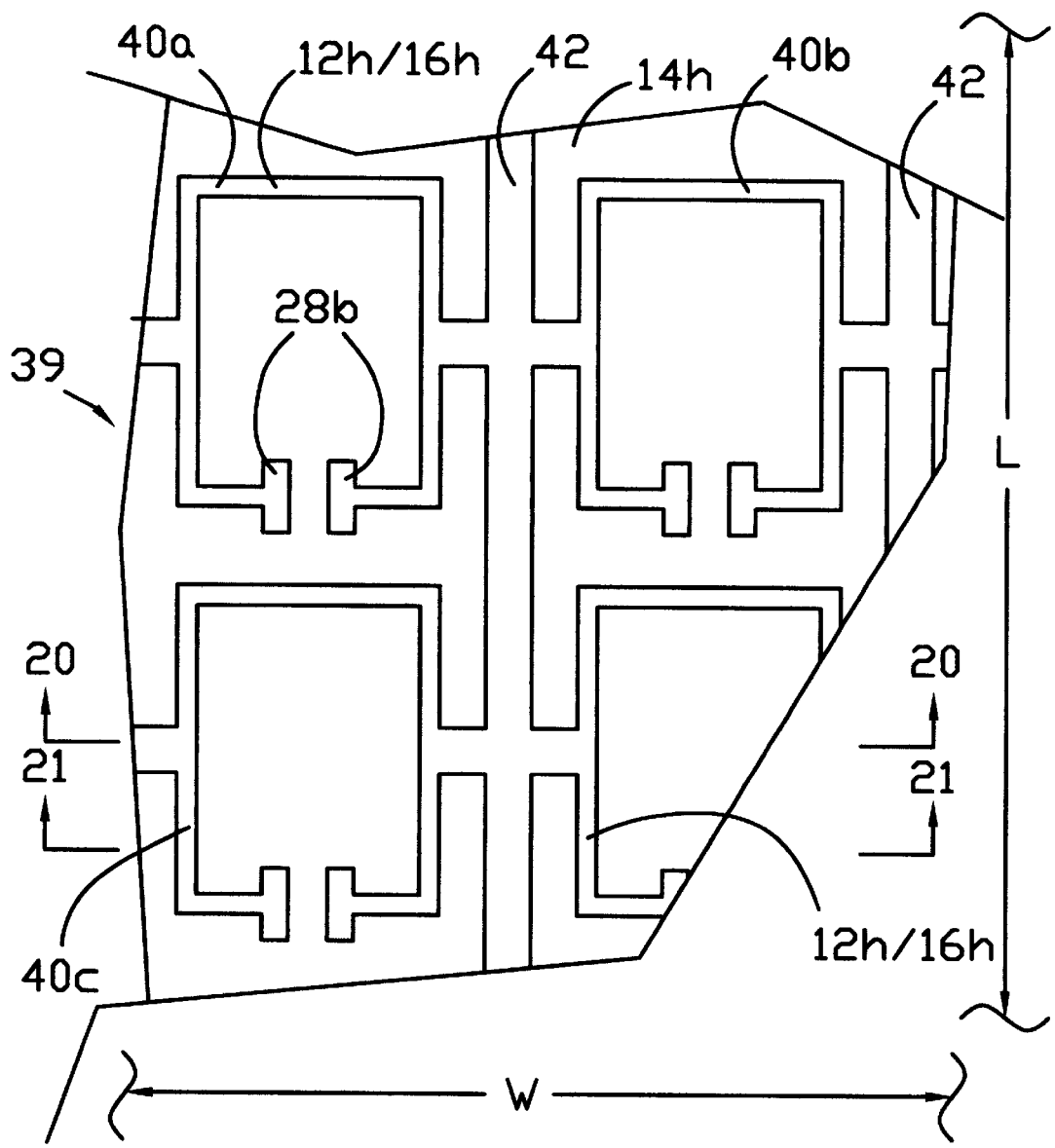
FIG. 19 is a top plan view of a structural arrangement in the mass production of substantially planar loop antennas according to the teachings of the invention.

FIGS. 19 through 23 illustrate a method of inexpensive mass production of a form of the low profile loop antenna introduced in FIGS. 16 through 18. In FIG. 19, a web of substantially planar structure is identified generally as 39. Structure 39 has a length in the direction designated by the letter "L" and width designated by the letter "W". In the embodiment of FIG. 19, length "L" is contemplated to be considerably larger than width "W" and thus structure 39 can be processed in roll-to-roll fashion.

Structure 39, FIG. 19 is characterized by the following factors. Electrically insulating sheet 14h supports a pattern of DER/electrodeposit composite material 12h/16h having multiple loops 40a, 40b, 40c . . . , similar to those taught in conjunction with FIGS. 16 through 18. Loop traces 40a, 40b, 40c . . . include mounting pads 28b. "Buss" DER/electrodeposit traces 42 are disposed between the DER loop traces 40a, 40b, 40c . . .

The initial structural arrangement of DER material 12h supported on a web of insulating material 14h can be produced by known techniques, including programmed extrusion of thermoplastic DER or printing of a DER formulation dissolved in solvent to form an ink. The pattern of DER loops can then be directly electroplated by continuously passing the web having the DER pattern disposed thereon through appropriate electroplating baths. In the electroplating operation, "busses" 42 provide electrical communication to conduct the electrodeposition current to the individual loops.

Figure 20:
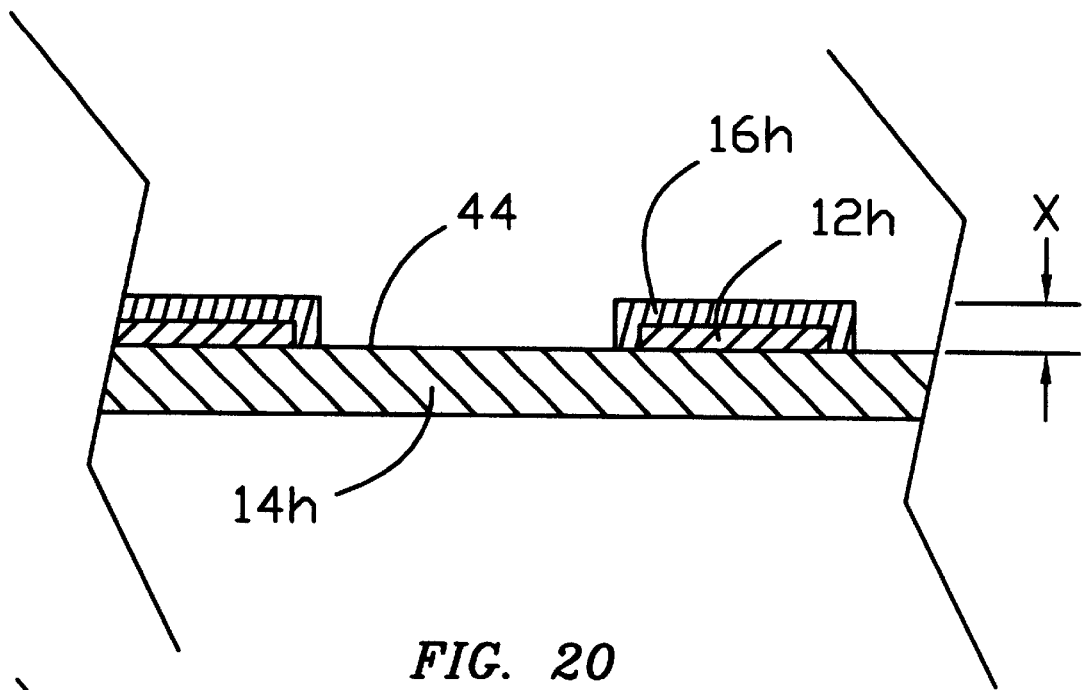
FIG. 20 is a sectional view taken substantially from the perspective of line 20—20 of FIG. 19.
Figure 21:
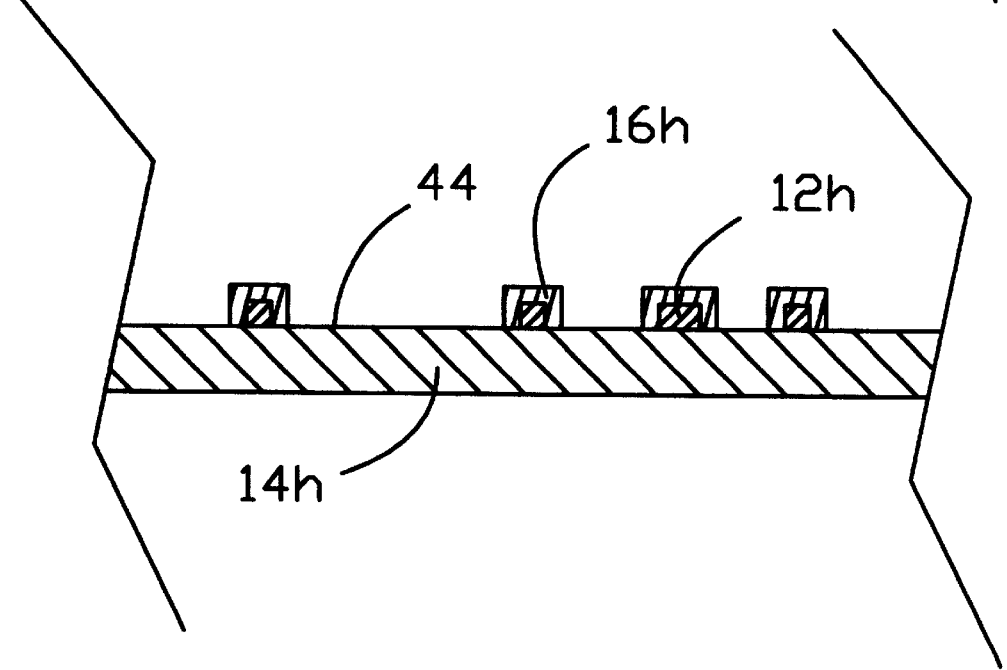
FIG. 21 is a sectional view taken substantially from the perspective of line 21—21 of FIG. 19.

FIGS. 20 and 21 are sectional views of the FIG. 19 structure taken substantially from the perspective of lines 20—20 and 21—21 of FIG. 19. FIGS. 20 and 21 show that the DER and electrodeposit, 12h and 16h respectively, are positioned on the top surface 44 of supporting insulating material 14h. Such a positioning is likely more easily achieved for the continuous web processing envisioned as compared to the embedded placement of the DER 12g in substrate 14g shown in the embodiments of FIGS. 16 through 18. Nevertheless, the total thickness of the composite DER/electrodeposit traces, indicated by dimension "X" in FIG. 20 can be made relatively small, approximately 75 micrometers. Thus, the low profile of the conductive traces in maintained.

Figures 22, 23:
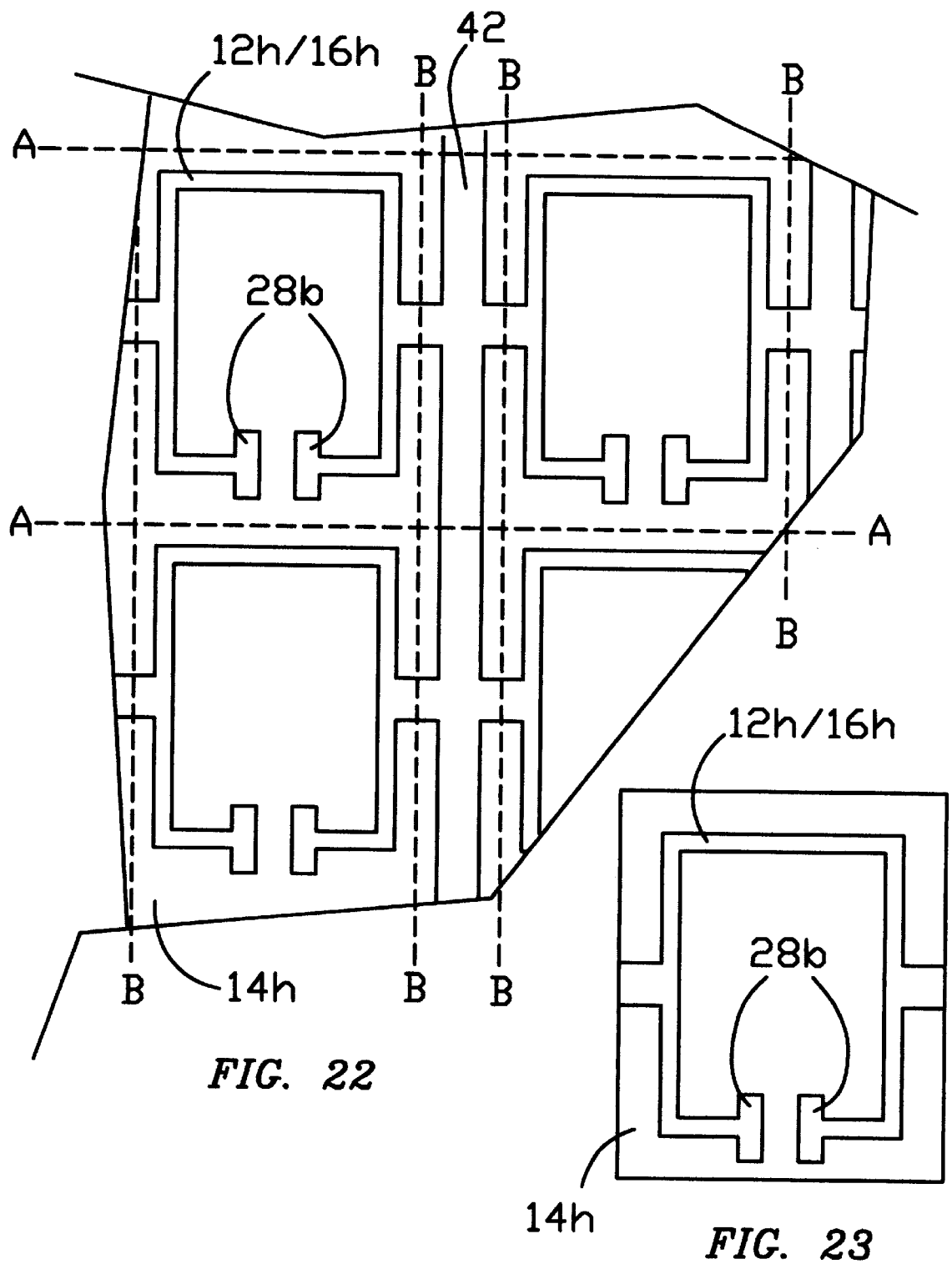
FIG. 22 is a top plan view similar to FIG. 19 indicating a cut line pattern for subdividing the arrangement to produce multiple individual loop antennas.
FIG. 23 is a top plan view of the individual antenna produced by the subdividing along the lines indicated in FIG. 22.

FIG. 22 is an additional plan view of the embodiment of FIGS. 19 through 21 showing dashed lines A, B along which the completed web is subdivided. This can be accomplished by known techniques such as slitting or punching. The subdividing results in individual conductive loop structures as shown in FIG. 23. It is understood that additional operations, such as attachment of an electrical device to pads 28b of the individual loops, can be considered while the web is in its initial "continuous" form prior to subdivision.

Figure 24:
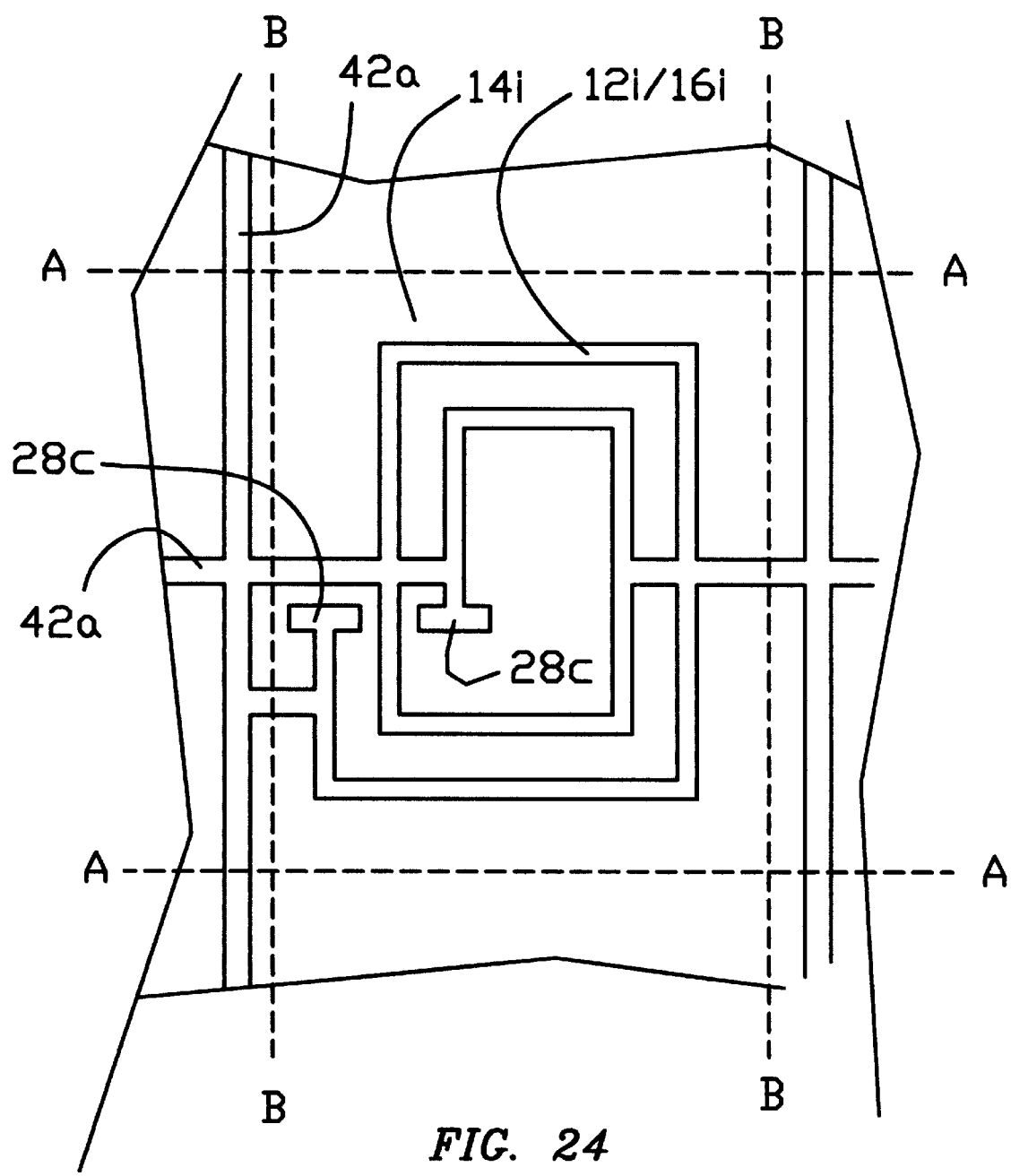
FIG. 24 is a top plan view of intermediate article in production of multiple loop, low profile antennas according to the teachings of the invention.
Figure 25:
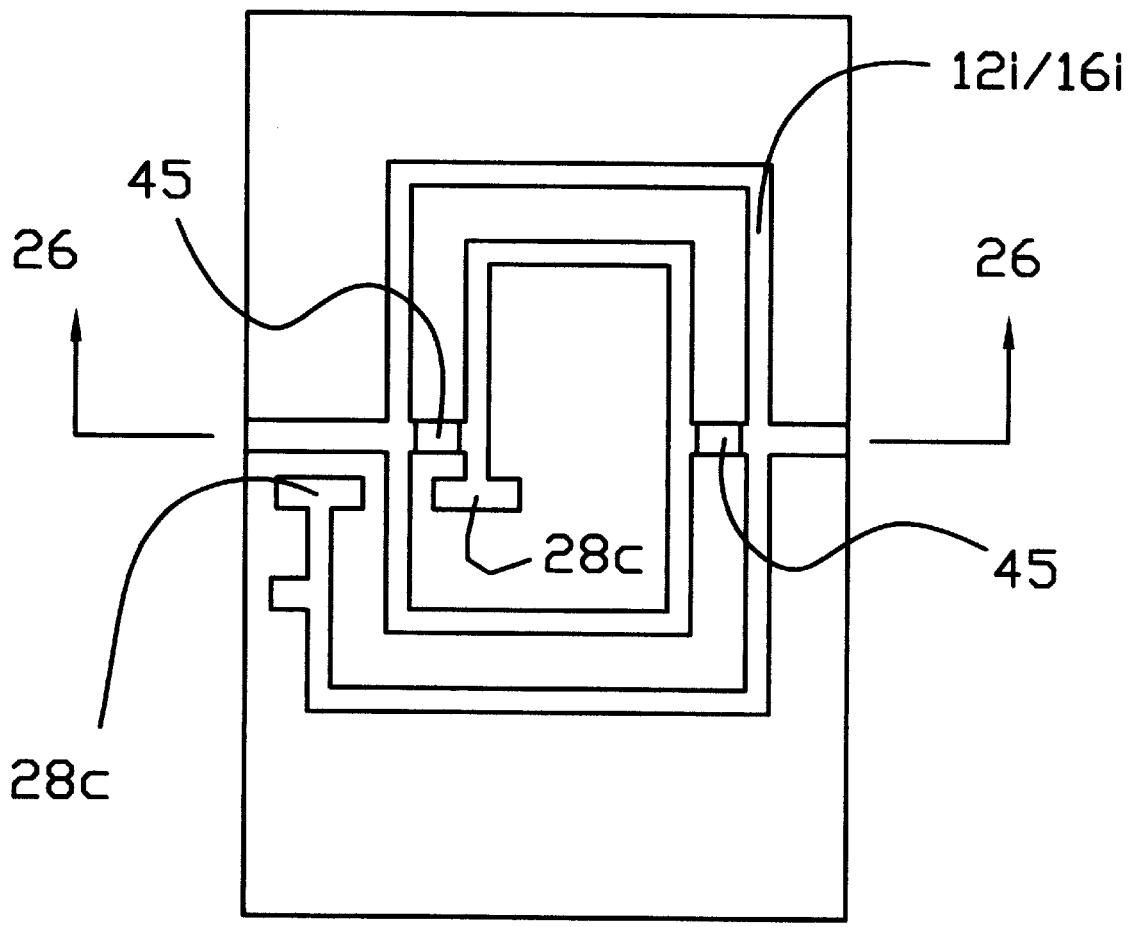
FIG. 25 is a top plan view of a discrete multiple loop, low profile antenna produced by addition processing of the article of FIG. 24.
Figure 26:
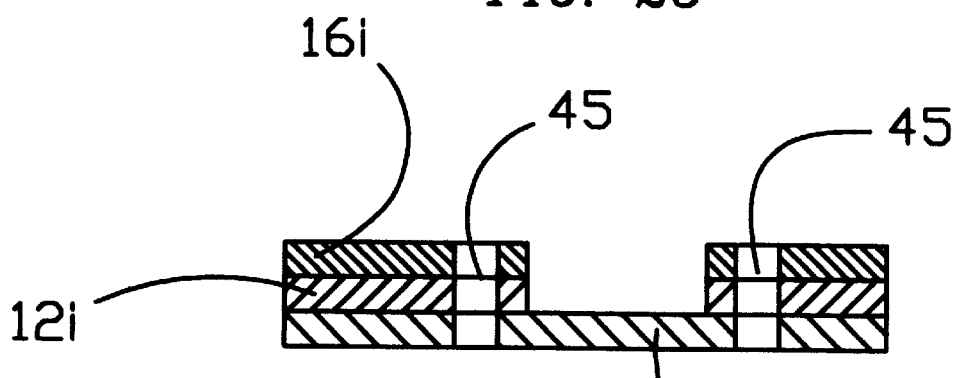
FIG. 26 is a sectional view of the article embodied in FIG. 25 taken substantially from the perspective of line 26—26 of FIG. 25.

The embodiments of FIGS. 16 through 23 illustrate a single loop of a highly conductive, low profile trace suitable for an antenna/inductor. In some cases, multiple loops of the conductive trace would be desirable. FIGS. 24 through 26 illustrate a method for production of such a multiple loop trace. FIG. 24, a top plan view similar to FIG. 19, shows a pattern of DER/electrodeposit trace 12i/16i supported on insulating material 14i. The pattern includes buss structure 42a, whose function was previously discussed in conjunction with FIGS. 19 through 23, and pads 28c. FIG. 25 is a top plan view of the article produced by removing portions of the structure of FIG. 24. The structure of FIG. 25 is produced by slitting or otherwise cutting the web along the lines generally indicated by the dashed lines A and B of FIG. 24. In addition, holes 45 are punched to remove connecting portions of the trace to complete the multiple loop arrangement. FIG. 26, a sectional view taken from the perspective of line 26—26 of FIG. 25, further illustrates the structural arrangement following the slitting and punching operations.

Figure 27:
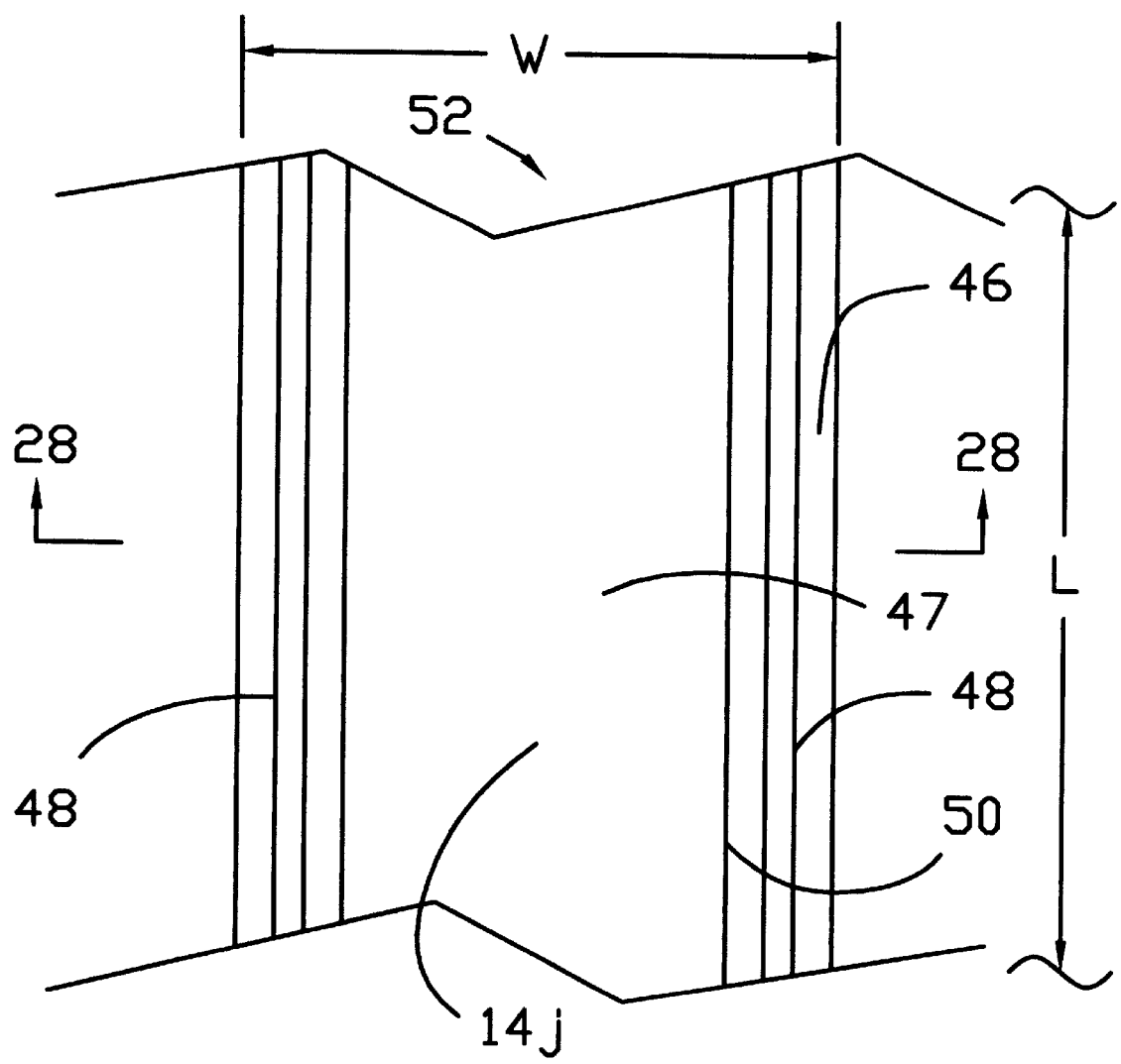
FIG. 27 is a top plan view of an intermediate structural arrangement in the manufacture of yet another embodiment of the invention.

Referring now to FIGs. 27 through 35, there is shown structure and process to produce a helical coil inductor/antenna having a substantially flat, low profile. FIG. 27 is a top plan view of a structural arrangement generally indicated by numeral 52 comprising a temporary support web 46, a core support web 47 of insulating material 14j and metal wires 48 positioned slightly removed from the edges 50 of core support web 47. Arrangement 52 has length as indicated by "L" and width indicated by "W" in FIG. 27. It is contemplated that length "L" of arrangement 52 is considerably greater than width "W" and that arrangement 52 can be processed essentially "continuously" in roll-to-roll fashion in the length "L" direction.

Figure 28:
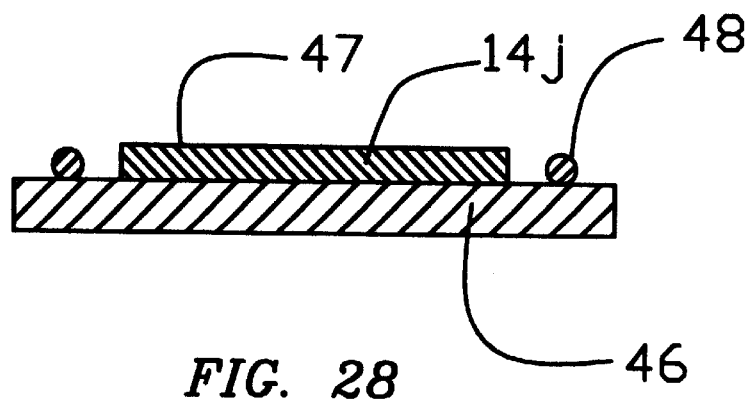
FIG. 28 is a sectional view taken substantially from the perspective of line 28—28 of FIG. 27.

FIG. 28, a sectional view taken substantially from the perspective of line 28—28 of FIG. 27, shows that core support 47 and wires 48 rest on temporary support 46. As will become clear, there should be little or no adhesion between core support web 47 or wires 48 and temporary support web 48 as an eventual process step requires release of web 47 and wires 48 from temporary support 46.

Figure 29:
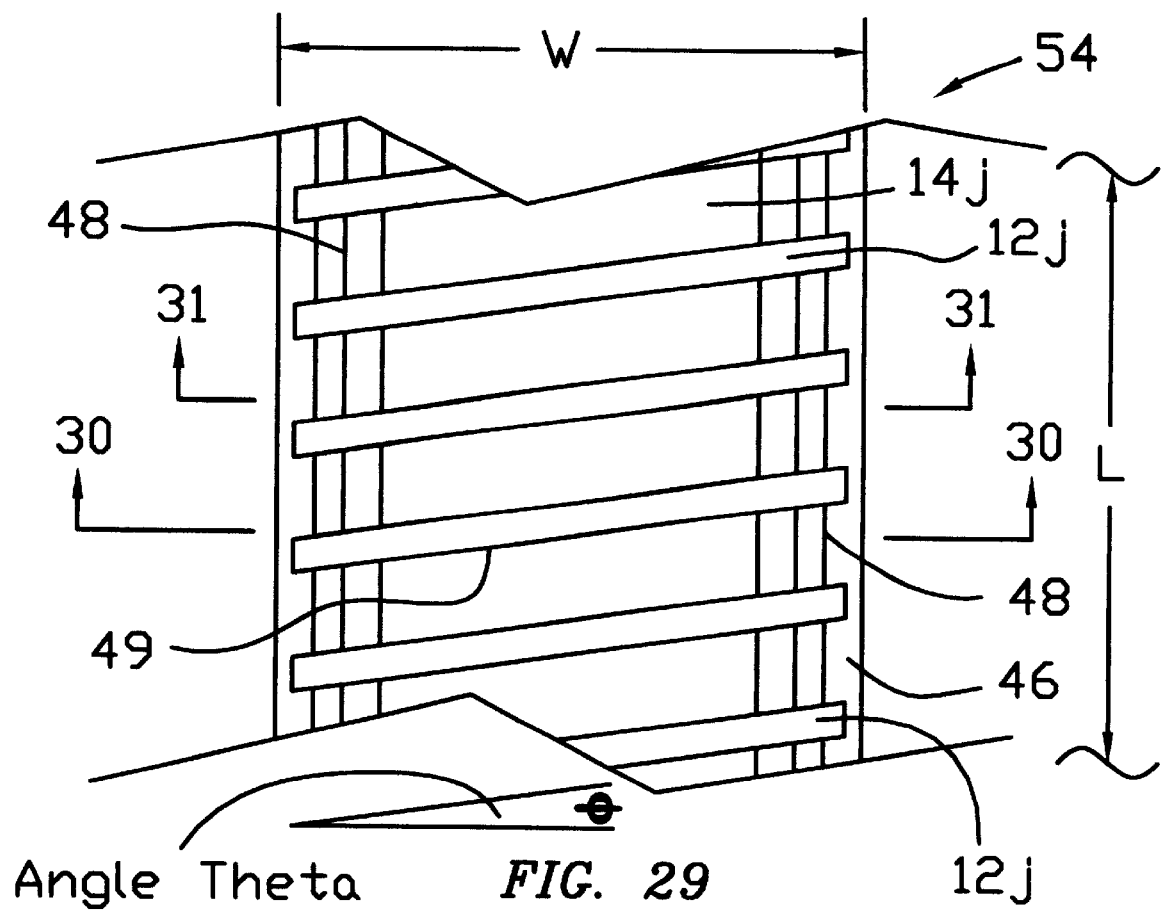
FIG. 29 is a top plan view of the arrangement embodied in FIGS. 27 and 28 following an additional processing step.
Figure 30:
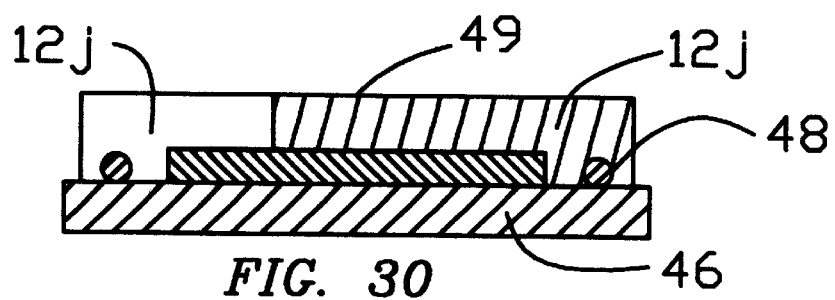
FIG. 30 is a sectional view taken substantially from the perspective of line 30—30 of FIG. 29.
Figure 31:
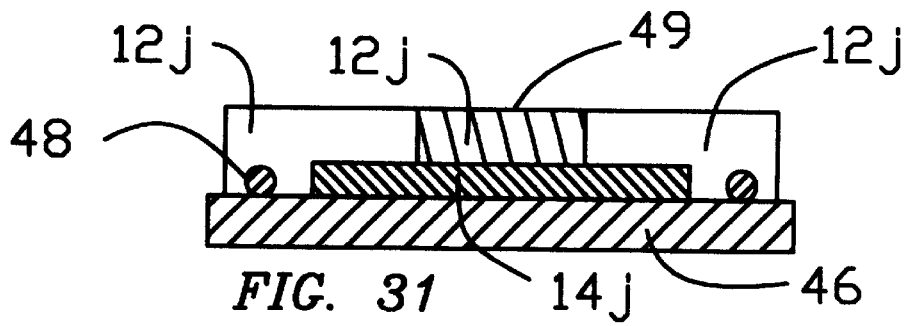
FIG. 31 is a sectional view taken substantially from the perspective of line 31—31 of FIG. 29.

FIG. 29 is a top plan view of the FIG. 27 arrangement after an additional process step. In the FIG. 29 embodiment, indicated by numeral 54, strips 49 of electrically conductive resin 12j have been applied to the top surface of the FIG. 27 arrangement. Strips 49 extend at an angle "theta" with respect to width "W" and extend sufficiently to overlay wires 48. As will become clear in the following, strips 49 define one half of the eventual helical structure. The positioning of strips 49 is further defined by reference to FIGS. 30 and 31. FIGS. 30 and 31 are sectional views taken substantially from the perspective of lines 30—30 and 31—31 of FIG. 29.

It is contemplated that strips 49 can be applied in the applied arrangement shown in FIGS. 29 through 31 using techniques known in the art such as thermoplastic melt extrusion or printing of conductive resin based pastes and inks.

The material used to form the conductive strips 49 can be chosen from any number of conductive resin-based materials. A particularly advantageous material choice would be a DER, although this choice is not required for this embodiment. The linear extent of strips 49 may be limited. In addition, wires 48 supply excellent electrical contact to both ends of strips 49. Thus, as will become clear in the following, the rapid lateral electrodeposit growth associated with DER materials may not be necessary for production of certain coil structures according to the embodiments of FIGS. 27 through 35.

Figure 32:
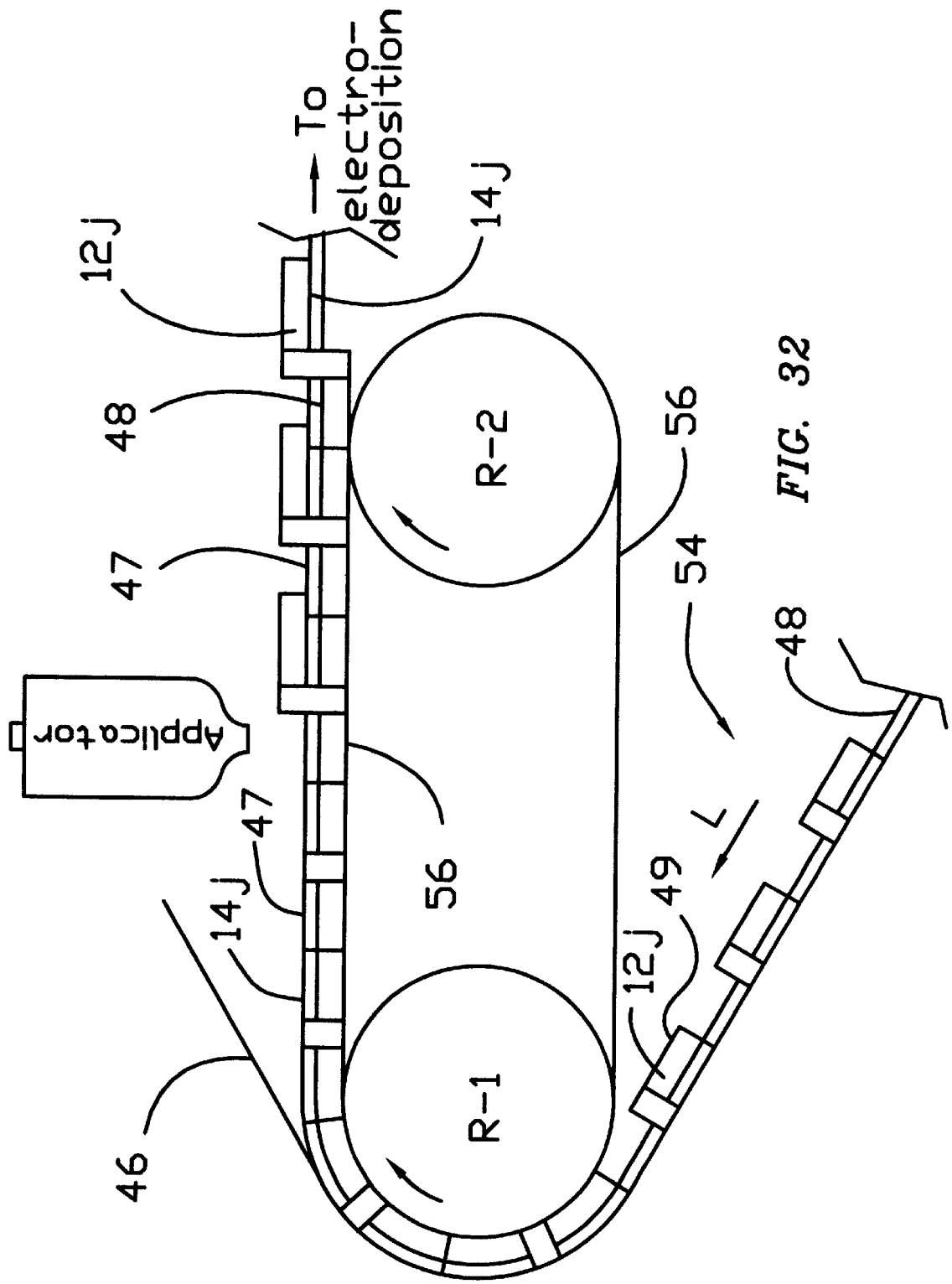
FIG. 32 is a side view illustrating additional processing to the embodiment of FIGS. 29 through 31.

FIG. 32 shows a process wherein the helical coil pattern of conductive resinous material 12j is completed. The structure of FIGS. 29 through 30 is fed to roll R-1. As the structure changes its direction of linear motion as it passes over roll R-1, the temporary support web 46 is removed as shown and the structure is transferred to temporary support belt 56. Temporary support belt travels continuously between rolls R-1 and R-2 as shown. In traversing roll R-1, structure 54 releases its temporary support web 46 and gets "flipped over on its back" onto belt 56.

Figure 33:
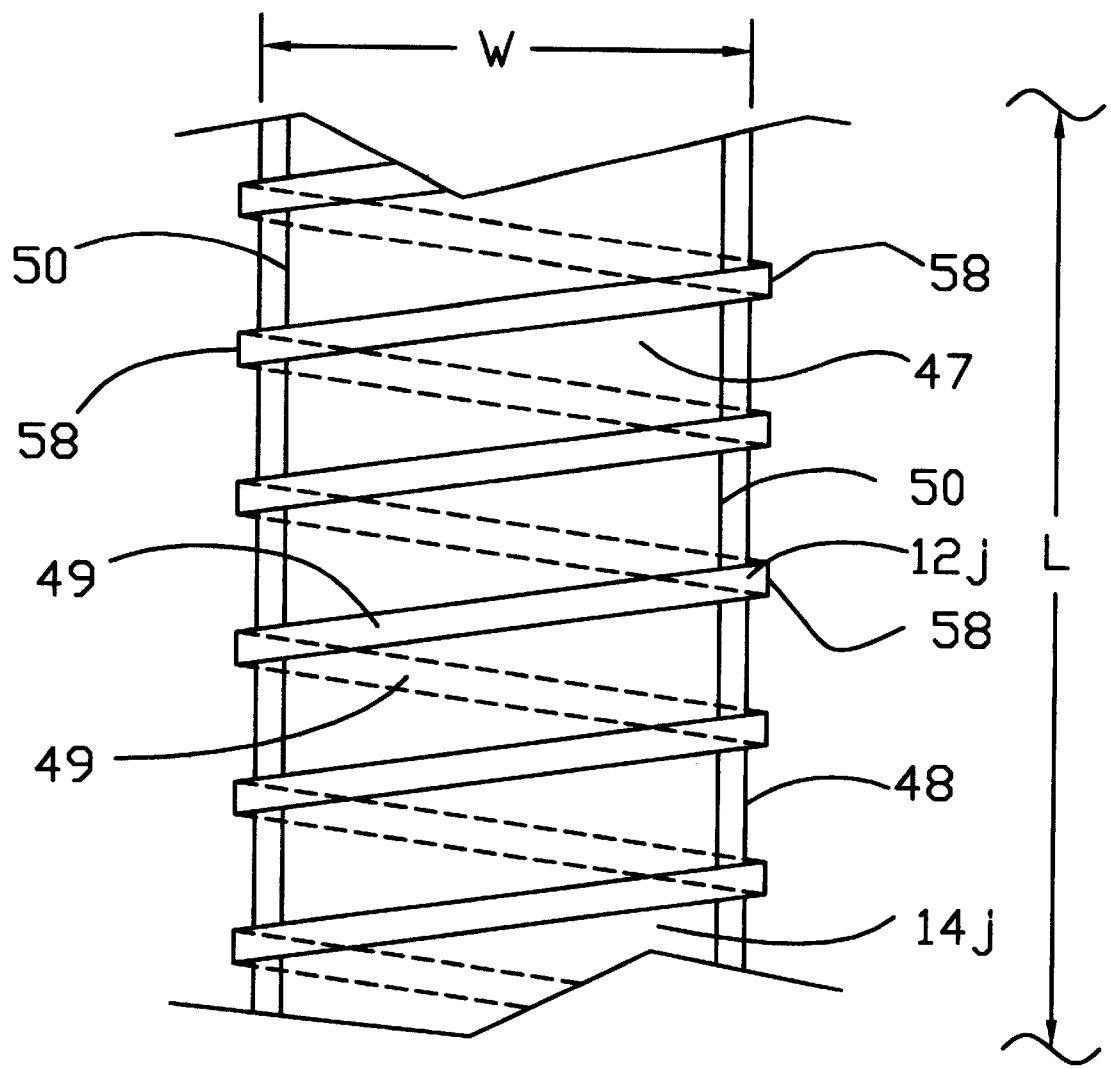
FIG. 33 is a top plan view embodying the structure resulting from the process illustrated in FIG. 32.

The remaining structure passes under an applicator which applies strips of electrically conductive resinous material at essentially the same angle theta to join the opposite ends of linearly sequential strips 49 of the intermediate article illustrated in FIGS. 29 through 31. The result of the process of FIG. 32 is the article shown in plan view in FIG. 33. In FIG. 33, electrically conductive resinous strips 49 extend in a continuous helical path around core web 47. Strips 49 extend sufficiently in the width dimension "W" to enable them to overlay wires 48 at terminal ends of the strips 49.

One will appreciate that structures equivalent to that depicted in FIG. 33 can be produced by other techniques. For example, an alternate process would be to first apply angled conductive resinous strips spanning two wires, the resinous strips and wires all supported by a temporary support. Next, a core support web of width slightly less than the separation of the wires would be applied to overlay and bond to the conductive strips. Next, additional conductive resinous strips would be applied to join opposite ends of the sequentially adjacent, initially applied strips and the temporary support removed. This form of process could of course be accomplished without the change in direction of travel associated with the process depicted in FIG. 32.

Figure 34:
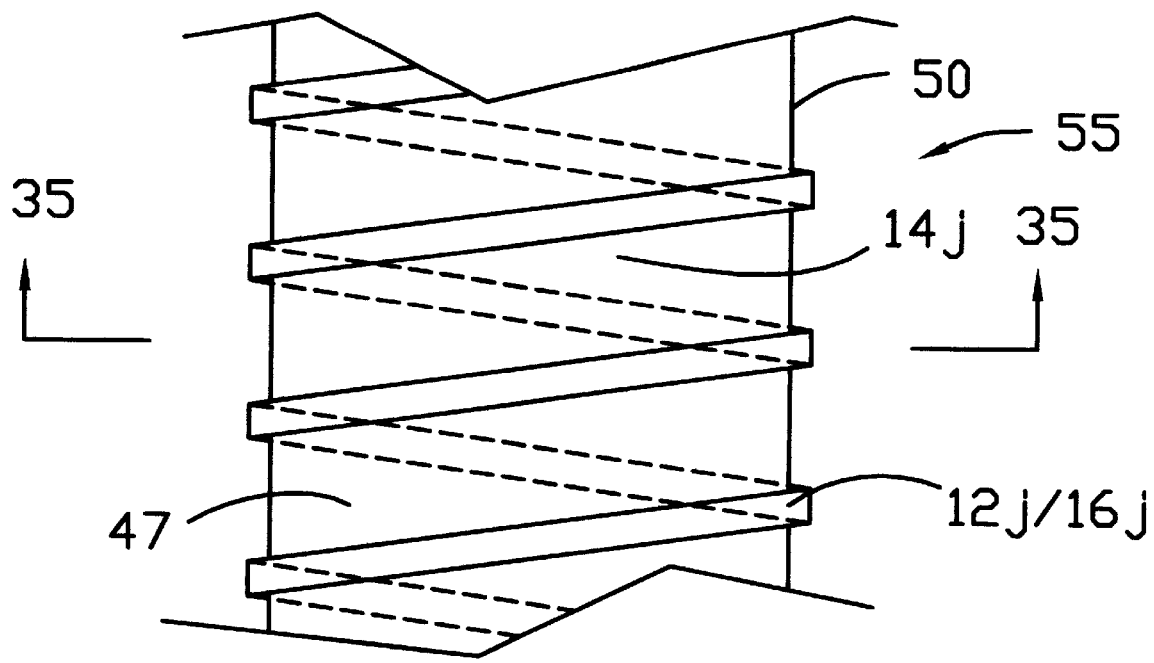
FIG. 34 is a top plan view of the embodiment of FIG. 33 following additional processing steps.
Figure 35:
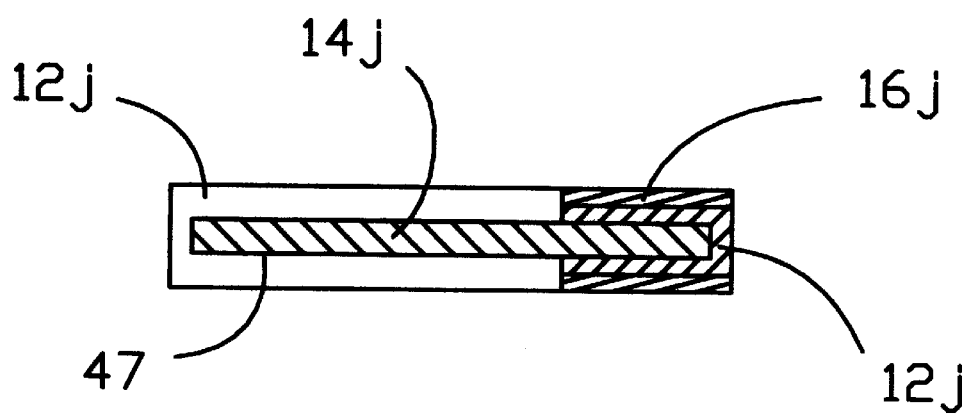
FIG. 35 is a sectional view of the article illustrated in FIG. 34 taken substantially from the perspective of line 35—35 of FIG. 34.

FIG. 34 illustrates the completed low profile helical coil antenna/inductor in plan view. The structure of FIG. 34, indicated by numeral 55, is achieved by first subjecting the article of FIG. 33 to an electrodeposition process, which in a preferred embodiment is conducted "continuously" using wires 48 as "busses" for passage of cathodic current to the strips 49, now comprising electrically conductive resin 12j and electrodeposit 16j. Following this electroplating, a cutting process is used to sever the wires 48. The remaining structure shown in the embodiment of FIG. 34 comprises a continuous electrodeposited metal-based helical structure 16j wrapped around a central supporting core web 47. FIG. 35 is a sectional view of the FIG. 34 structure viewed substantially from the perspective of line 35—35 of FIG. 34. FIG. 35 shows the composite structure of metal-based electrodeposit 16j on electrically conductive polymer 12j supported on core support 47 of insulating material 14j.

In light of the teachings embodied in FIGS. 27 through 35, those skilled in the art will realize the added performance benefits of the FIG. 34 structure possible through selection of appropriate materials to produce core support 47. For example, a choice of polymer-based compound incorporating a magnetic filler would likely alter the transformer characteristics of the structure.

A major contribution of the present invention is the substantial expansion of design options for production of three-dimensional conductive traces and antenna patterns. The limitations of photoetching and masking techniques were made clear in the prior art by Mettler et al. in U.S. Pat. No. 4,985,116. There it was pointed out that a photomask could be readily produced to form a conductive pattern on the head of a mushroom, but that masking to produce patterns on the stem of a mushroom would be far more difficult. Using the same example of a mushroom, the increased design flexibility offered by the present invention will be taught in conjunction with FIGS. 36 through 50.

Figure 36:
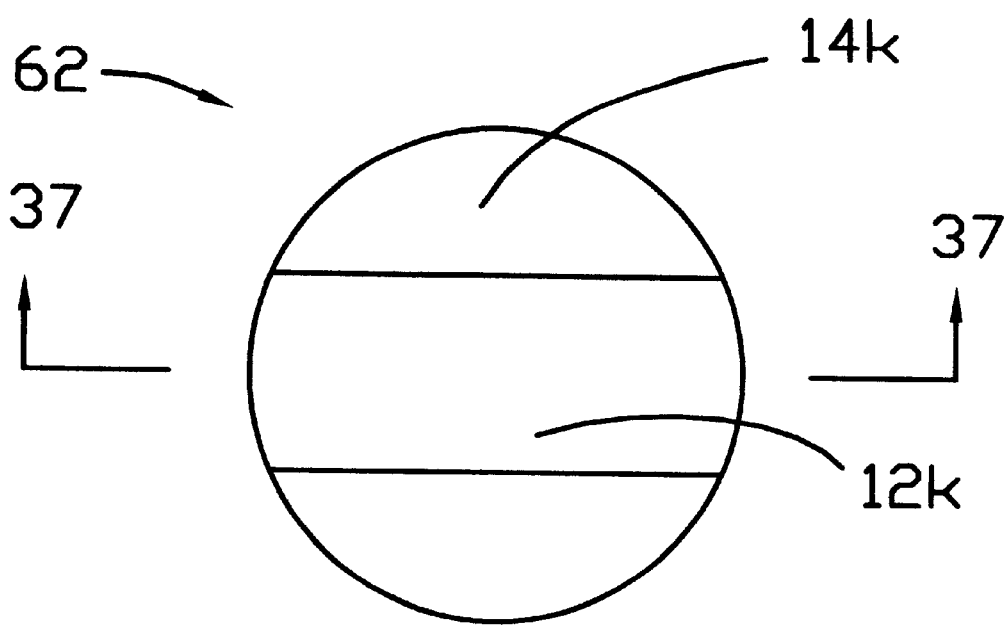
FIG. 36 is a top plan view of an intermediate article in the manufacture of an additional embodiment of the invention.
Figure 37:
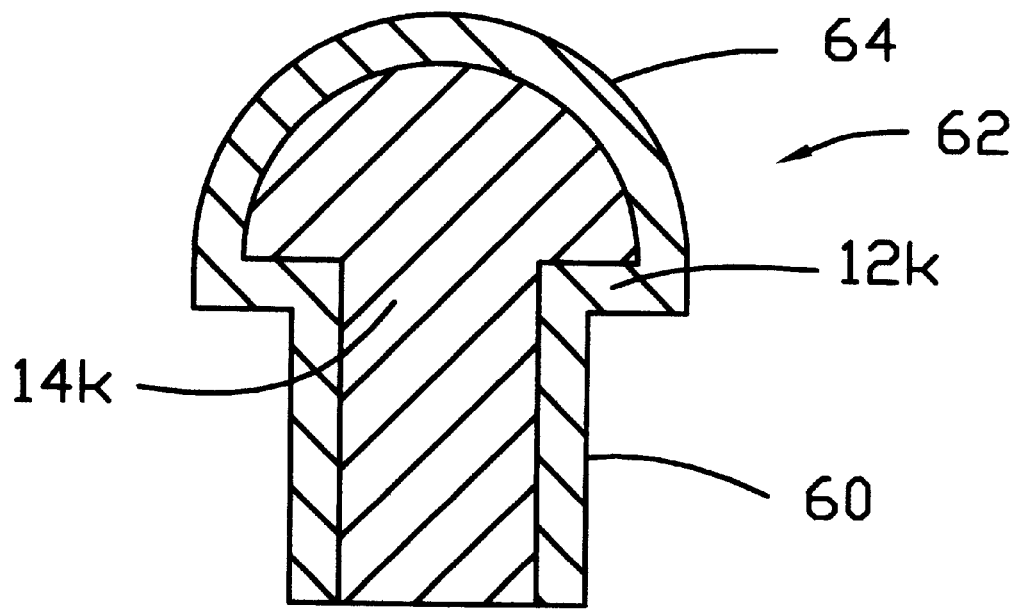
FIG. 37 is a sectional view taken substantially from the perspective of line 37—37 of FIG. 36.

Referring now to FIG. 36, there is shown a top plan view of an article, generally referred to as 62. Article 62 comprises electrically insulating portion 14k and DER portion 12k. FIG. 37, a sectional view taken substantially from the perspective of line 37—37 of FIG. 36, shows article 62 to have a mushroom shape. DER material 12k has the form of a strip extending up the sides of the stem 60 of mushroom shaped article 62, then over the head 64 and then back down the opposite side of mushroom shaped article 62. Article 62 can be readily produced by known two shot molding techniques.

Figure 38:
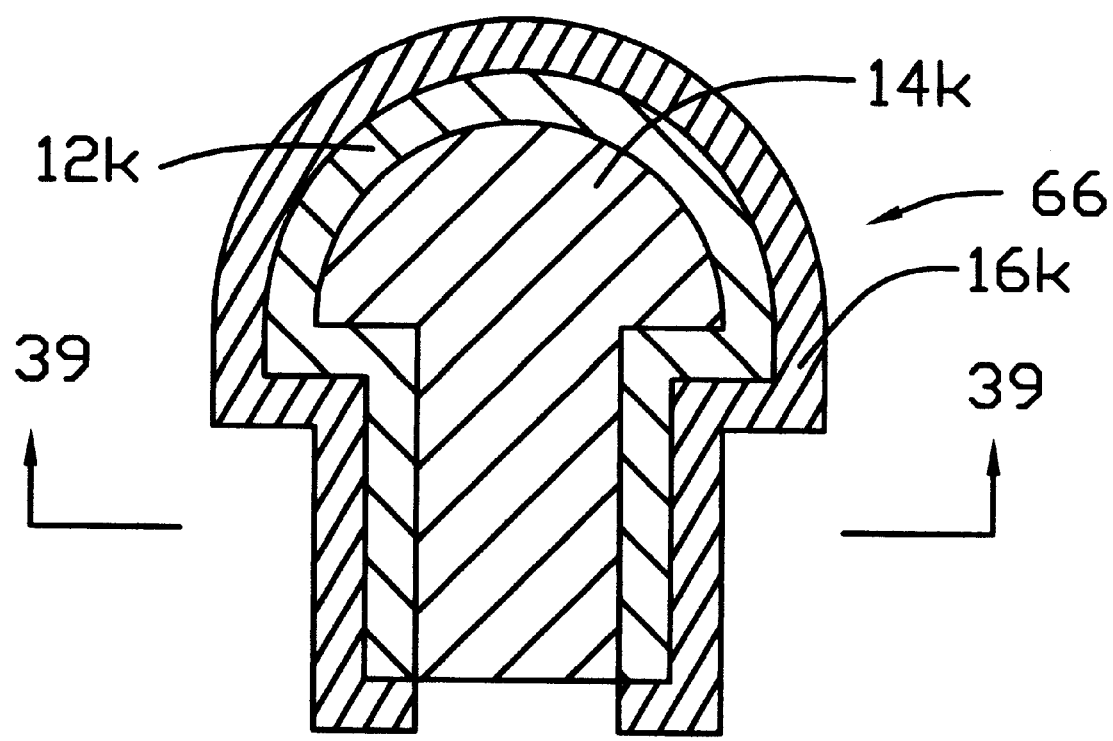
FIG. 38 is a sectional view of the article embodied in FIGS. 36 and 37 following additional processing.
Figure 39:
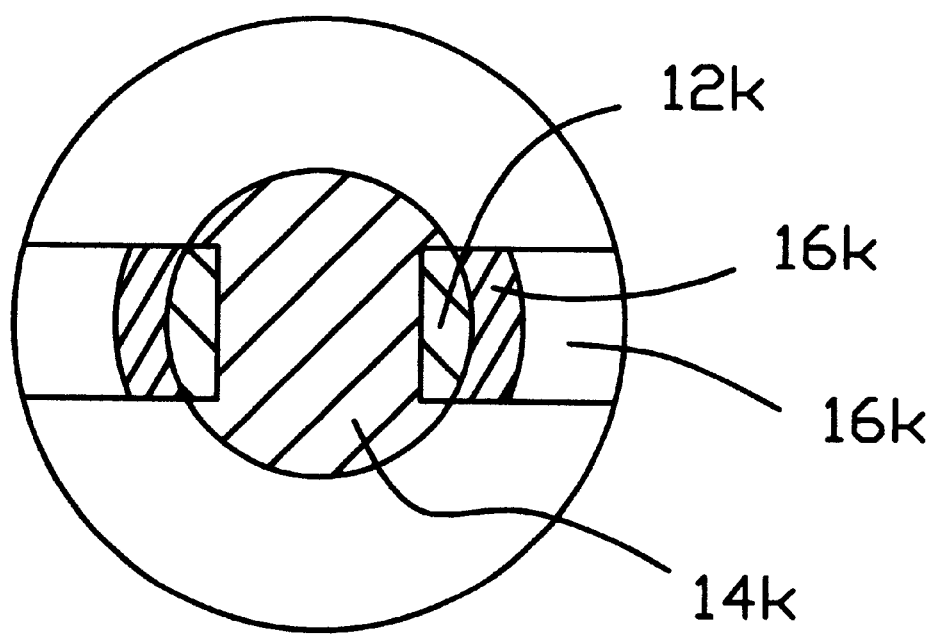
FIG. 39 is a sectional view taken substantially from the perspective of line 39—39 of FIG. 38.

FIGS. 38 and 39 illustrate the article 62 of FIGS. 36 and 37 following an additional processing step of electroplating the DER material 12k. Electrodeposited metal-based material 16k extends up, over and back down the opposite side of the mushroom shaped article, now identified as 66 to indicate this additional process step. FIG. 39 is a sectional view of article 66 from the perspective of line 39—39 of FIG. 38. Those skilled in the art will quickly recognize that production of a highly conductive trace such as that shown in FIGS. 38 and 39 would be very difficult using conventional photomask and etching techniques available to the art and that more complicated three dimensional conductive traces could be indeed impossible to produce using photomask/etching techniques.

The embodiment of FIGS. 36 through 39 illustrate material 14k as a solid insulating support for DER material 12k (and subsequent electrodeposit 16k). In some cases it may be advantageous to consider a hollow structure. This could specifically be advantageous in the case of antenna design, wherein air could be considered as a dielectric.

Hollow structures can be readily produced using the teachings of the present invention. Hollow structures comprising selective patterns of metal-based materials are taught in the following in conjunction with FIGS. 40 through 50. The "mushroom shape" format will be used in conjunction with FIGS. 40 through 50.

Figure 40:
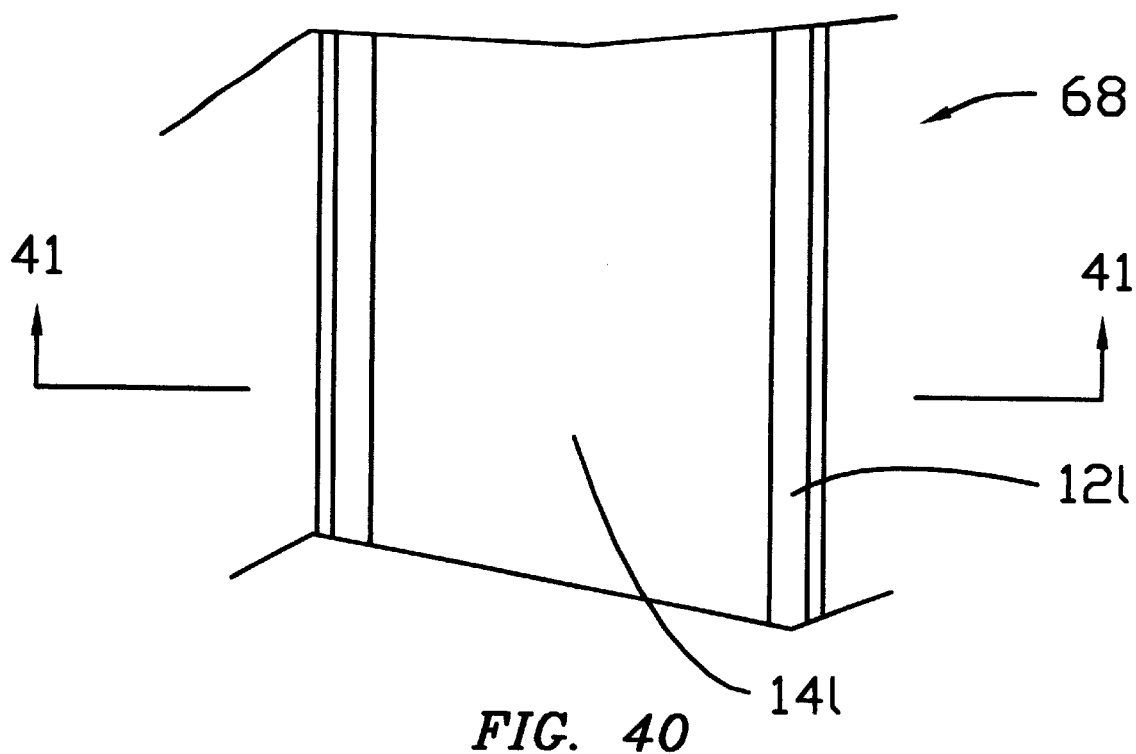
FIG. 40 is a vertical plan view of an intermediate article in production of yet another embodiment of the invention.
Figure 41:
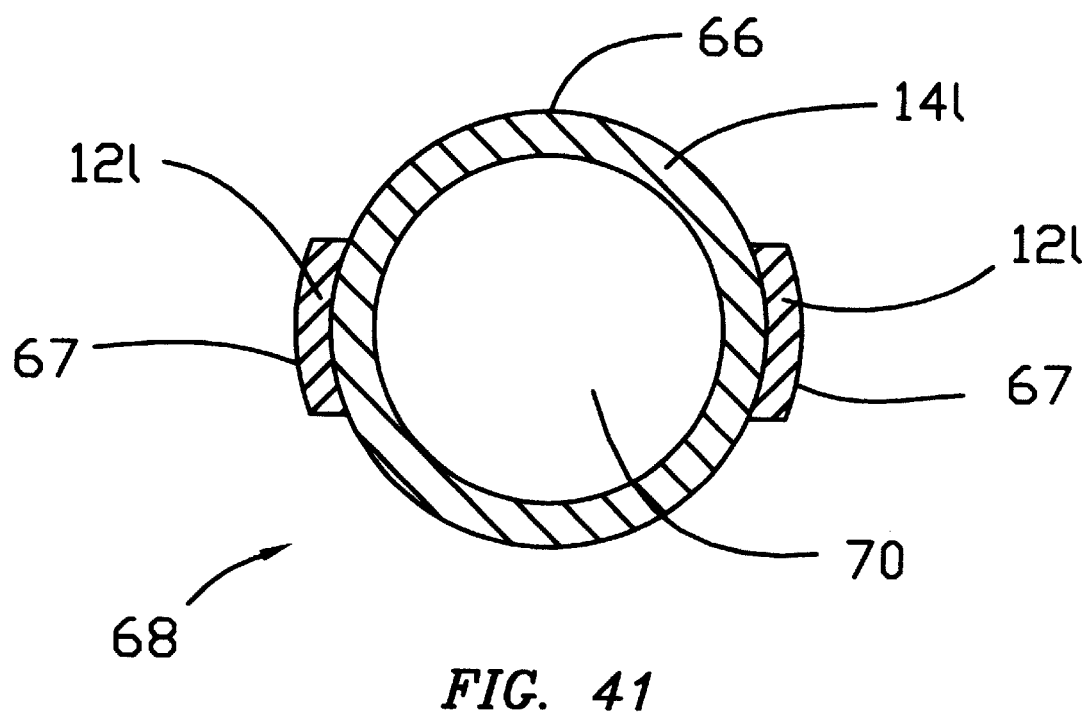
FIG. 41 is a sectional view taken substantially from the perspective of line 41—41 of FIG. 40.

Referring now to FIG. 40, there is shown in vertical plan view a structure 68 commonly referred to in the plastics processing art as a parison. A parison is a hollow structure, often tubular in cross section, comprised of molten or semi-molten polymeric material. A parison is normally produced by extrusion of thermoplastic through a forming die. FIG. 41 is a sectional view of the parison depicted in FIG. 40 taken substantially from the perspective of line 41—41 of FIG. 40. Combining the views of FIGS. 40 and 41 it is seen that the parison, generally identified by numeral 68, comprises a hollow tube 66 of insulating resin 141 surrounding gaseous space 70. Space 70 most often comprises air. Stripes 67 of electrically conductive resin 121 have been applied to opposite sides of hollow tube 66. Stripes 67 are conveniently applied by simultaneous coextrusion during formation of parison 68, as those knowledgeable in the art will understand. As will become clear in the following, a particularly advantageous choice of material 121 for stripes 67 is a DER.

Figure 42:
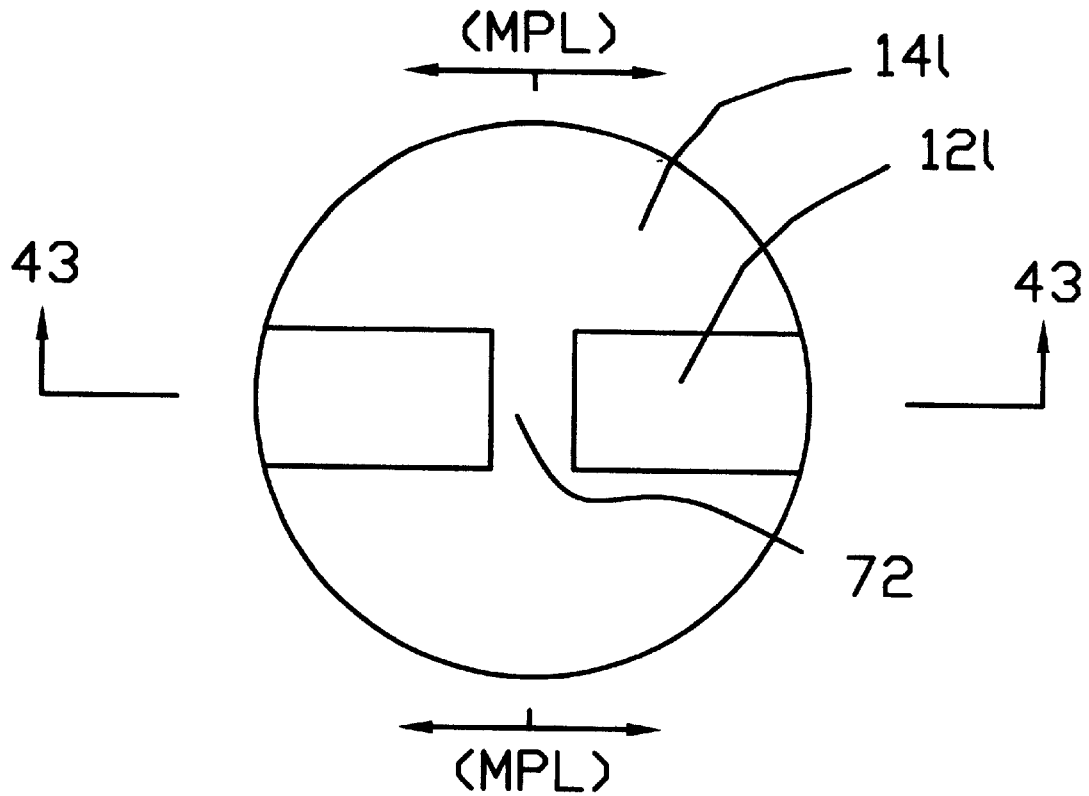
FIG. 42 is a top plan view of the intermediate article embodied in FIGS. 40 and 41 following additional processing steps.
Figure 43:
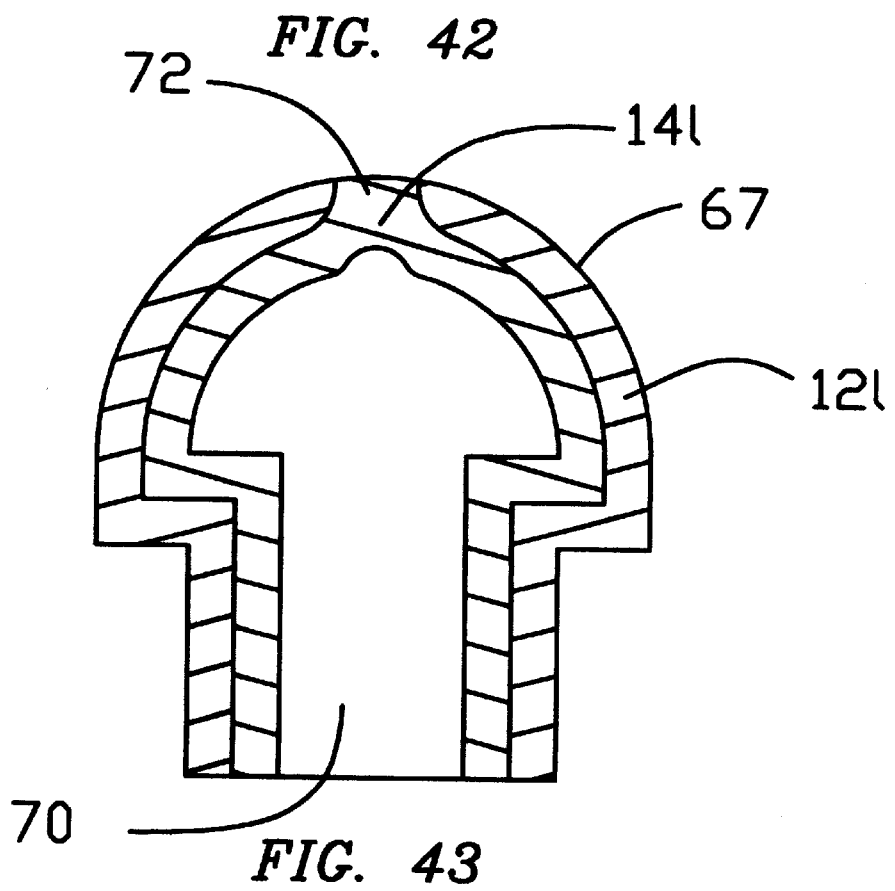
FIG. 43 is a sectional view taken substantially from the perspective of line 43—43 of FIG. 42.

FIGS. 42 and 43 illustrate the structure following additional processing steps. The article of FIGS. 42 and 43 is produced by first bringing the two "halves" of a blow mold (not shown) together to pinch off opposite ends of the parison and then pressurized gas, usually air, is injected into the remaining hollow space between the pinch points to force the molten plastic parison against the interior walls of the mold. Excess material is then trimmed to give the article as depicted and embodied in FIGS. 42 and 43.

In the embodiment of FIGS. 42 and 43, the mold travel during opening and closing is to the left and right, as indicated by "MPL" (Mold Parting Line) in FIG. 42. This gives rise to a separation, indicated as 72 in the FIGS. 42 and 43, between conductive resin stripes 67 positioned on the left and right portions of the blow molded article. This separation is formed as follows. When the mold initially closes on the parison, the inner insulating material 141 on opposite sides of the tubular parison 68 are first pinched together, preventing the material 121 forming stripes 67 on opposite sides of the parison 68 from contacting. After blowing and trimming of excess material, a gap 72 between the oppositely disposed stripes 67 remains.

Figure 44:
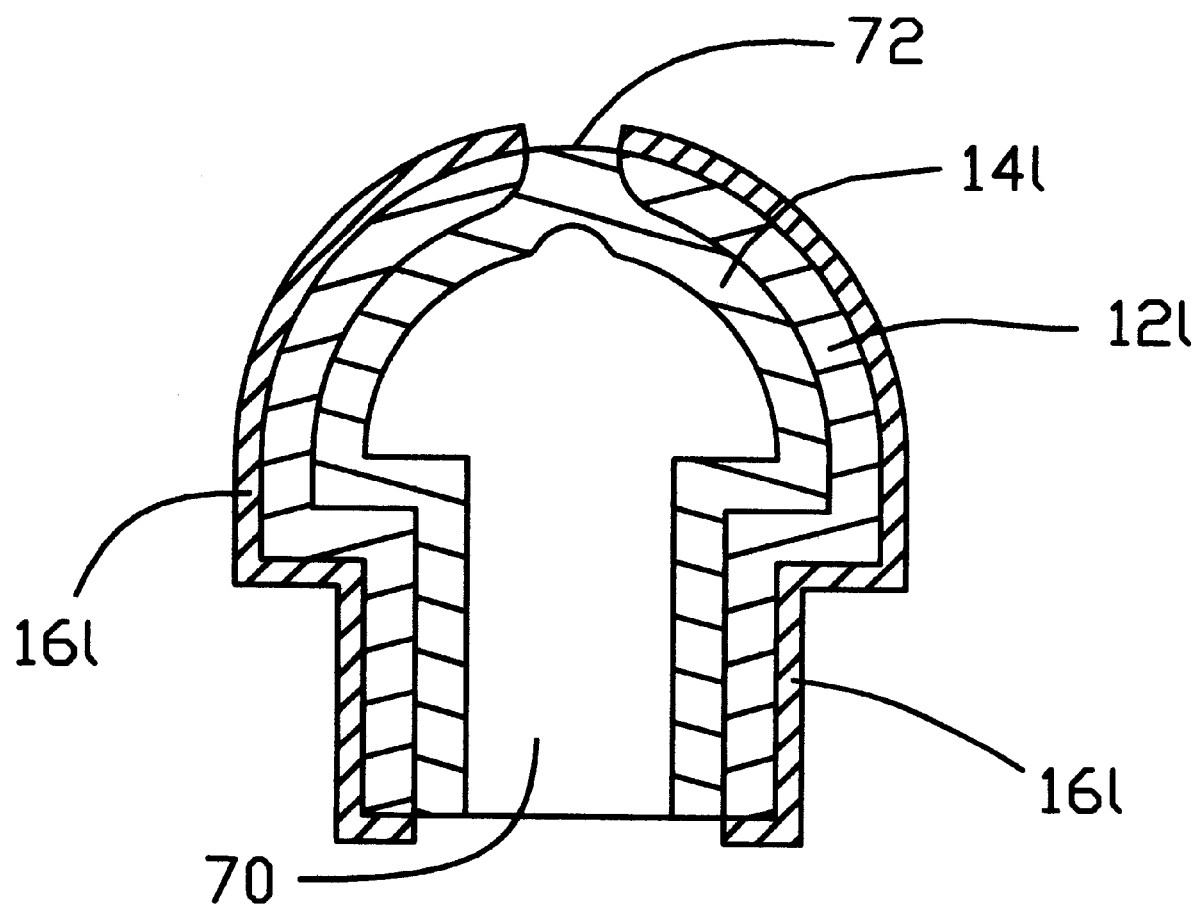
FIG. 44 is a sectional view, similar to FIG. 43, of the article embodied in FIGS. 42 and 43 following additional processing.

FIG. 44 is a sectional view similar to FIG. 43 after an additional optional process step. In FIG. 44, electrodeposited metal-based material 161 has been deposited onto electrically conductive resin 121 resulting in oppositely disposed, highly conductive strips of material positioned on a hollow, insulating, three-dimensional structure defined by material 141. As in other embodiments of the current invention, the electrodeposition step is normally facilitated by choice of a DER for material 121, although this is not an absolute requirement to produce the hollow, conductively patterned structures embodied in FIGS. 40 through 44.

In some cases it may be desirable or necessary to establish continuity of the conductive pattern across the parting line of an extrusion blow molded article. Methods and structure for establishing such continuity are taught below in conjunction with FIGS. 45 through 50.

Figure 45:
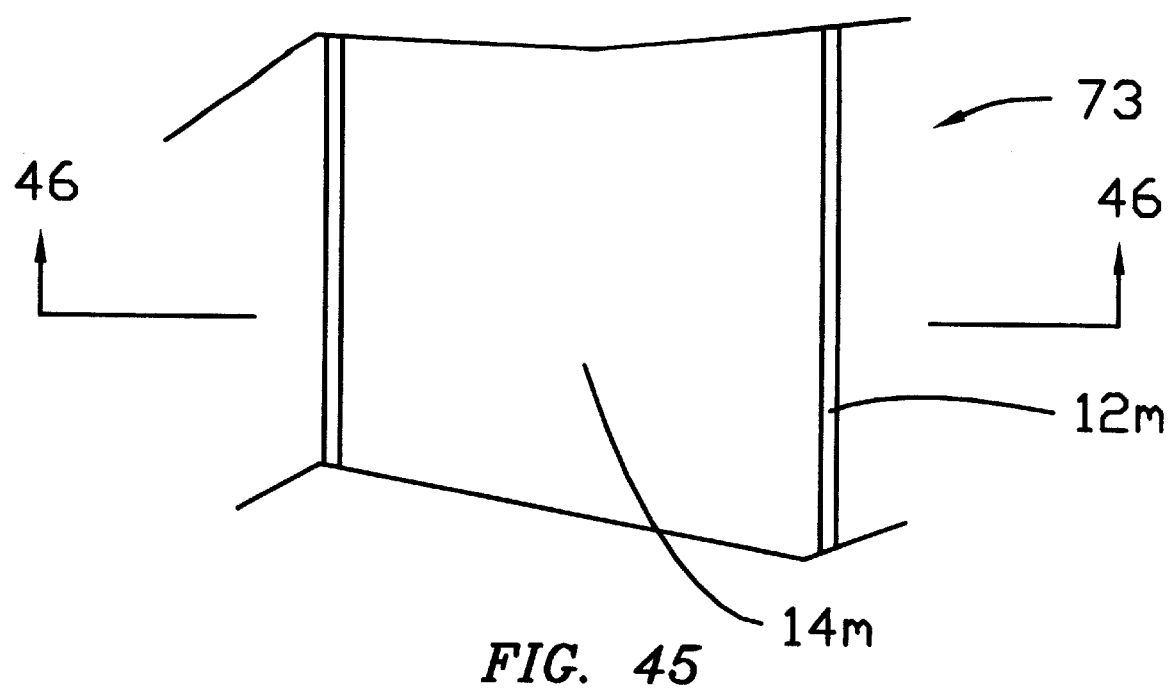
FIG. 45 is a vertical plan view of an intermediate article in production of yet another embodiment of the invention.
Figure 46:
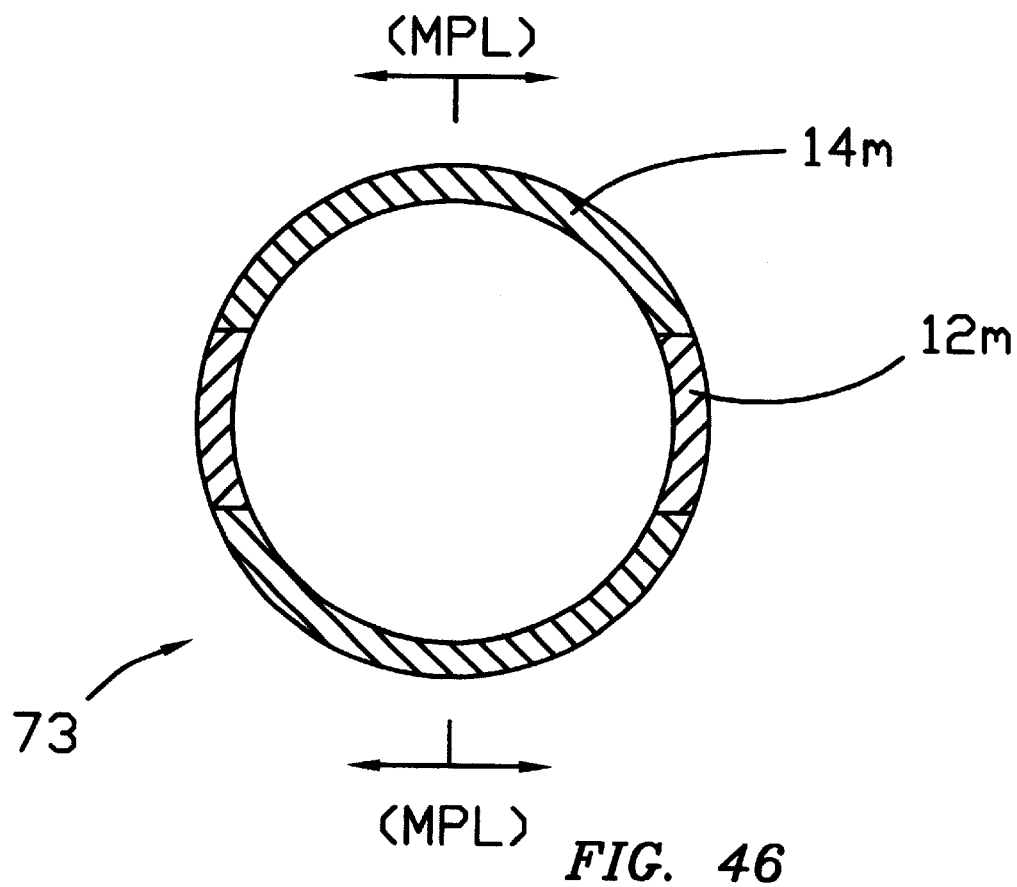
FIG. 46 is a sectional view taken substantially from the perspective of line 46—46 of FIG. 45.

FIG. 45 is a vertical plan view of a parison comprising electrically insulating material 14m and electrically conductive resin 12m. FIG. 46 is a sectional view taken substantially from the perspective of line 46—46 of FIG. 45. In contrast to the parison embodied in FIGS. 40 and 41, the conductive material 12m of the FIGS. 45 and 46 embodiment extends through the annular wall of the cylindrical parison 73 shown. The parison structure of FIGS. 45 and 46 can be achieved by well established techniques such as those used to produce transparent, level indicating "view stripes" commonly present on liquid detergent and oil bottles.

Figure 47:
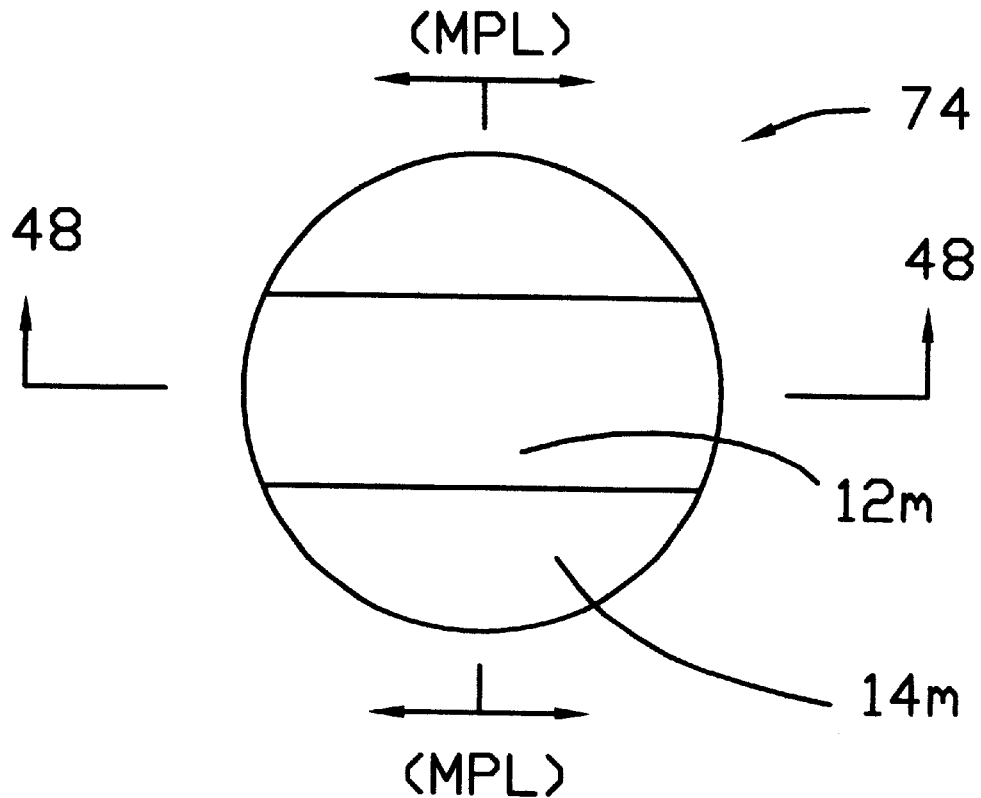
FIG. 47 is a top plan view of the intermediate article embodied in FIGS. 45 and 46 following additional processing steps.
Figure 48:
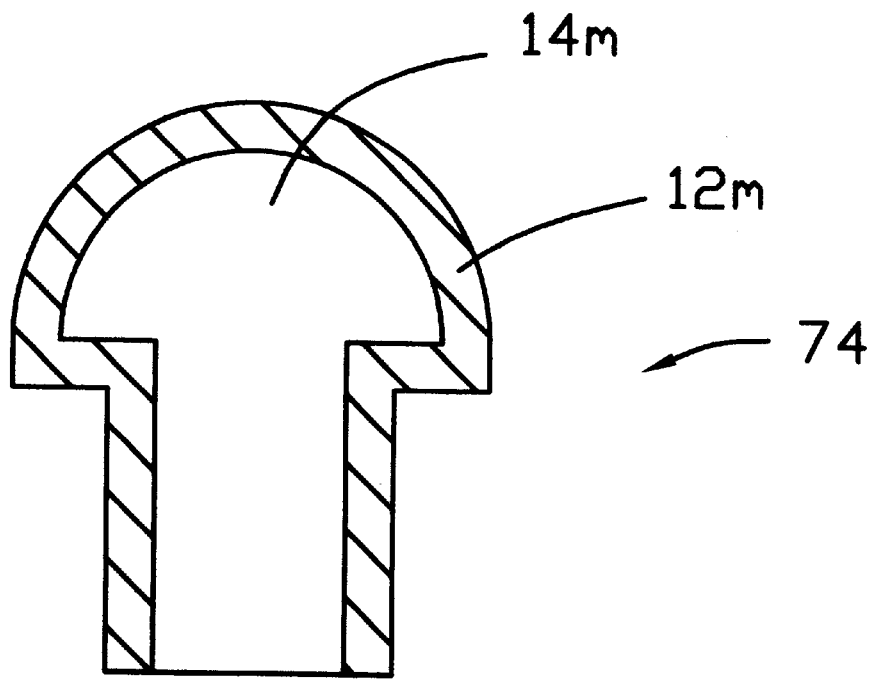
FIG. 48 is a sectional view taken substantially from the perspective of line 48—48 of FIG. 47.

When the blow mold is closed onto the parison of FIGS. 45 and 46 in the direction indicated by "MPL", material 12m on opposite sides of the parison is pinched together. Blowing pressurized gas into the cavity of the pinched parison expands the resin against the inner surfaces of the mold. After trimming of excess material, a patterned hollow part, indicated as 74 and embodied in FIGS. 47 and 48 results. FIGS. 47 and 48 continue to employ the mushroom shape to assist teaching the present invention, but such a shape is clearly not necessary to carry out the teachings of the invention. In the FIGS. 47 and 48, it is seen that stripe of material 12m extends continuously over the mold parting line while insulating material 14m completes the hollow, mushroom shaped article.

Figure 49:
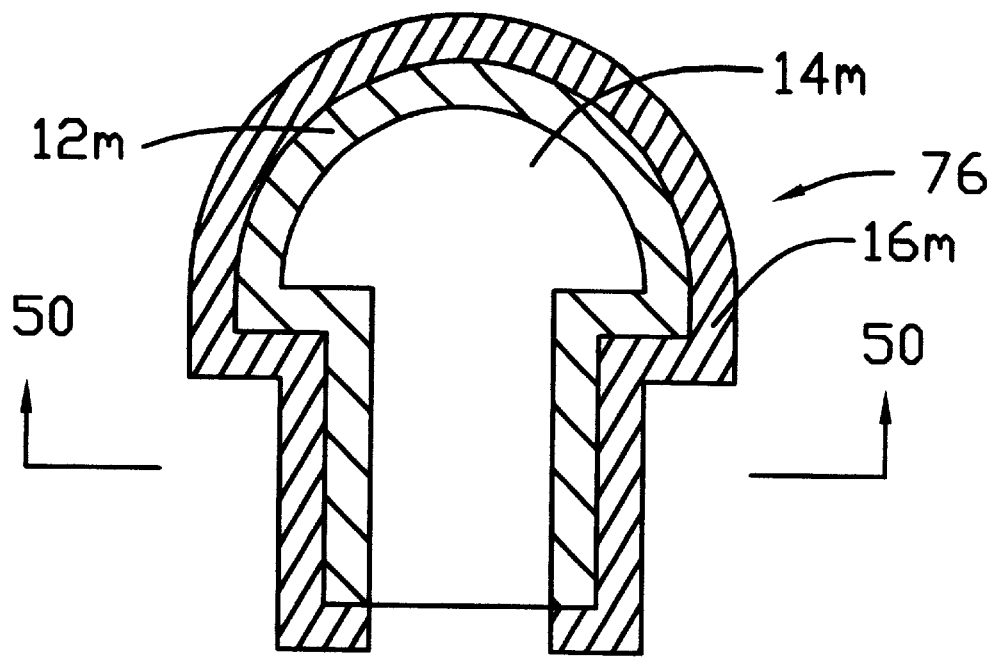
FIG. 49 is a sectional view similar to FIG. 48 of the article embodied in FIGS. 47 and 48 following additional processing steps.
Figure 50:
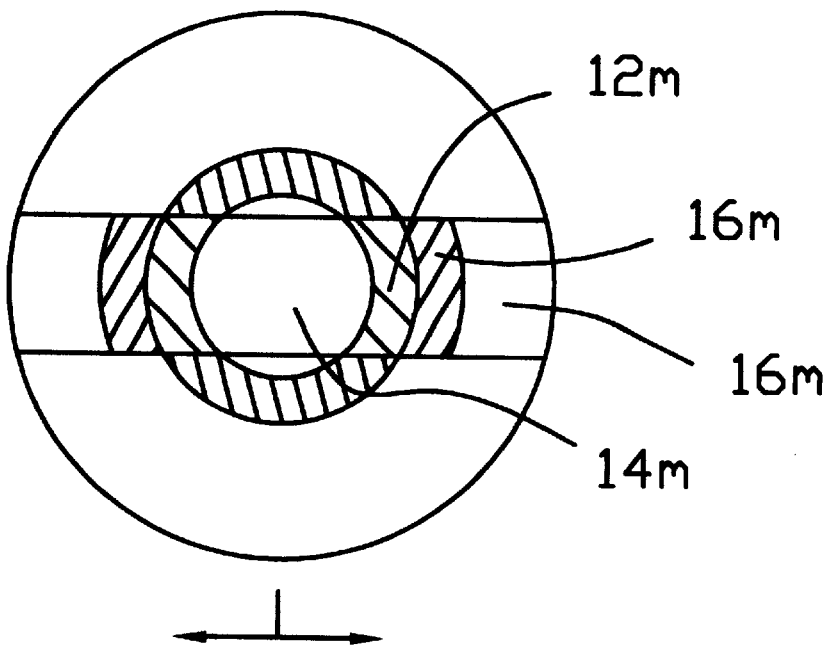
FIG. 50 is a sectional view taken substantially from the perspective of line 50—50 of FIG. 49.

FIGS. 49 and 50 embody an article 76 following an additional optional processing step using the article 74 embodied in FIGS. 47 and 48. FIG. 49 is a vertical sectional view similar to FIG. 48 while FIG. 50 is a sectional view taken substantially from the perspective of line 50—50 of FIG. 49. In FIGS. 49 and 50, highly conductive metal-based material 16m has been electrodeposited onto the surface of conductive material 12m.

Electrodeposit 16m extends continuously up one side of article 76, over its top and then down the opposite side.

Figure 51:
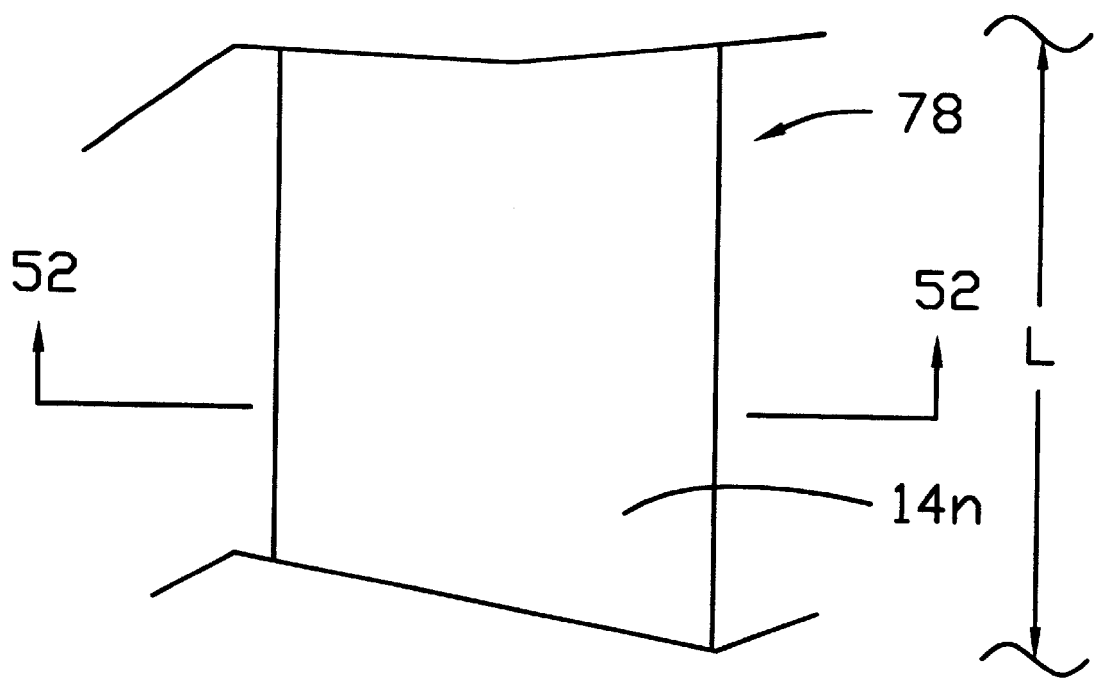
FIG. 51 is a vertical plan view of an intermediate article in the manufacture of yet another embodiment of the current invention.
Figure 52:
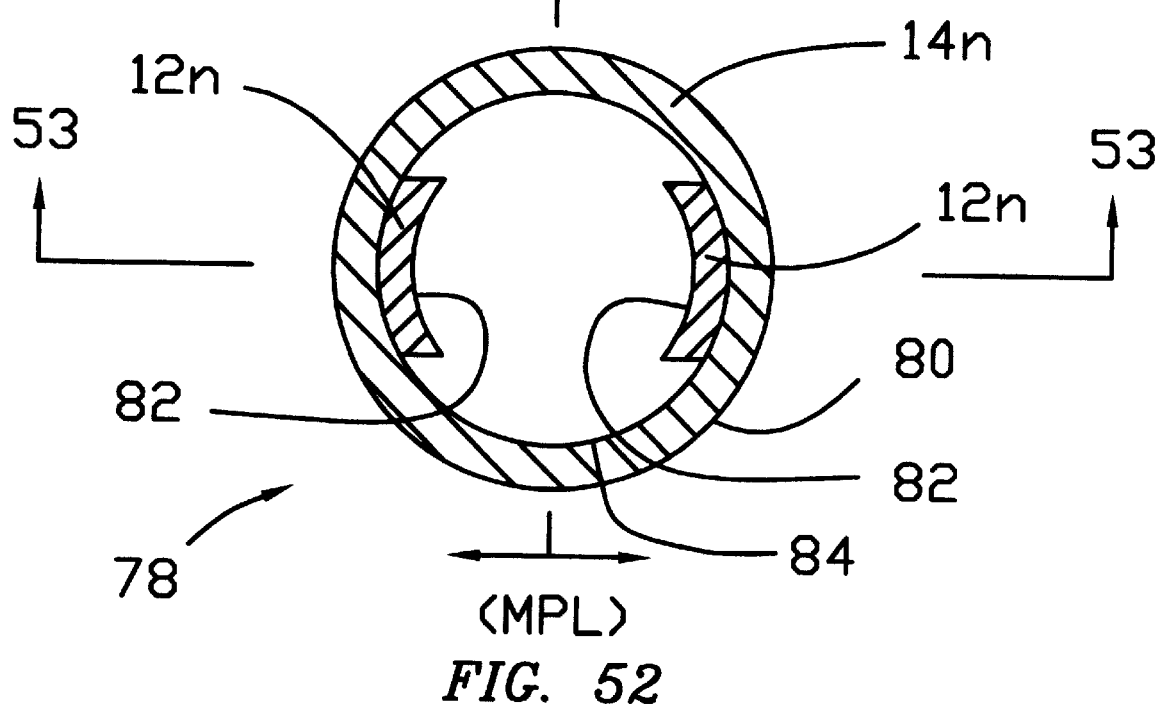
FIG. 52 is a sectional view taken substantially from the perspective of line 52—52 of FIG. 51.
Figure 53:
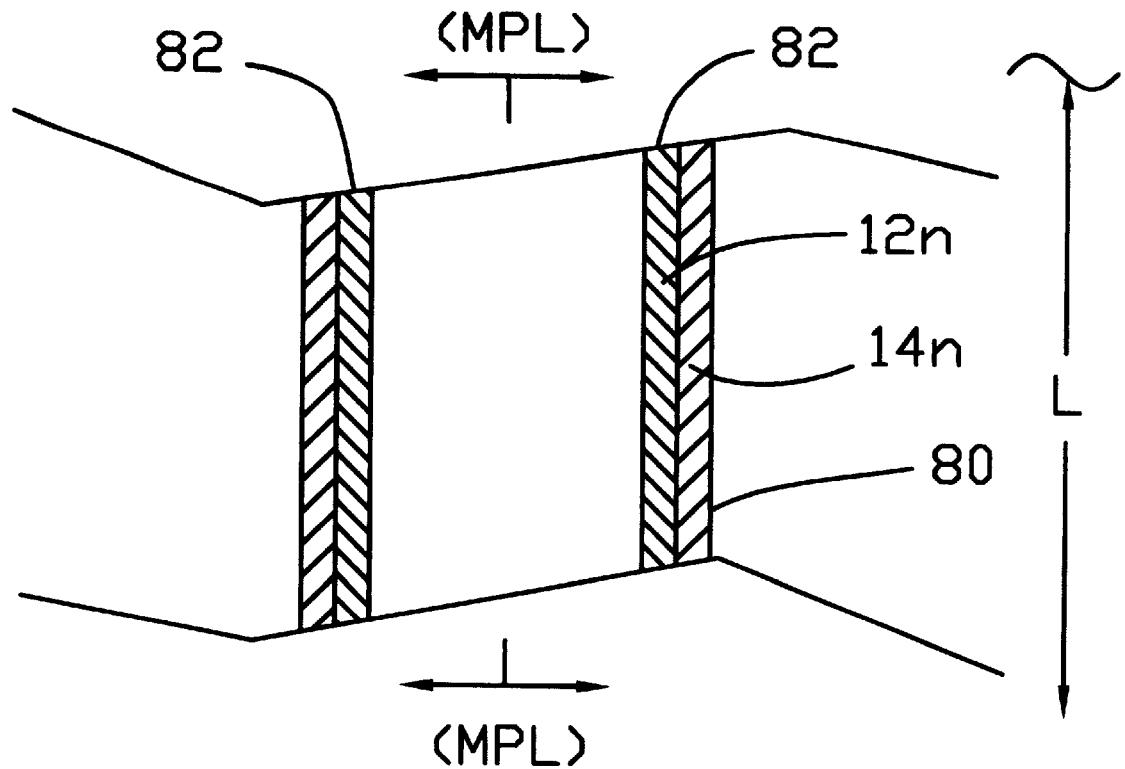
FIG. 53 is a sectional view taken substantially from the perspective of line 53—53 of FIG. 52.

Referring now to FIGS. 51 through 56, structure and methods will be taught for producing a highly conductive pattern on the inside of a hollow article. FIG. 51 is a vertical plan view of a parison, indicated as 78, while FIG. 52 is a view taken substantially from the perspective of line 52—52 of FIG. 51. From FIGS. 51 and 52, it is seen that parison 78 comprises a cylindrical ring 80 of insulating material 14n with stripes 82 of electrically condutive resin 12n positioned on opposite sides of the interior surface 84 of cylinder 80. This structural parison arrangement can be produced by know coextrusion techniques. "L" in FIG. 51 indicates the axial direction of cylindrical parison 78. FIG. 53, a sectional view taken substantially from the perspective of line 53—53 of FIG. 52, shows material stripe 82 to extend in the axial direction "L".

Figure 54:
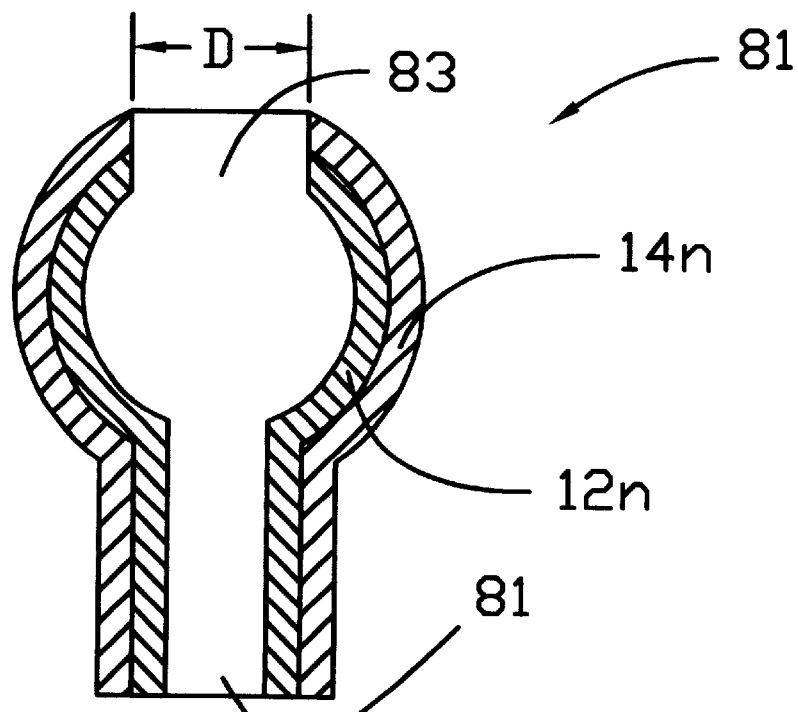
FIG. 54 is a sectional view of the intermediate article embodied in FIGS. 51 through 53 following additional processing steps.

FIG. 54 is a sectional view of a structure 81 produced by additional processing of the parison 78 embodied in FIGS. 51 through 53. The structure embodied in FIG. 54 is produced by first closing the blow mold in the direction "MPL" indicated in FIGS. 52 and 53 to pinch the parison. Pressurized gas is then injected into the cavity of the pinched parison to expand the parison to conform to the inner surface of the blow mold. The resulting object is then trimmed at each end to produce the openings identified as 81 and 83 in the FIG. 54 embodiment. Openings 83 is shown as circular of diameter "D".

Figure 55:
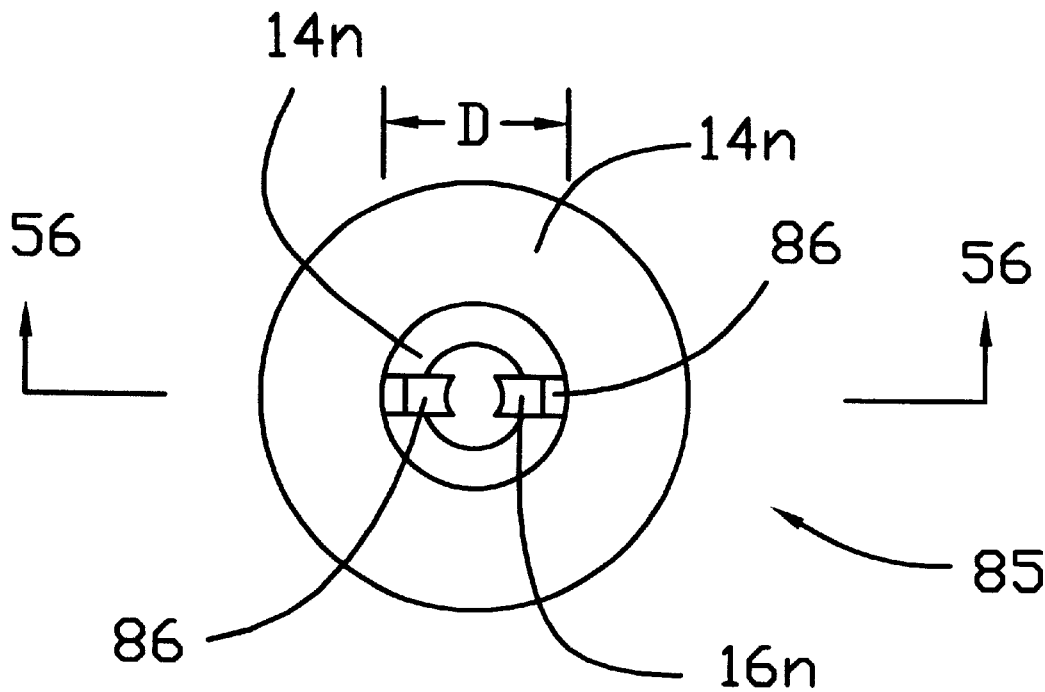
FIG. 55 is a top plan view of the article embodied in FIG. 54 following additional processing steps.
Figure 56:
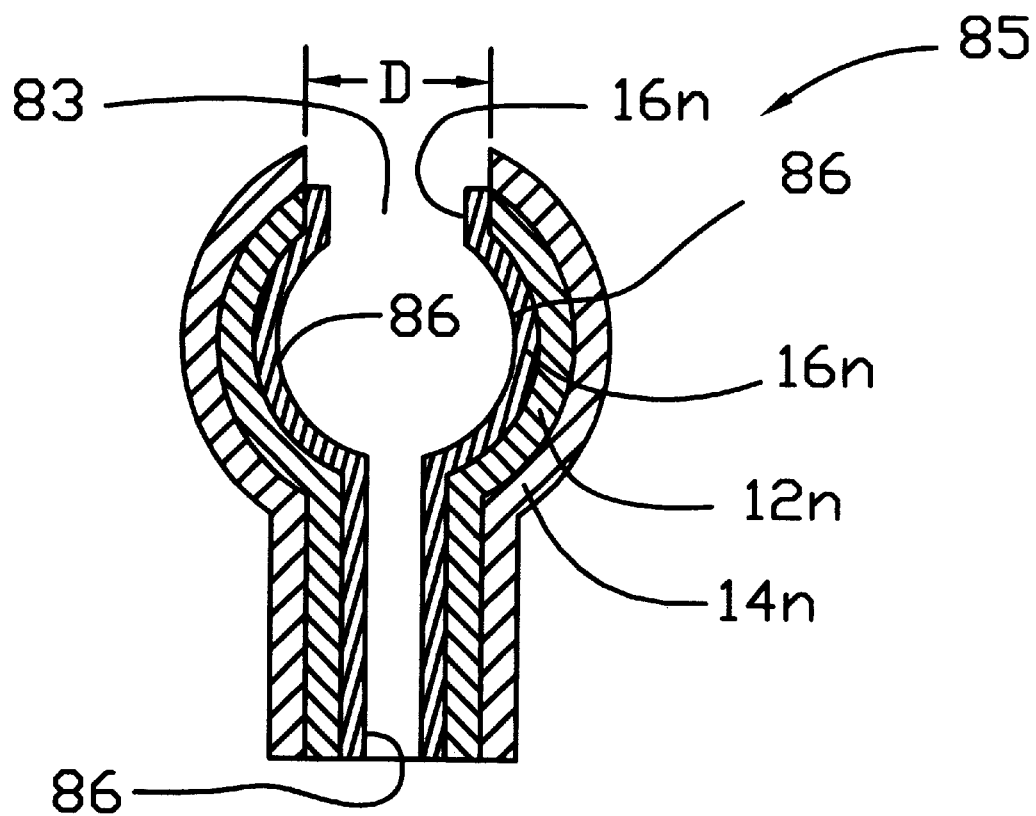
FIG. 56 is a sectional view taken substantially from the perspective of line 56—56 of FIG. 55.

FIGS. 55 and 56 show the article of FIG. 54 following an additional processing step. The structure shown in FIGS. 55 and 56 is now indicated as 85 to reflect this additional processing. Structure 85 includes highly conductive metal-based electrodeposited material 16n positioned on opposite inner wall of the hollow structure in the form of oppositely disposed strips 86.

Those skilled in the art will recognize that electrodeposition of material 16n onto internal stripes 86 of FIGS. 55 and 56 may be facilitated by use of an ausiliary anode. One also appreciates that selective metal placement on the interior surfaces of a hollow article would be difficult, if not impossible, using conventional photoetching techniques.

In the embodiments of hollow structures taught above, a process know in the art as extrusion blow molding has been embodied to produce the initial intermediate articles of manufacture comprising electrically conductive resin and insulating resin. It is understood that alternate manufacturing techniques can be employed. For example, the well-known process of injection blow molding can be considered. In this process, a "preform" is first produced by injection molding. A two-component injection molding, combining conductive resin and insulating resin, can be used to produce the preform. This "preform" is subsequently blown with pressurized gas to the expanded hollow article. Since the originally injection molded "preform" can have very good line definition, the pattern definition of conductive material combined with insulating material associated with the eventual blow molded article can be expected to be improved compared to the extrusion blow molded articles.

In the hollow structures taught in conjunction with the FIGS. 40 through 56, a number of electrically conductive resin formulations can be considered for material 121, 12m, or 12n. However, if the conductive resin is to be electroplated to achieve high conductivity surface patterns on these hollow articles, it is understood that a preferred choice for the materials 121, 12m or 12n is a DER.

Figure 57:
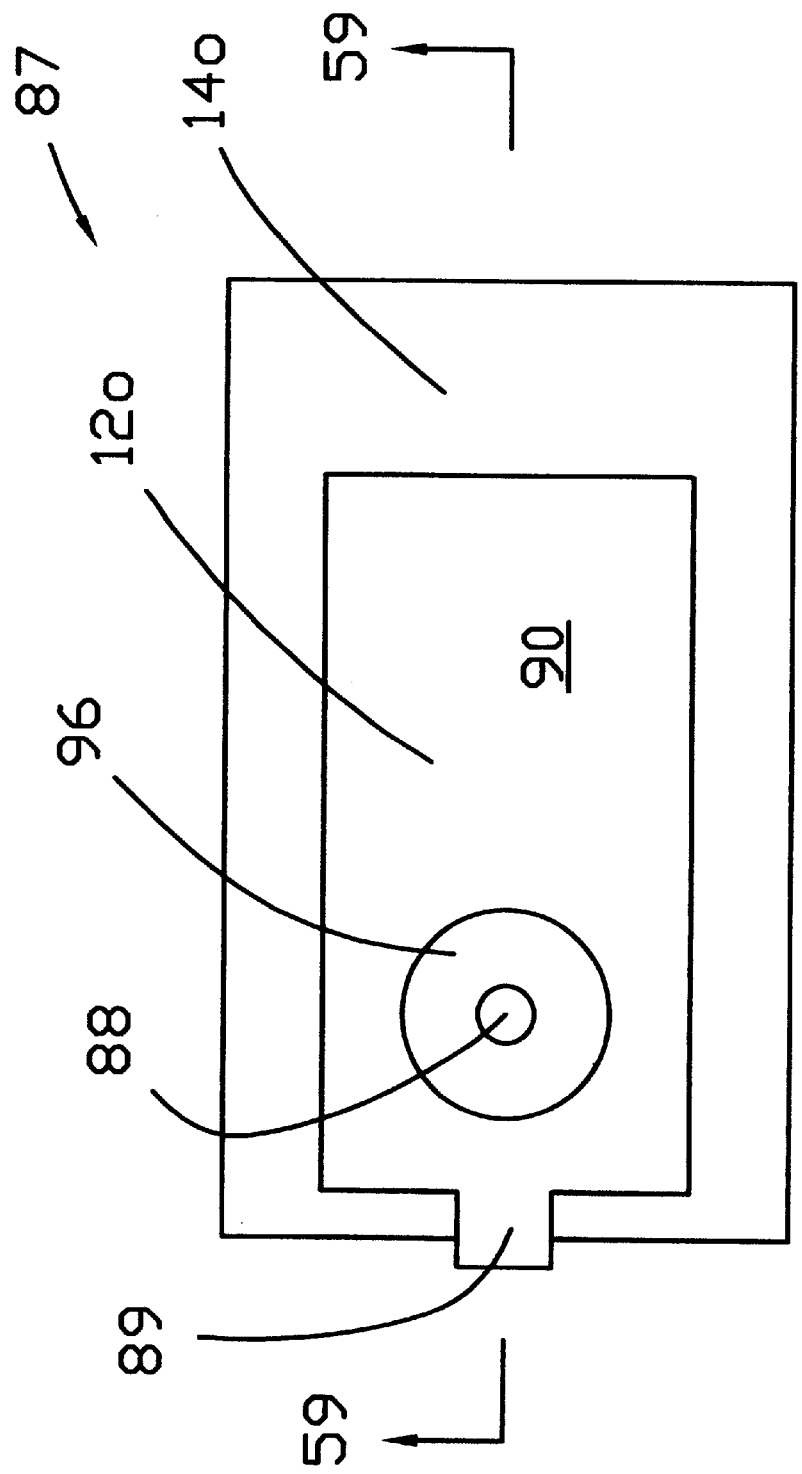
FIG. 57 is a top plan view of an intermediate article in the manufacture of yet another embodiment of the current invention.
Figure 58:
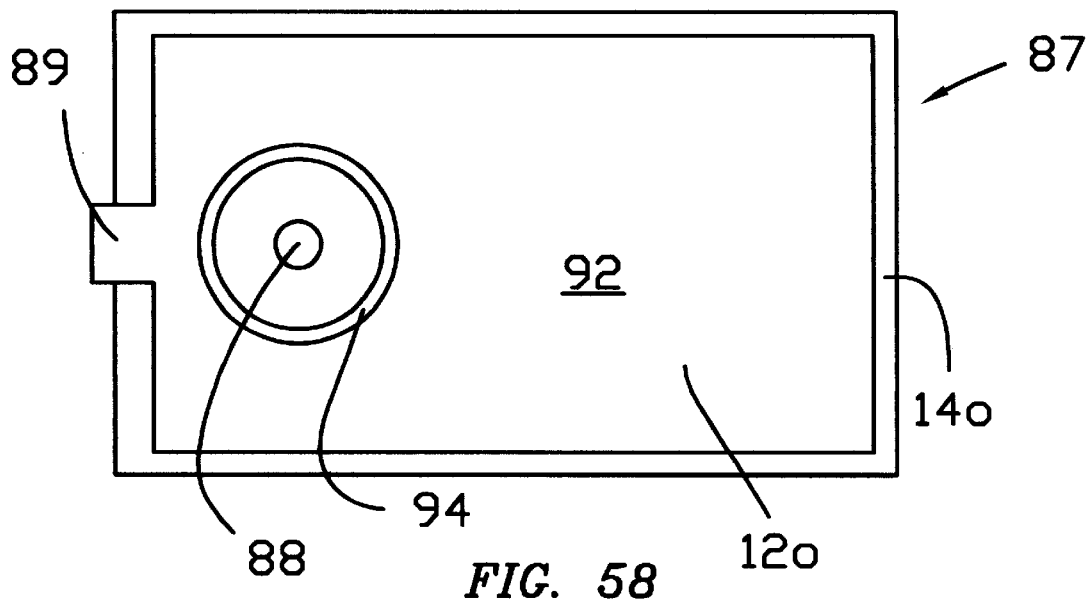
FIG. 58 is a bottom plan view of the intermediate article of manufacture embodied in the top plan view of FIG. 57.

A further embodiment of the current invention is illustrated in FIGS. 57 through 60. FIG. 57 is a top plan view of an intermediate article in the manufacture of an antenna, while FIG. 58 is a bottom plan view of the intermediate article. The intermediate article, generally indicated by numeral 87 comprises a patch 90 of electrically conductive resin 12o on its top surface supported by insulating dielectric material 14o. Article 87 further comprises a patch 92 of electrically conductive resin 12o on its bottom surface supported by material 14o. Hole or via 88 extends from bottom surface to top surface and shorting element 89 connects top patch with bottom patch 92.

Figure 59:
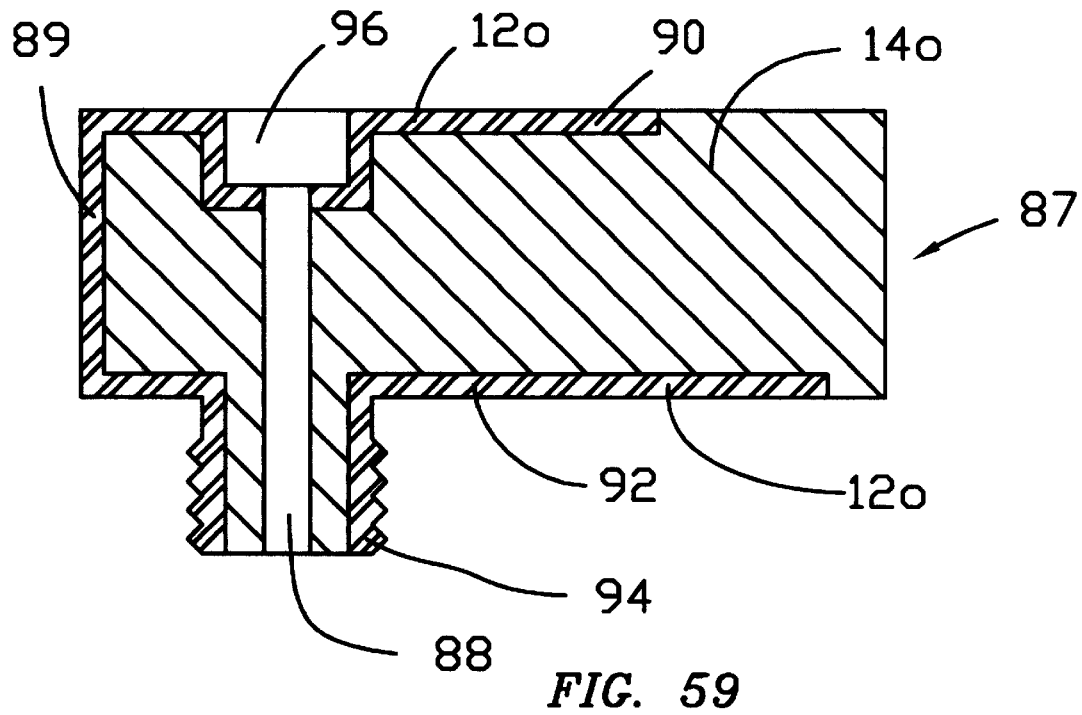
FIG. 59 is a sectional view taken substantially from the perspective of line 59—59 of FIG. 57.

FIG. 59, a sectional view taken substantially along the lin 59—59 of FIG. 57, shows material 12o molded into a projecting threaded structure 94 with hole or via 88 extending axially through the structure 94 to well 96 formed on the top surface of article 87. Article 84 can be readily produced by two-shot injection molding techniques.

Figure 60:
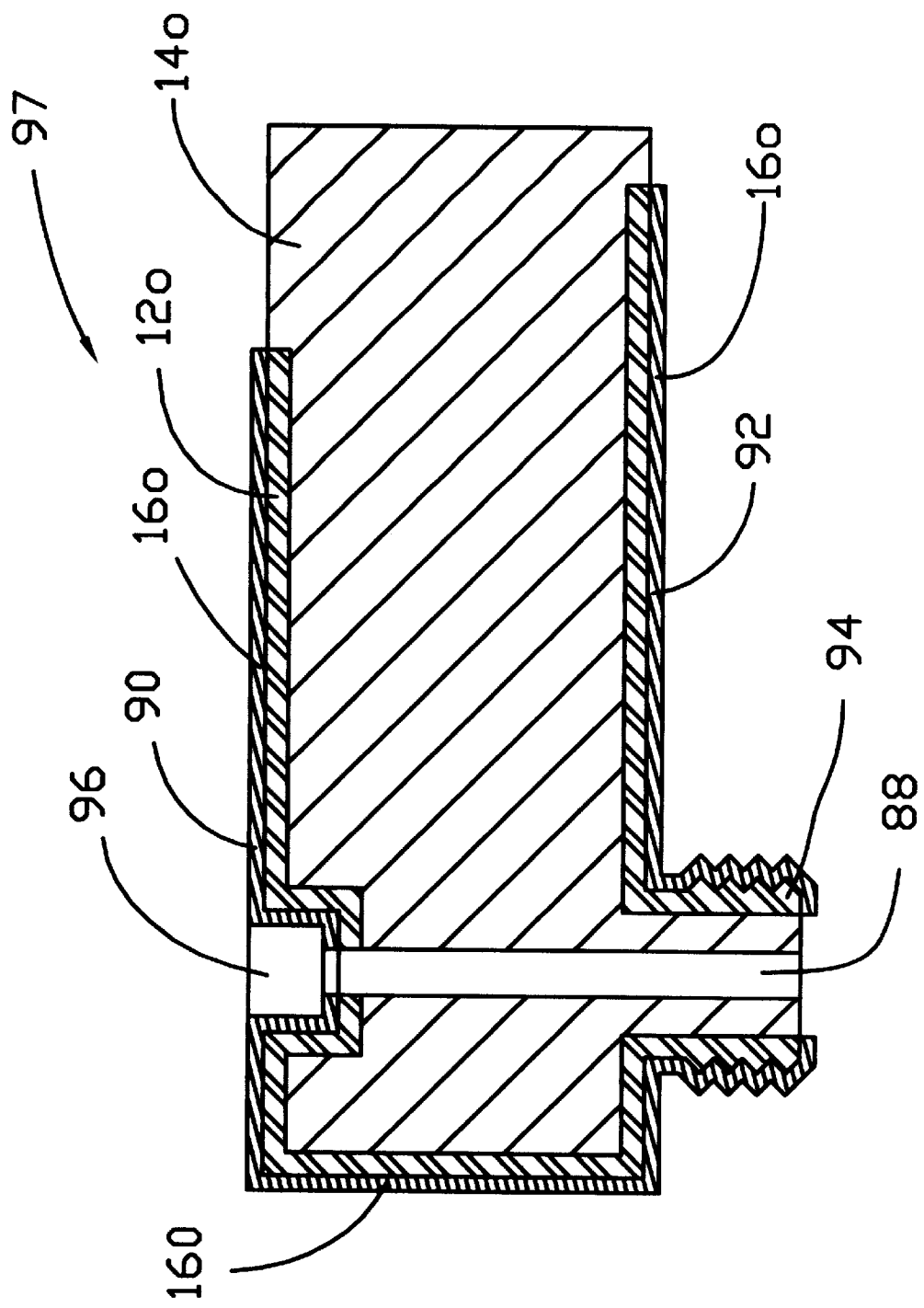
FIG. 60 is a sectional view, similar to FIG. 59, illustrating the article embodied in FIGS. 57 through 59 following additional processing steps.

FIG. 60 embodies an article following an additional processing step to the intermediate article 87 of FIGS. 57 through 59. The article of FIG. 60 is identified by numeral 97 to identify this additional processing step. In article 97, the electrically conductive resin 12o has been coated with a highly conductive metal-based electrodeposit 16o. Threaded portion 94 has also been electroplated and now forms a convenient, low resistance connecting structure for the external conductor of an input/output coaxial cable. Hole or via 88 supplies a channel whereby the internal conductor of the cable can be extended to the top patch 90 of the antenna. Well 96 forms a convenient depository for solder, conductive adhesive or mechanical connecting of the inner conductor of the input/output cable to the top patch.

As stated above, material 12o can be chosen from a number of electrically conductive resins. However, due to its characteristic rapid lateral electrodeposit growth and excellent electrodeposit adhesion, a DER is a preferred choice for conductive resin 12o.

Figure 61:
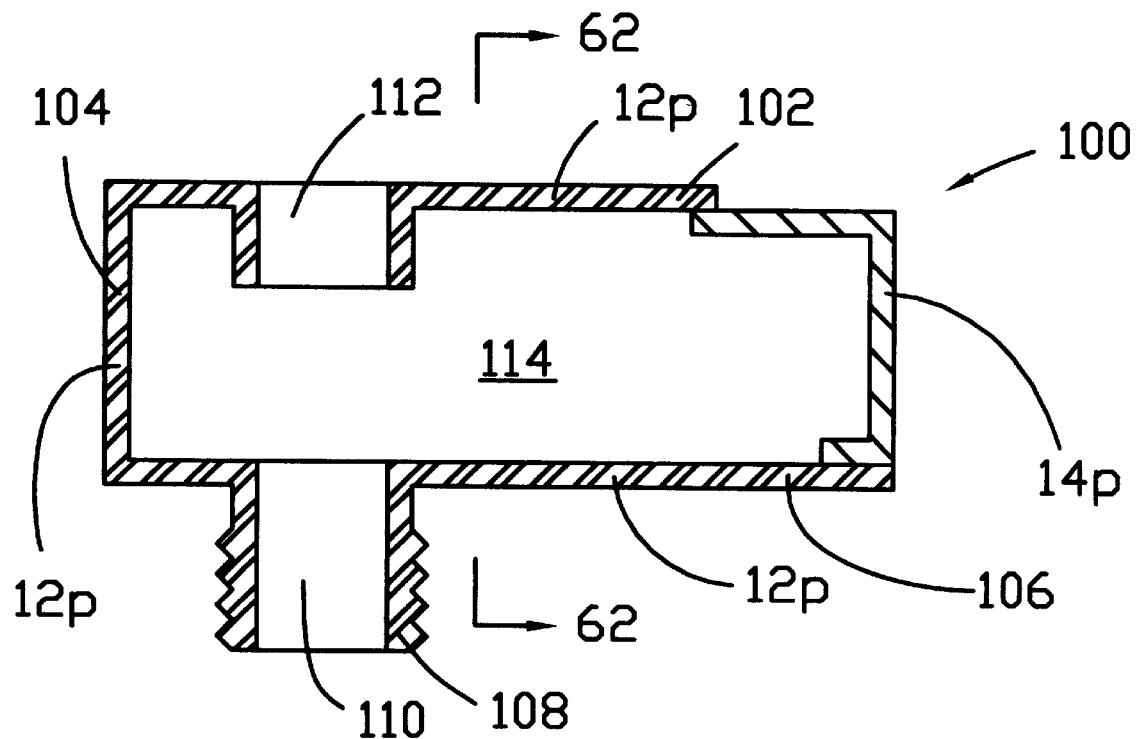
FIG. 61 is a sectional view of an intermediate article in the production of yet another embodiment of the current invention.
Figure 62:
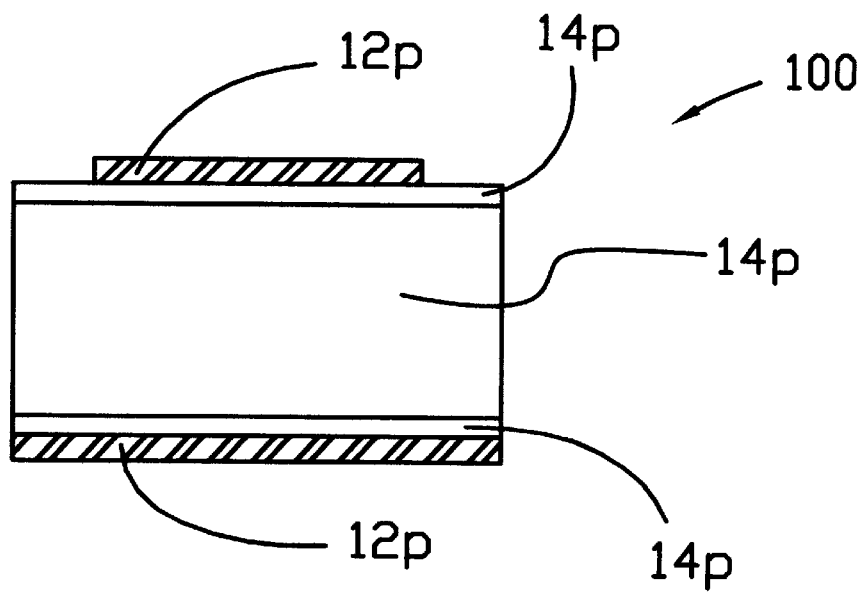
FIG. 62 is a sectional view taken substantially from the perspective of line 62—62 of FIG. 61.
Figure 63:
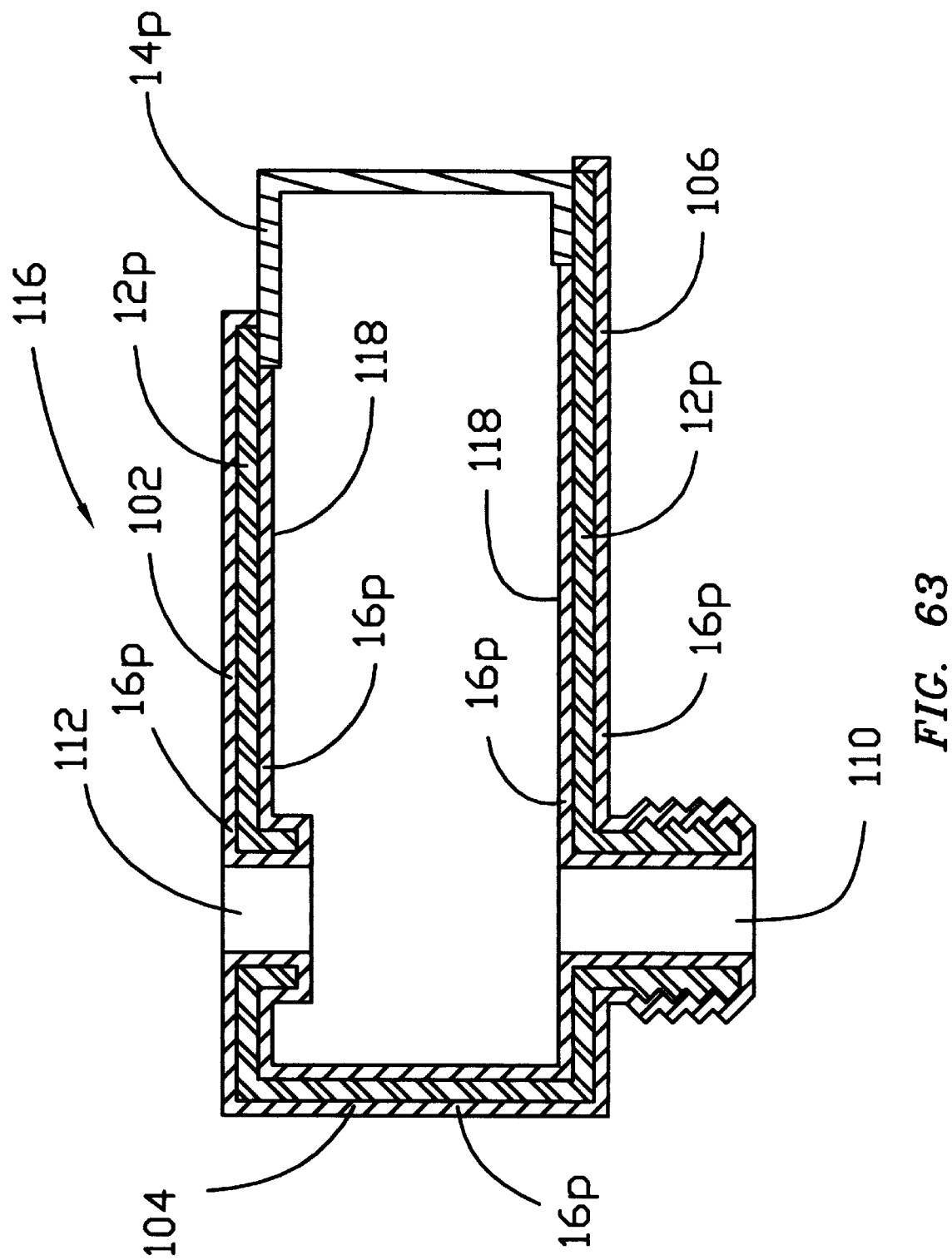
FIG. 63 is a sectional view, similar in perspective to FIG. 61, of the article embodied in FIGS. 61 and 62 following additional processing steps.

Referring now to FIGS. 61 through 63, another embodiment of a dual patch antenna is illustrated. FIG. 61, a sectional view similar in perspective to FIG. 59, shows an intermediate article of manufacture indicated by numeral 100. Article 100 comprises top patch 102, shorting element 104, bottom patch 106, threaded structure 108 and holes 110 and 112 all formed from electrically conductive resin 12p. In a preferred embodiment, the electrically conductive resin 12p is a DER. Air 114 separates top planar patch 102 from bottom planar patch 106. Optionally, insulating material 14p serves as additional support to maintain spacing between planar patches 102 and 106.

FIG. 63 embodies an article, identified by numeral 116, produced by further processing the article 100 embodied in FIGS. 61 and 62. As in prior embodiments, article 116 is produced by electrodepositing highly conductive metal-based material onto electrically conductive resinous material 12p. Article 116, FIG. 63 differs from article 97, FIG. 60 in two important aspects. First, article 116 envisions air as a dielectric separating top and bottom conductive patches 102 and 106 respectively. Second, article 116, FIG. 63 comprises an electrodeposited metal-based layer on inner surface (indicated by numeral 118, FIG. 63) whereas article 97 has no highly conductive metal-based pattern on inner surface of material 12o.

The present invention further contemplates use of profile extrusion as a valuable processing technique for production of novel three dimensional conductive traces and antennas. An example of the materials, processes and structures possible employing profile extrusion techniques is embodied in FIGS. 64 through 68.

Figure 64:
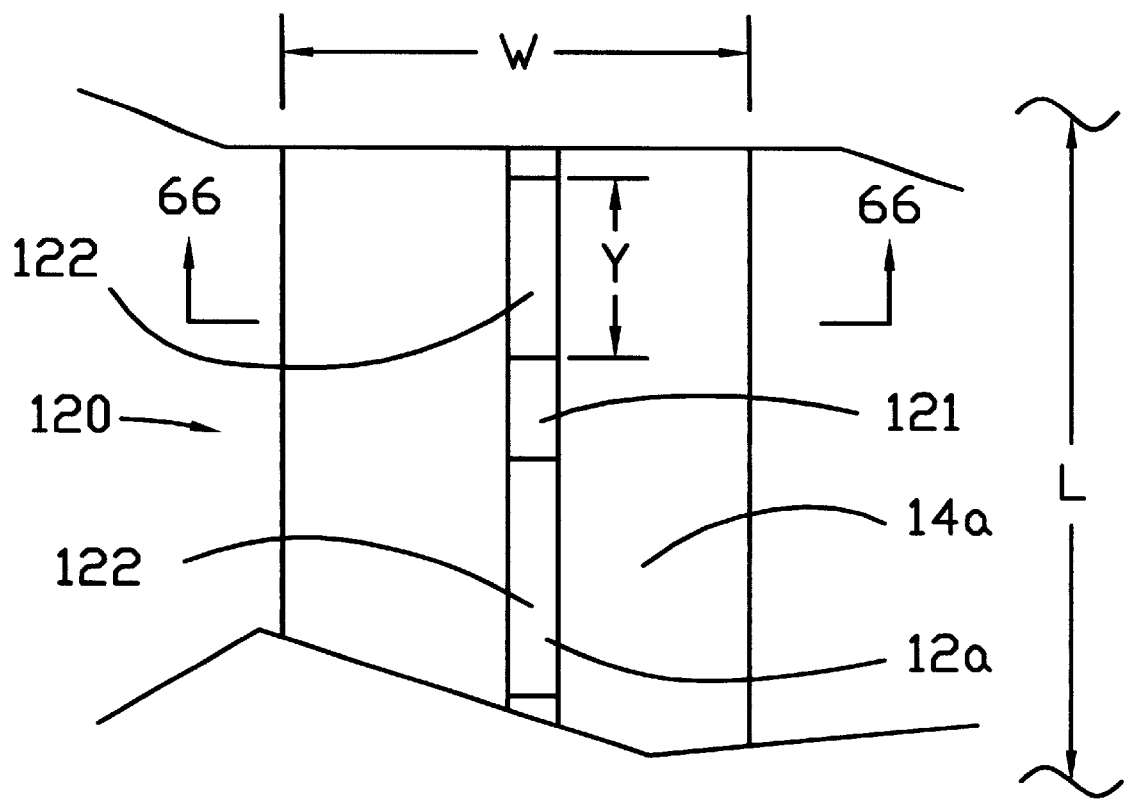
FIG. 64 is a top plan view of an intermediate article in the manufacture of yet another embodiment of the current invention.
Figure 65:
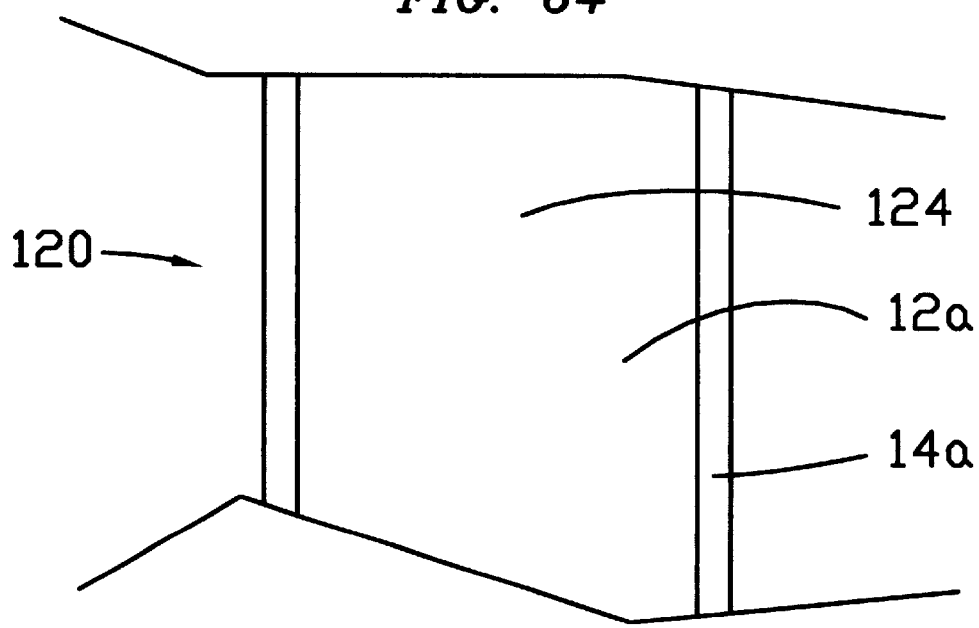
FIG. 65 if a bottom plan view of the article embodied in top plan view in FIG. 64.
Figure 66:
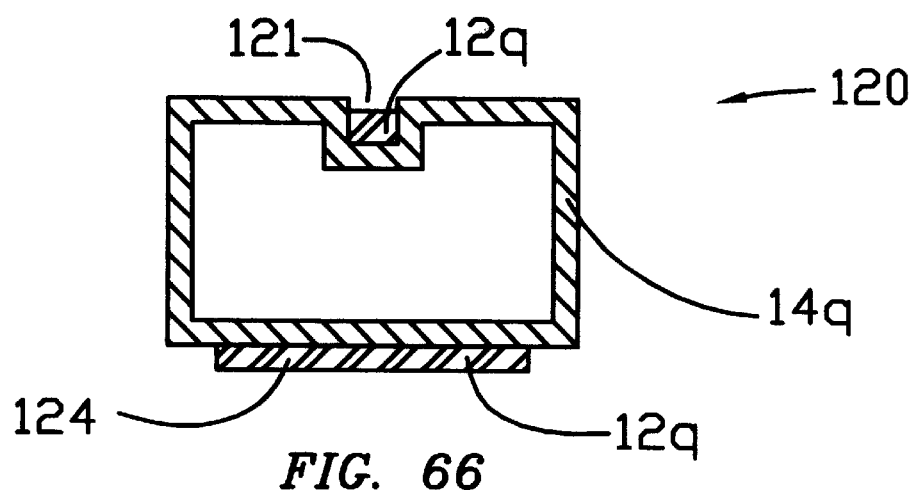
FIG. 66 is a sectional view taken substantially from the perspective of line 66—66 of FIG. 64.

FIG. 64 is a top plan view of a structure, indicated by numeral 120, produced by profile extrusion. FIG. 65 is a bottom plan view of said structure 120. FIG. 66 is a sectional view taken from the perspective of line 66—66 of FIG. 64. Reference to FIGS. 64 through 66 shows the extended structure 120 to comprise a hollow, box-like cross section of insulating material 14q extending in the direction of length "L" of FIG. 64 and having formed therein a trench 121, also extending in the direction "L". Electrically conductive resin material 12q is deposited intermittently in the trench in strips 122 of length "Y" (FIG. 64). It is contemplated that strips 122 of material 12q are formed by intermittent coextrusion, printing, screening or other known techniques. FIG. 65 shows that material 12q is positioned on the bottom surface of structure 120 as a continuous strip 124 of width slightly less than the width "W" of box-like structure 120. Material forming strip 124 need not be the same composition as that forming strip 122, and deposition techniques employed for depositing strips 122 and 124 may differ.

Figure 67:
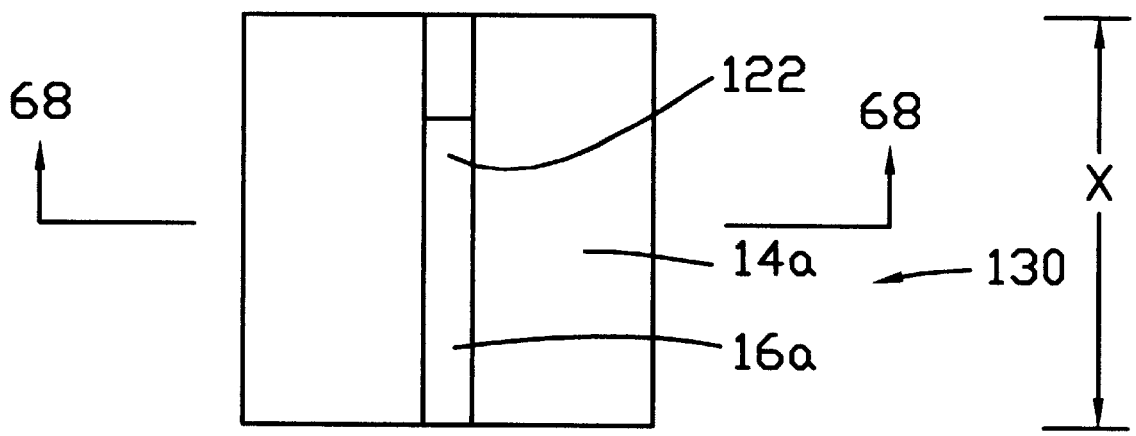
FIG. 67 is a top plan view of the article embodied in FIGS. 64 through 66 following additional processing steps.
Figure 68:
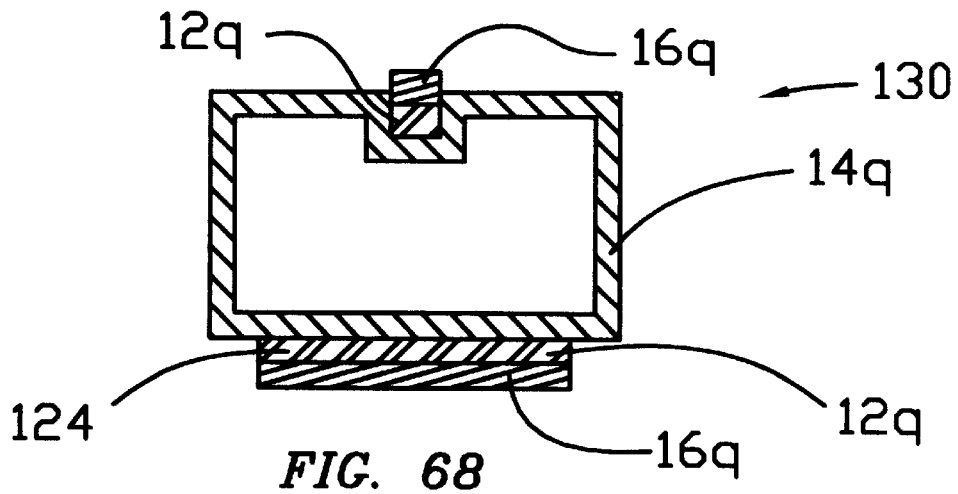
FIG. 68 is a sectional view taken substantially from the perspective of line 68—68 of FIG. 67.

FIGS. 67 and 68 embody an article achieved by additional processing of profile extrusion 120. The article of FIGS. 67 and 68 is now indicated by numeral 130 to indicate this additional processing. Article 130 is produced by first subdividing the generally continuous profile 120 into discrete lengths, defined as "X" in FIG. 67. The thus produced individual articles are then further processed by electrodeposition of highly conductive metal-based material onto the surface of conductive resin 12q. For reasons previously taught in this disclosure, a preferred material for electrically conductive resin 12q is a DER.

The article 130 of FIGS. 67 and 68 can constitute a very consistent, inexpensive microstrip antenna component.

Although the present invention has been described in conjunction with preferred embodiments, it is to be understood that modifications, alternatives and equivalents may be included without departing from the spirit and scope of the invention, as those skilled in the art will readily understand. Such modifications, alternatives and equivalents are considered to be within the purview and scope of the invention and following claims.

What is claimed is:

1. An antenna comprising a directly electroplateable resin (DER).

2. An antenna comprising an electrically conductive material, said electrically conductive material comprising:
   a polymer,
   an electrically conductive filler, and
   a source of sulfur.

3. An antenna according to claim 2 wherein said source of sulfur is a sulfur donor.

4. An antenna according to claim 2 wherein said electrically conductive filler comprises carbon black.

5. An antenna according to claim 2 wherein said electrically conductive material is a directly electroplateable resin (DER).

6. An antenna according to claim 2 wherein said polymer is a polyolefin.

7. An antenna according to claim 2 wherein said polymer is an elastomer.

8. An antenna comprising a directly electroplateable resin (DER) said directly electroplateable resin (DER) comprising a polyolefin.

9. An antenna comprising a directly electroplateable resin (DER) said directly electroplateable resin (DER) comprising an elastomer.

* * * * *